(12) United States Patent
Gotou et al.

(10) Patent No.: US 10,222,543 B2
(45) Date of Patent: Mar. 5, 2019

(54) LIGHTING DEVICE, DISPLAY DEVICE, AND TELEVISION DEVICE

(71) Applicant: Sharp Kabushiki Kaisha, Sakai, Osaka (JP)

(72) Inventors: Akira Gotou, Sakai (JP); Keitaro Matsui, Sakai (JP); Masanobu Harada, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/554,461

(22) PCT Filed: Mar. 10, 2016

(86) PCT No.: PCT/JP2016/057537
§ 371 (c)(1),
(2) Date: Aug. 30, 2017

(87) PCT Pub. No.: WO2016/148005
PCT Pub. Date: Sep. 22, 2016

(65) Prior Publication Data
US 2018/0045881 A1    Feb. 15, 2018

(30) Foreign Application Priority Data

Mar. 16, 2015   (JP) .................................. 2015-052005
Mar. 18, 2015   (JP) .................................. 2015-054627

(51) Int. Cl.
| | | |
|---|---|---|
| *F21V 8/00* | (2006.01) | |
| *C09K 11/70* | (2006.01) | |
| *G02F 1/1335* | (2006.01) | |
| *H01L 33/50* | (2010.01) | |
| *F21S 2/00* | (2016.01) | |
| *F21Y 115/10* | (2016.01) | |

(52) U.S. Cl.
CPC .......... *G02B 6/0091* (2013.01); *C09K 11/703* (2013.01); *F21S 2/00* (2013.01);
(Continued)

(58) Field of Classification Search
CPC .... G02B 6/0088; G02B 6/0091; G02B 6/005; G02F 1/133603; C09K 11/703; H01L 33/501; H01L 33/505
See application file for complete search history.

(56) References Cited

U.S. PATENT DOCUMENTS

| | | |
|---|---|---|
| 2008/0165307 A1 | 7/2008 | Adachi et al. |
| 2009/0034230 A1 | 2/2009 | Lim et al. |

(Continued)

FOREIGN PATENT DOCUMENTS

| | | |
|---|---|---|
| JP | 2008-171590 A | 7/2008 |
| JP | 2009-070826 A | 4/2009 |

(Continued)

OTHER PUBLICATIONS

Official Communication issued in International Patent Application No. PCT/JP2016/057537, dated Jun. 7, 2016.

*Primary Examiner* — Laura Gudorf
(74) *Attorney, Agent, or Firm* — Keating & Bennett, LLP

(57) ABSTRACT

A backlight unit 12 includes LEDs 17, a light guide plate 19 including a light entry end surface 19b, a light output plate surface 19a, and an opposite plate surface 19c, a wavelength conversion sheet 20, and a reflection sheet 25. The light guide plate 18 includes a parallel plate surface 27 on a central portion of the opposite plate surface 19c and parallel with the light output plate surface 19a, and an inclined plate surface 28 on a part of the outer peripheral side portion and being inclined with respect to the light output plate surface 19a to be closer to the light output plate surface 19a as is closer to the outer peripheral end surface. The wavelength conversion sheet 20 overlaps the light output plate surface 19a and contains a phosphor that wavelength-converts the light from the LEDs 17. The reflection sheet 25 overlaps the opposite plate surface 19c and reflects light, and includes a
(Continued)

parallel reflection portion 29 along the parallel plate surface 27, and an inclined reflection portion 30 along the inclined plate surface 28.

14 Claims, 38 Drawing Sheets

(52) U.S. Cl.
CPC ........... *G02B 6/005* (2013.01); *G02B 6/0046* (2013.01); *G02F 1/133603* (2013.01); *H01L 33/501* (2013.01); *H01L 33/505* (2013.01); *B32B 2457/202* (2013.01); *F21Y 2115/10* (2016.08); *G02B 6/0055* (2013.01); *G02F 1/133608* (2013.01); *G02F 2001/133613* (2013.01)

(56) References Cited

U.S. PATENT DOCUMENTS

| | | |
|---|---|---|
| 2009/0086507 A1 | 4/2009 | Iwasaki |
| 2009/0092366 A1 | 4/2009 | Iwasaki |
| 2010/0167011 A1 | 7/2010 | Dubrow |
| 2011/0007522 A1 | 1/2011 | Iwasaki |
| 2012/0106127 A1 | 5/2012 | Hattori et al. |
| 2012/0113672 A1 | 5/2012 | Dubrow et al. |
| 2013/0075014 A1 | 3/2013 | Dubrow |
| 2014/0178648 A1 | 6/2014 | Dubrow |
| 2015/0009454 A1 | 1/2015 | Nagatani et al. |
| 2015/0117052 A1* | 4/2015 | Hsu ...................... G02B 6/0043 362/606 |
| 2015/0300600 A1 | 10/2015 | Dubrow et al. |
| 2016/0009988 A1 | 1/2016 | Dubrow |
| 2016/0187556 A1* | 6/2016 | Bang ...................... G02B 6/005 362/606 |
| 2016/0349428 A1 | 12/2016 | Dubrow et al. |
| 2016/0363713 A1 | 12/2016 | Dubrow et al. |

FOREIGN PATENT DOCUMENTS

| | | |
|---|---|---|
| JP | 2009-087730 A | 4/2009 |
| JP | 2010-097908 A | 4/2010 |
| JP | 2012-099362 A | 5/2012 |
| JP | 2013-175288 A | 9/2013 |
| JP | 2013-544018 A | 12/2013 |

\* cited by examiner

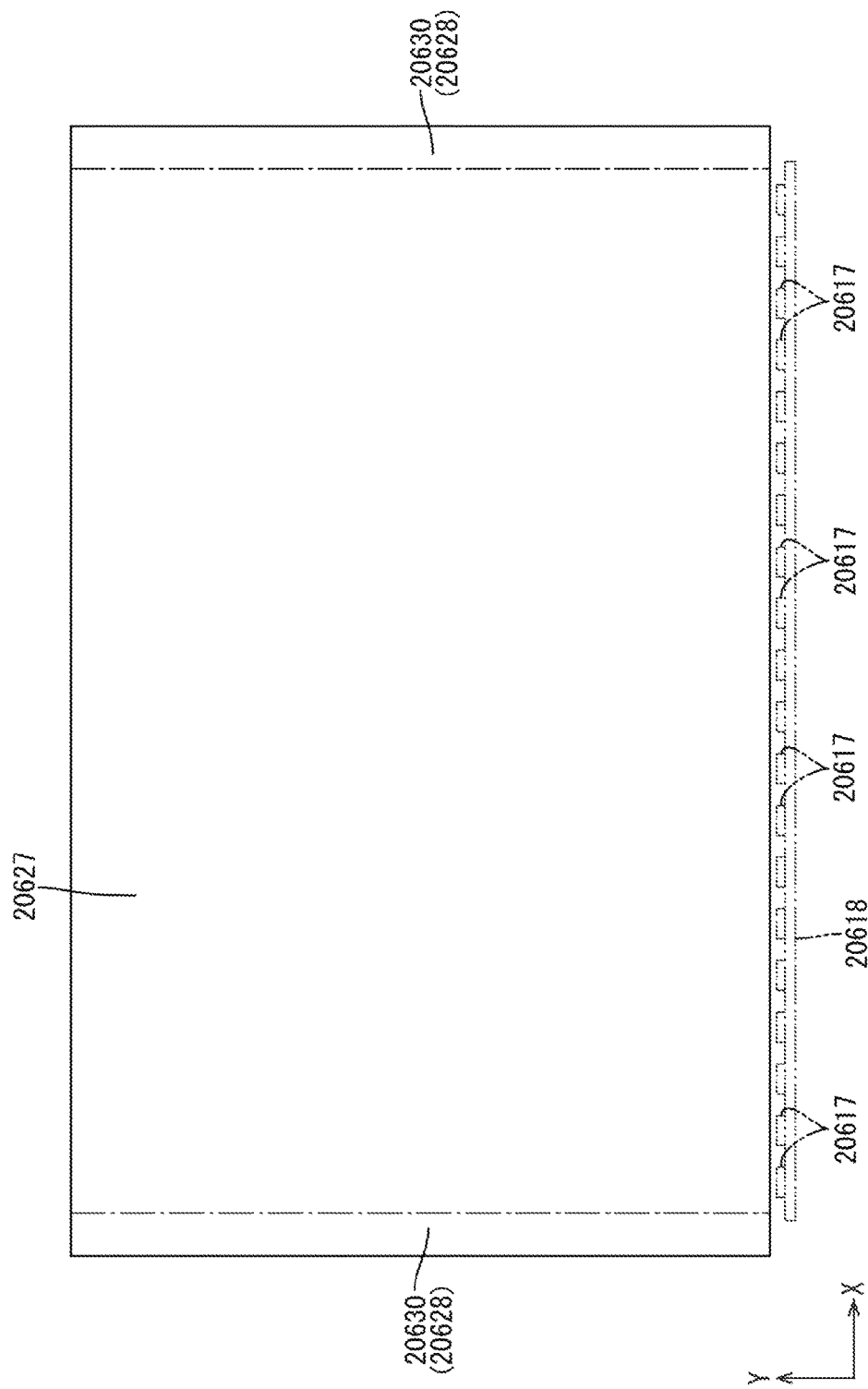

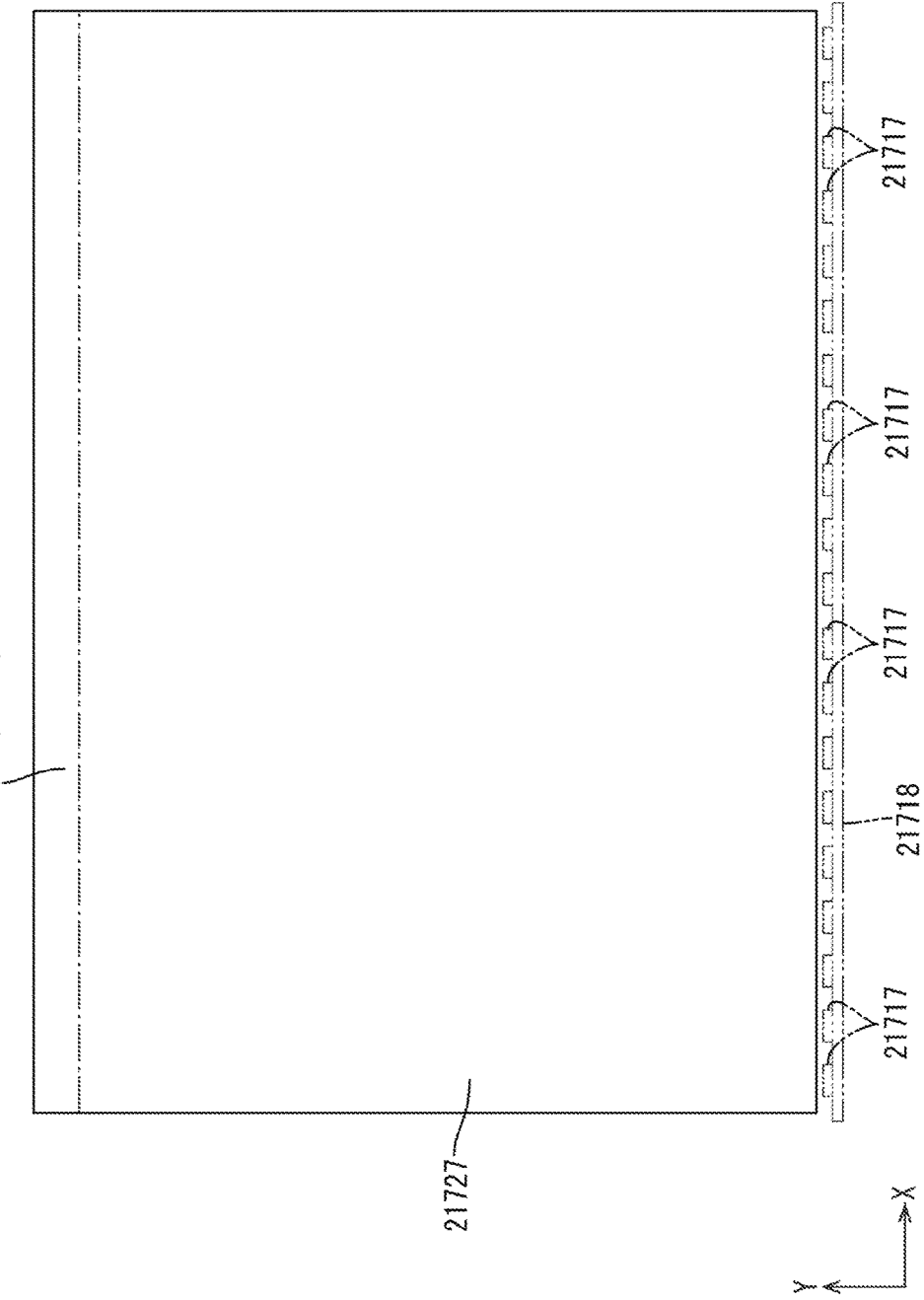

LIGHTING DEVICE, DISPLAY DEVICE, AND TELEVISION DEVICE

TECHNICAL FIELD

The present invention relates to a lighting device, a display device, and a television device.

BACKGROUND ART

An example of a conventionally-known liquid crystal display device is disclosed in Patent Document 1 below. The liquid crystal display device described in Patent Document 1 includes a liquid crystal panel and a display backlight unit that irradiates the liquid crystal panel with light. The display backlight unit includes a primary light source, a light guide plate for guiding primary light emitted by the primary light source, and a remote phosphor film containing a QD phosphor material which is excited by the primary light guided by the light guide plate to emit secondary light.

PRIOR ART DOCUMENT

Patent Document

Patent Document 1: Japanese Translation of PCT International Application Publication No. 2013-544018

Problem to be Solved by the Invention

Use of the remote phosphor film as described in Patent Document 1 above for an edge light backlight unit may lead to the following problem. Specifically, the edge light backlight includes a light source and a light guide plate for guiding light from the light source. The light guide plate includes a light entry end surface that the light from the light source directly enters, a no-light entry end surface that the light from the light source does not directly enter, and a light output plate surface for causing light to be emitted.

The light emitted from the light output plate surface of the light guide plate is not necessarily entirely wavelength-converted by the remote phosphor film and utilized as is as the output light of the display backlight unit. The light may be returned toward the light guide plate side by retroreflection, and then utilized as the output light of the display backlight. The retroreflected light tends to have a smaller number of times of retroreflection on the outer peripheral side of the display backlight unit than in the center thereof, resulting in a smaller number of times of passage through the remote phosphor film, and a decrease in the probability of being wavelength-converted. Accordingly, a difference in color tint of the output light has been likely to occur between the outer peripheral side portion of the edge light backlight unit and the central portion thereof.

The light propagating in the light guide plate is not necessarily entirely emitted from the light output plate surface, and some of the light may be emitted from the no-light entry end surface. Since the light emitted from the no-light entry end surface is difficult to be wavelength-converted by the remote phosphor film, the light of the light source may be emitted without wavelength conversion. As a result, a difference in color tint of output light has been likely to occur between the outer peripheral side and the center of the edge light backlight unit.

DISCLOSURE OF THE PRESENT INVENTION

The present invention was made in view of the above circumstances, and an object of the present invention is to suppress the occurrence of color irregularity.

Means for Solving the Problem

In order to solve the problem, a lighting device disclosed in the present description includes: a light source; a light guide plate including a light entry end surface on at least a part of an outer peripheral end surface, the light entry end surface through which light from the light source enters, a light output plate surface that is one of a pair of plate surfaces and through which the light exits, and an opposite plate surface that is another one of the pair of plate surfaces on the opposite side from the light output plate surface, the light guide plate including a parallel plate surface on at least a central portion of the opposite plate surface, the parallel plate surface being parallel with the light output plate surface and an inclined plate surface on at least a part of an outer peripheral side portion, the inclined plate surface being inclined with respect to the light output plate surface so as to be closer to the light output plate surface as is closer to the outer peripheral end surface; a wavelength conversion member overlapping the light output plate surface of the light guide plate and containing a phosphor for wavelength-converting the light from the light source; and a reflection member overlapping the opposite plate surface of the light guide plate and reflecting light, the reflection member including a parallel reflection portion disposed along the parallel plate surface, and an inclined reflection portion disposed along the inclined plate surface.

In this way, the light emitted from the light source enters the light entry end surface of the outer peripheral end surface of the light guide plate, is reflected by the reflection member and the like, and is emitted from the light output plate surface after propagating in the light guide plate. The light emitted from the light output plate surface is wavelength-converted by the phosphor contained in the wavelength conversion member overlapping the light output plate surface. In this case, the light emitted from the light output plate surface of the light guide plate is not necessarily entirely wavelength-converted by the wavelength conversion member and utilized as is as the output light of the lighting device. Some of the light may be retroreflected and returned toward the light guide plate side, for example, and then utilized as the output light of the lighting device. The retroreflected light tends to have a smaller number of times of retroreflection on the outer peripheral side of the lighting device than in the center thereof, whereby the number of times of passage through the wavelength conversion member is decreased, and the probability of being wavelength-converted becomes lower. In addition, the light propagating in the light guide plate is not necessarily entirely emitted from the light output plate surface, and some of the light may be emitted from the outer peripheral end surface of the light guide plate.

In this respect, in the light guide plate, at least the central portion of the opposite plate surface is the parallel plate surface parallel with the light output plate surface, and at least a part of the outer peripheral side portion is the inclined plate surface inclined with respect to the light output plate surface so as to be closer to the light output plate surface with decreasing distance from the outer peripheral end surface. Accordingly, the optical path length of the light that is present in the outer peripheral side portion of the light guide plate as the light travels from the opposite plate surface to the light output plate surface becomes shorter than the optical path length of the light present in the central portion as the light travels from the opposite plate surface to the light output plate surface. The reflection member includes the parallel reflection portion disposed along the parallel plate surface, and the inclined reflection portion disposed along the inclined plate surface. Accordingly, of the light that is present in at least a part of the outer peripheral side portion of the light guide plate, the light with a relatively short optical path length is reflected by the inclined reflection portion. As a result, the number of times of retroreflection of the retroreflected light transmitted through at least a part of the outer peripheral side portion of the light guide plate, i.e., the number of times of passage through the wavelength conversion member, can be increased. In this way, the retroreflected light transmitted through at least a part of the outer peripheral side portion of the light guide plate can be sufficiently wavelength-converted by the wavelength conversion member. In this way, the color irregularity in the output light of the lighting device is made difficult to occur.

Embodiments of the lighting device may include the following preferable configurations.

(1) The outer peripheral end surface of the light guide plate may include a no-light entry side end surface that is an end surface adjacent to the light entry end surface, the light from the light source does not directly enter through the no-light entry side end surface. The light guide plate may include the inclined plate surface on a portion of the outer peripheral side portion of the opposite plate surface along at least the no-light entry side end surface. The light emitted from the light source, entering the light entry end surface of the light guide plate, and then propagating in the light guide plate is particularly easily emitted from the no-light entry side end surface adjacent to the light entry end surface of the outer peripheral end surface of the light guide plate, easily resulting in the color tint difference between the output light on the outer peripheral side of the lighting device and the output light in the center. In this respect, the outer peripheral side portion of the opposite plate surface of the light guide plate includes the portion along at least the no-light entry side end surface constituting the inclined plate surface. Accordingly, the number of times of retroreflection of the retroreflected light transmitted through the vicinity of the no-light entry side end surface of the outer peripheral side portion of the light guide plate, i.e., the number of times of passage through the wavelength conversion member, can be increased. In this way, the color tint difference is made difficult to occur between the output light on the outer peripheral sides of the lighting device and the output light in the center thereof, whereby the occurrence of color irregularity can be more preferably suppressed.

(2) The light guide plate may include a no-light entry opposite end surface on an end surface on the opposite side from the light entry end surface, and the light from the light source does not directly enter through the no-light entry opposite end surface. The light guide plate may include the inclined plate surface on a portion of the outer peripheral side portion of the opposite plate surface along at least the no-light entry opposite end surface. The light emitted from the light source, entering the light entry end surface of the light guide plate, and then propagating in the light guide plate is easily emitted from the no-light entry opposite end surface on the opposite side from the light entry end surface of the outer peripheral end surface of the light guide plate, easily resulting in the color tint difference between the output light on the outer peripheral sides of the lighting device and the output light in the center thereof. In this respect, of the outer peripheral side portion of the opposite plate surface of the light guide plate, the portion along at least the no-light entry opposite end surface constitutes the inclined plate surface. Accordingly, the number of times of retroreflection of the retroreflected light transmitted through the vicinity of the no-light entry opposite end surface of the outer peripheral side portion of the light guide plate, i.e., the number of times of passage through the wavelength conversion member can be increased. In this way, the color tint difference is made difficult to occur between the output light on the outer peripheral sides of the lighting device and the output light in the center thereof, whereby the occurrence of color irregularity can be preferably suppressed.

(3) The light guide plate may include a no-light entry end surface on an end surface of the outer peripheral end surface except for the light entry end surface, the light from the light source does not directly enter through the no-light entry end surface. The light guide plate may include the inclined plate surface on an entire area of a portion along the no-light entry end surface of the outer peripheral side portion of the opposite plate surface. The light emitted from the light source, entering the light entry end surface of the light guide plate, and then propagating in the light guide plate is easily emitted from the no-light entry end surface of the outer peripheral end surface of the light guide plate except for the light entry end surface, easily resulting in the color tint difference between the output light on the outer peripheral sides of the lighting device and the output light in the center thereof. In this respect, of the outer peripheral side portion of the opposite plate surface of the light guide plate, the entire area of the portion along at least the no-light entry end surface constitutes the inclined plate surface. Accordingly, the number of times of retroreflection of the retroreflected light transmitted through the vicinity of the no-light entry end surface of the outer peripheral side portion of the light guide plate, i.e., the number of times of passage through the wavelength conversion member, can be increased. In this way, the color tint difference is made difficult to occur between the output light on the outer peripheral sides of the lighting device and the output light in the center thereof, whereby the occurrence of color irregularity can be more preferably suppressed.

(4) The light guide plate may include the inclined plate surface on a portion along at least the light entry end surface of the outer peripheral side portion of the opposite plate surface. The light emitted from the light source, entering the light entry end surface of the light guide plate, and then propagating in the light guide plate is easily emitted from the light entry end surface of the outer peripheral end surface of the light guide plate, easily resulting in the color tint difference the output light on the outer peripheral sides of the lighting device and the output light in the center thereof. In this respect, of the outer peripheral side portion of the opposite plate surface of the light guide plate, the portion along at least the light entry end surface constitutes the inclined plate surface. Accordingly, the number of times of retroreflection of the retroreflected light transmitted through the vicinity of the light entry end surface of the outer peripheral side portion of the light guide plate, i.e., the number of times of passage through the wavelength conversion member, can be increased. In this way, the color tint difference is made difficult to occur between the output light on the outer peripheral sides of the lighting device and the output light in the center thereof, whereby the occurrence of color irregularity can be more preferably suppressed.

(5) The light guide plate may include the inclined plate surface on an entire area of the outer peripheral side portion of the opposite plate surface. The light emitted from the light source, entering the light entry end surface of the light guide plate, and then propagating in the light guide plate is easily emitted from the outer peripheral end surface of the light guide plate, easily resulting in the color tint difference between the output light on the outer peripheral sides of the lighting device and the output light in the center thereof. In this respect, of the light guide plate, the entire area of the outer peripheral side portion of the opposite plate surface constitutes the inclined plate surface. Accordingly, the number of times of retroreflection of the retroreflected light transmitted through the outer peripheral side portion of the light guide plate, i.e., the number of times of passage through the wavelength conversion member can be increased. In this way, the color tint difference is made difficult to occur between the output light on the outer peripheral sides of the lighting device and the output light in the center thereof, whereby the occurrence of color irregularity can be more preferably suppressed.

(6) The inclined plate surface of the light guide plate may be configured as a linearly inclined surface. In this way, the opposite plate surface of the light guide plate can be provided with the inclined plate surface with higher dimensional accuracy.

(7) The inclined plate surface of the light guide plate may be configured to have different inclination angles with respect to the light output plate surface between the parallel plate surface and the outer peripheral end surface. In this way, the optical path length in the portion, among the outer peripheral side portion of the light guide plate, in which the inclined plate surface is provided in the opposite plate surface, i.e., the number of times of retroreflection of the light, can be easily controlled in the plane of the inclined plate surface, whereby the color irregularity can be suppressed more preferably.

(8) The inclined plate surface of the light guide plate may be configured to include at least a parallel plate surface-side inclined plate surface close to the parallel plate surface and having a relatively large inclination angle, and an outer peripheral end surface-side inclined plate surface close to the outer peripheral end surface and having a relatively small inclination angle. In this way, compared with if the magnitude relationship of the inclination angle in the parallel plate surface-side inclined plate surface and the outer peripheral end surface-side inclined plate surface is reversed from the above, the inclination angle in the parallel plate surface-side inclined plate surface can be relatively increased, whereby the optical path length in the end position on the parallel plate surface-side inclined plate surface side of the outer peripheral end surface-side inclined plate surface becomes relatively shorter. In this way, the number of times of retroreflection of light in the portion, among the outer peripheral side portion of the light guide plate, in which the outer peripheral end surface-side inclined plate surface is provided can be increased, whereby the color irregularity can be suppressed in a more preferable manner.

(9) The inclined reflection portion of the reflection member may be bonded to the inclined plate surface of the light guide plate via an adhesive layer. In this way, because the adhesive layer allows the inclined reflection portion to be maintained in a stable positional relationship with respect to the inclined plate surface of the light guide plate, the light from the opposite plate surface of the light guide plate can be reflected with high efficiency by the inclined reflection portion.

(10) The lighting device may include a support member supporting the inclined reflection portion of the reflection member from the opposite side to the light guide plate side. In this way, because the support member allows the inclined reflection portion to be maintained in a stable positional relationship with respect to the inclined plate surface of the light guide plate, the light from the opposite plate surface of the light guide plate can be reflected with high efficiency by the inclined reflection portion.

(11) The wavelength conversion member may contain a quantum dot phosphor as the phosphor. In this way, the light wavelength conversion efficiency of the wavelength conversion member is increased, and the chromatic purity of the wavelength-converted light is increased.

In addition, in order to solve the problem, a lighting device disclosed in the present description includes a light source; a light guide plate including a light entry end surface on at least a part of an outer peripheral end surface, the light entry end surface through which light from the light source enters, a no-light entry end surface on a portion of the outer peripheral end surface except for the light entry end surface, the no-light entry end surface through which the light from the light source does not directly enter, and a light output plate surface on a plate surface thereof through which the light exits; and a wavelength conversion member containing a phosphor for wavelength-converting the light from the light source, the wavelength conversion member including at least a plate surface-side wavelength conversion portion disposed so as to overlap the light output plate surface of the light guide plate, and an end surface-side wavelength conversion portion that is continuous from the plate surface-side wavelength conversion portion and disposed so as to overlap at least apart of the no-light entry end surface of the light guide plate.

In this way, the light emitted from the light source enters the light entry end surface of the outer peripheral end surface of the light guide plate, and is emitted from the light output plate surface after propagating in the light guide plate. The light emitted from the light output plate surface is wavelength-converted by the phosphor contained in the plate surface-side wavelength conversion portion of the wavelength conversion member overlapping the light output plate surface. In this case, the light propagating in the light guide plate is not necessarily entirely emitted from the light output plate surface, and some of the light may be emitted from the no-light entry end surface of the outer peripheral end surface of the light guide plate. In addition, the light propagating in the light guide plate includes the retroreflected light which is emitted from the light output plate surface and then returned into the light guide plate. The retroreflected light tends to have a smaller number of times of reflections on the outer peripheral side of the light guide plate than in the center thereof. Accordingly, the retroreflected light emitted from the outer peripheral side of the light guide plate (including the no-light entry end surface) has a color tint closer to the color tint of the light of the light source compared with the retroreflected light emitted from the center of the light guide plate.

In this respect, the wavelength conversion member includes the end surface-side wavelength conversion portion disposed so as to overlap at least a part of the no-light entry end surface of the light guide plate. Accordingly, the light emitted from the no-light entry end surface of the light guide plate (including the retroreflected light) can be wavelength-converted by the phosphor contained in the end surface-side wavelength conversion portion. In this way, the difference in color tint of the output light is made difficult to occur between the center and the outer peripheral side of the lighting device, whereby the occurrence of color irregularity can be suppressed. In addition, the end surface-side wavelength conversion portion is continuous with the plate surface-side wavelength conversion portion. Accordingly, the manufacturing cost for the wavelength conversion member is reduced, and degradation of the contained phosphor is made difficult to occur.

Embodiments of the lighting device (lighting device according to a second aspect) may include the following preferable configurations.

(1) The light guide plate may include a no-light entry opposite end surface on an end surface on the opposite side from the light entry end surface, the no-light entry opposite end surface is the no-light entry end surface. The end surface-side wavelength conversion portion of the wavelength conversion member may overlap at least the no-light entry opposite end surface. The light emitted from the light source and entering the light entry end surface of the light guide plate tends to be easily emitted as is from the no-light entry opposite end surface on the opposite side from the light entry end surface. However, because the end surface-side wavelength conversion portion is disposed so as to overlap the no-light entry opposite end surface, the light that may be emitted from the no-light entry opposite end surface is wavelength-converted by the end surface-side wavelength conversion portion, whereby the occurrence of color irregularity can be effectively suppressed.

(2) The light guide plate may include a no-light entry side end surface on an end surface of the outer peripheral end surface adjacent to the light entry end surface. The end surface-side wavelength conversion portion of the wavelength conversion member may overlap at least the no-light entry side end surface. The light emitted from the light source and entering the light entry end surface of the light guide plate tends to be easily emitted as is from the no-light entry side end surface adjacent to the light entry end surface. However, because the end surface-side wavelength conversion portion is disposed so as to overlap the no-light entry side end surface, the light that may be emitted from the no-light entry side end surface is wavelength-converted by the end surface-side wavelength conversion portion, whereby the occurrence of color irregularity can be effectively suppressed.

(3) The end surface-side wavelength conversion portion of the wavelength conversion member may overlap an entire area of the no-light entry end surface of the light guide plate. In this way, the light emitted from the no-light entry end surface can be efficiently wavelength-converted by the end surface-side wavelength conversion portion disposed so as to overlap the entire area of the no-light entry end surface, whereby the occurrence of color irregularity can be more effectively suppressed.

(4) The lighting device may further include a chassis including a bottom portion supporting the light guide plate from an opposite side from the light output plate surface side. The end surface-side wavelength conversion portion of the wavelength conversion member may include a no-light entry end surface overlapping portion overlapping the no-light entry end surface, and an opposite plate surface overlapping portion overlapping an outer edge portion of the light guide plate on an opposite plate surface that is opposite from the light output plate surface, and the opposite plate surface overlapping portion may be sandwiched between the outer edge portion and the bottom portion of the chassis. Thus, the opposite plate surface overlapping portion is disposed so as to overlap the outer edge portion of the opposite plate surface of the light guide plate and sandwiched between the outer edge portion and the bottom portion of the chassis. Accordingly, the end surface-side wavelength conversion portion is held in place, and the no-light entry end surface overlapping portion overlapping the no-light entry end surface is maintained in a stable positional relationship with respect to the no-light entry end surface. In this way, the light that may be emitted from the no-light entry end surface can be wavelength-converted with high efficiency by the no-light entry end surface overlapping portion.

(5) The opposite plate surface overlapping portion of the wavelength conversion member may have a phosphor distribution density lower than a phosphor distribution density of the no-light entry end surface overlapping portion. In this way, compared with if the phosphor distribution density is the same between the opposite plate surface overlapping portion and the no-light entry end surface overlapping portion, when the light propagating in the light guide plate reaches the outer edge portion of the opposite plate surface of the light guide plate, the light is not easily excessively wavelength converted by the opposite plate surface overlapping portion. In this way, the output light from the outer peripheral side of the lighting device is prevented from easily excessively wavelength converted.

(6) The no-light entry end surface overlapping portion of the wavelength conversion member may be a phosphor located region where a phosphor is included therein, whereas the opposite plate surface overlapping portion may be a non-phosphor located region where no phosphor is included therein. In this way, the light that has propagated in the light guide plate and reached the no-light entry end surface of the light guide plate is wavelength-converted by the phosphor located in the phosphor located region of the no-light entry end surface overlapping portion. On the other hand, the light that has reached the outer edge portion of the opposite plate surface of the light guide plate is prevented from being wavelength-converted in the non-phosphor located region of the opposite plate surface overlapping portion. In this way, the problem of the output light from the outer peripheral side of the lighting device being excessively wavelength-converted can be more preferably suppressed.

(7) The opposite plate surface overlapping portion of the wavelength conversion member may include a seal portion sealing the phosphor. In this way, because the phosphor is sealed by the seal portion, degradation of the phosphor included in the opposite plate surface overlapping portion due to moisture absorption and the like is made difficult to occur.

(8) The lighting device may further include an adhesive layer disposed so as to be interposed between the end surface-side wavelength conversion portion and the no-light entry end surface of the light guide plate. In this way, because the adhesive layer allows the end surface-side wavelength conversion portion to be maintained in a stable positional relationship with respect to the no-light entry end surface of the light guide plate. Accordingly, when light is emitted from the no-light entry end surface of the light guide plate, the light can be wavelength-converted with high efficiency by the end surface-side wavelength conversion portion. In addition, multiple reflection is promoted at the interface between the end surface-side wavelength conversion portion and the adhesive layer or the interface between the no-light entry end surface and the adhesive layer, whereby the light wavelength conversion efficiency of the end surface-side wavelength conversion portion is increased.

(9) The lighting device may further include a reflection member disposed so as to face the opposite plate surface on the opposite side from the light output plate surface of the light guide plate, and reflecting light. In this way, the light traveling from the light output plate surface side toward the opposite plate surface side while propagating in the light guide plate is reflected by the reflection member toward the light output plate surface, and the efficiency of propagation of light can be increased.

(10) The light source may emit blue light. The wavelength conversion member may contain, as the phosphor, a green phosphor which wavelength-converts the blue light into green light and a red phosphor which wavelength-converts the blue light into red light, or a yellow phosphor which wavelength-converts the blue light into yellow light. In this way, the blue light emitted from the light source is wavelength-converted into green light and red light when the green phosphor and the red phosphor are contained in the wavelength conversion member, or into yellow light when the yellow phosphor is contained therein. The light emitted from the no-light entry end surface of the light guide plate is the blue light from the light source. Accordingly, compared with if the light is included as is in the output light of the lighting device, the output light may have a blue color tint on the outer peripheral side compared with the center. In this respect, the light emitted from the no-light entry end surface of the light guide plate is wavelength-converted by the end surface-side wavelength conversion portion. Accordingly, the proportion of blue light in the output light from the outer peripheral side of the lighting device can be decreased, whereby the color irregularity can be preferably suppressed.

(11) The wavelength conversion member may contain a quantum dot phosphor as the phosphor. In this way, the light wavelength conversion efficiency of the wavelength conversion member is increased, and the chromatic purity of the wavelength-converted light is increased.

In order to solve the problem, a display device according to the present invention includes the lighting device described above; and a display panel displaying an image by utilizing light emitted from the lighting device. In the display device having such a configuration, because the occurrence of color irregularity in the output light from the lighting device is suppressed, a display with excellent display quality can be achieved.

Furthermore, in order to solve the problem, a television device according to the present invention includes the display device described above. The television device, in which the display device has excellent display quality, can achieve a display of a television image with excellent display quality.

Advantageous Effect of the Invention

According to the present invention, the occurrence of color irregularity can be suppressed.

BRIEF DESCRIPTION OF THE DRAWINGS

FIG. 37 is a plan view of a wavelength conversion sheet in an expand state according to a twenty-first embodiment of the present invention; and FIG. 38 is a plan view of a wavelength conversion sheet in an expand state according to a twenty-second embodiment of the present invention.

MODE FOR CARRYING OUT THE INVENTION

First Embodiment

A first embodiment of the present invention will be described with reference to FIG. 1 to FIG. 8. In the present embodiment, a backlight unit 12 and a liquid crystal display device 10 using the backlight unit 12 will be described by way of example. In some of the drawings, the X-axis, the Y-axis, and the Z-axis are shown, the axis directions being drawn to correspond to the directions shown in the respective drawings. Further, the upper side of FIG. 4 and FIG. 5, for example, is referred to as the front side, and the lower side as the back side.

Figure 1:
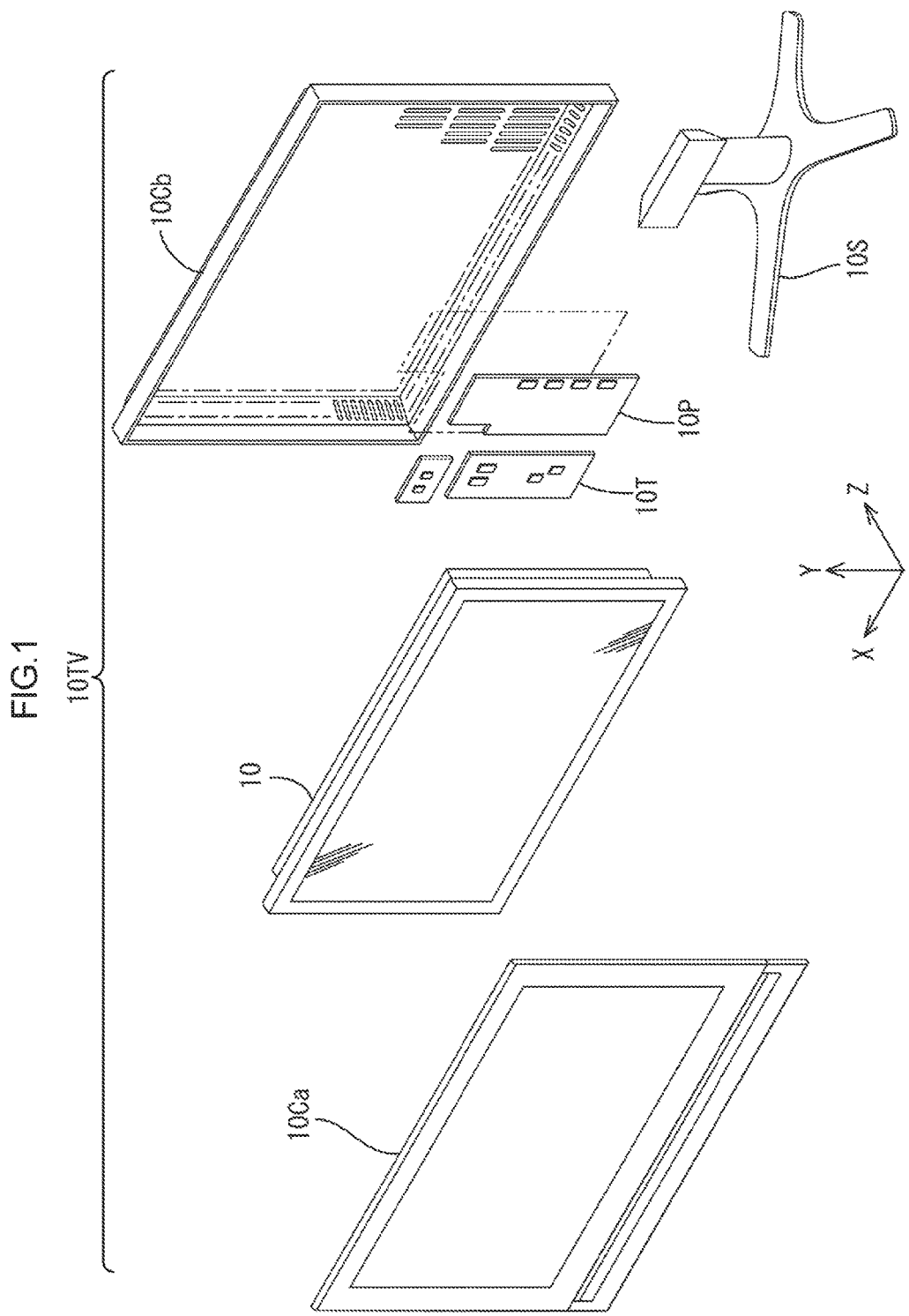
FIG. 1 is an exploded perspective view illustrating a schematic configuration of a television device according to a first embodiment of the present invention.
Figure 2:
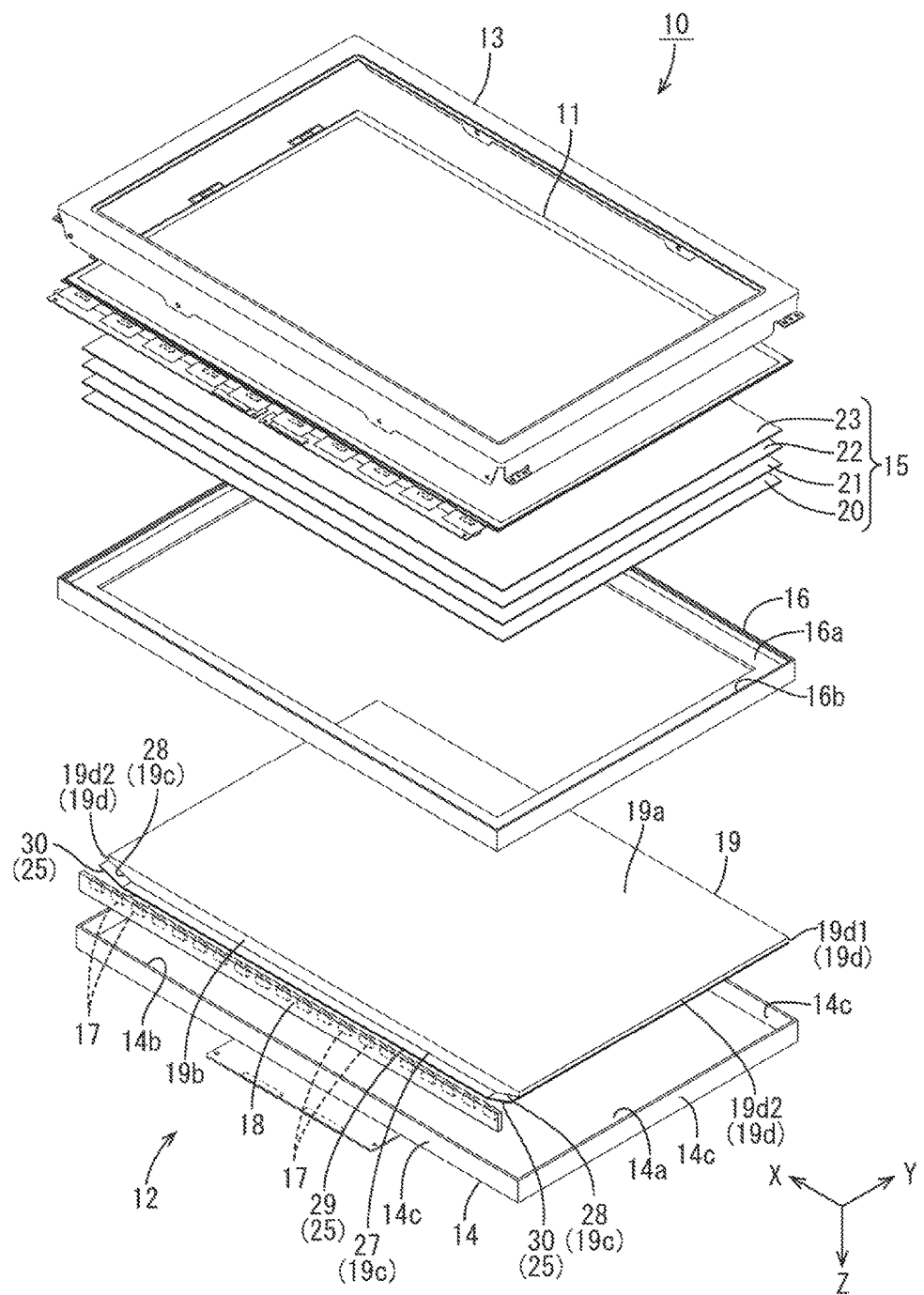
FIG. 2 is an exploded perspective view illustrating a schematic configuration of a liquid crystal display device provided in the television device.

As illustrated in FIG. 1, the television device 10TV according to the present embodiment includes: the liquid crystal display device 10; front and back cabinets 10Ca and 10Cb housing the liquid crystal display device 10 in a sandwiched manner; a power supply 10P; a tuner (receiving unit) 10T for television signal reception; and a stand 10S. The liquid crystal display device (display device) 10 has a generally laterally elongated (longitudinal) square shape (rectangular shape), and is housed in a vertically placed state. As illustrated in FIG. 2, the liquid crystal display device 10 includes a liquid crystal panel 11 as a display panel for displaying an image, and a backlight unit (lighting device) 12 as an external light source for supplying light for display to the liquid crystal panel 11, which are integrally held by a frame-like bezel 13 or the like.

Next, the liquid crystal panel 11 and the backlight unit 12 constituting the liquid crystal display device 10 will be described in order. The liquid crystal panel (display panel) 11 has a laterally elongated rectangular shape as viewed in plan, and includes a pair of glass substrates bonded together, with a predetermined gap therebetween, and a liquid crystal layer (not shown) sealed between the glass substrates. The liquid crystal layer contains liquid crystal molecules, which are a substance whose optical characteristics are changed by application of an electric field. On the inner surface side of one glass substrate (array substrate, active matrix substrate), there are provided, for example: switching elements (for example, TFTs) and pixel electrodes, the switching elements being connected to mutually orthogonal source wires and gate wires, the pixel electrodes being arranged in a rectangular region surrounded by source wires and gate wires and which are connected to the switching elements. The switching elements and the pixel electrodes are arranged in a planar matrix configuration; and an alignment film. On the inner surface side of the other glass substrate (opposite substrate, CF substrate), there are provided: a color filter in which colored portions of R (red), G (green), B (blue) and the like are arranged in a planar matrix configuration in a predetermined arrangement; a light shielding layer (black matrix) arranged between the colored portions and forming a lattice shape; a solid counter electrode opposed to the pixel electrodes; and an alignment film. Polarizing plates are disposed on the outer surface sides of both glass substrates, respectively. In addition, the long side direction of the liquid crystal panel 11 coincides with the X-axis direction, the short side direction coincides with the Y-axis direction, and the thickness direction coincides with the Z-axis direction.

As illustrated in FIG. 2, the backlight unit 12 includes a substantially box-shaped chassis 14 having a light emitting portion 14b opening toward the front side (liquid crystal panel 11 side) and optical members (optical sheets) 15 arranged so as to cover the light emitting portion 14b of the chassis 14. Furthermore, the chassis 14 houses: LEDs 17 as a light source; an LED substrate 18 on which the LEDs 17 are mounted; alight guide plate 19 for guiding light from the LEDs 17 to the optical members 15 (liquid crystal panel 11); and a frame 16 for pressing the light guide plate 19 and the like from the front side. In the backlight unit 12, the LED substrate 18 is disposed in one of a pair of end portions on the long sides (the front side in FIGS. 2 and 3, the left side in FIG. 4), so that the LEDs 17 mounted on the LED substrate 18 are displaced toward one of the long side ends of the liquid crystal panel 11. Thus, the backlight unit 12 according to the present embodiment is an edge light (side light) backlight unit which is of a one-side light entry type in which the light of the LEDs 17 enters the light guide plate 19 only from one side. Subsequently, each component of the backlight unit 12 will be described in detail.

Figure 3:
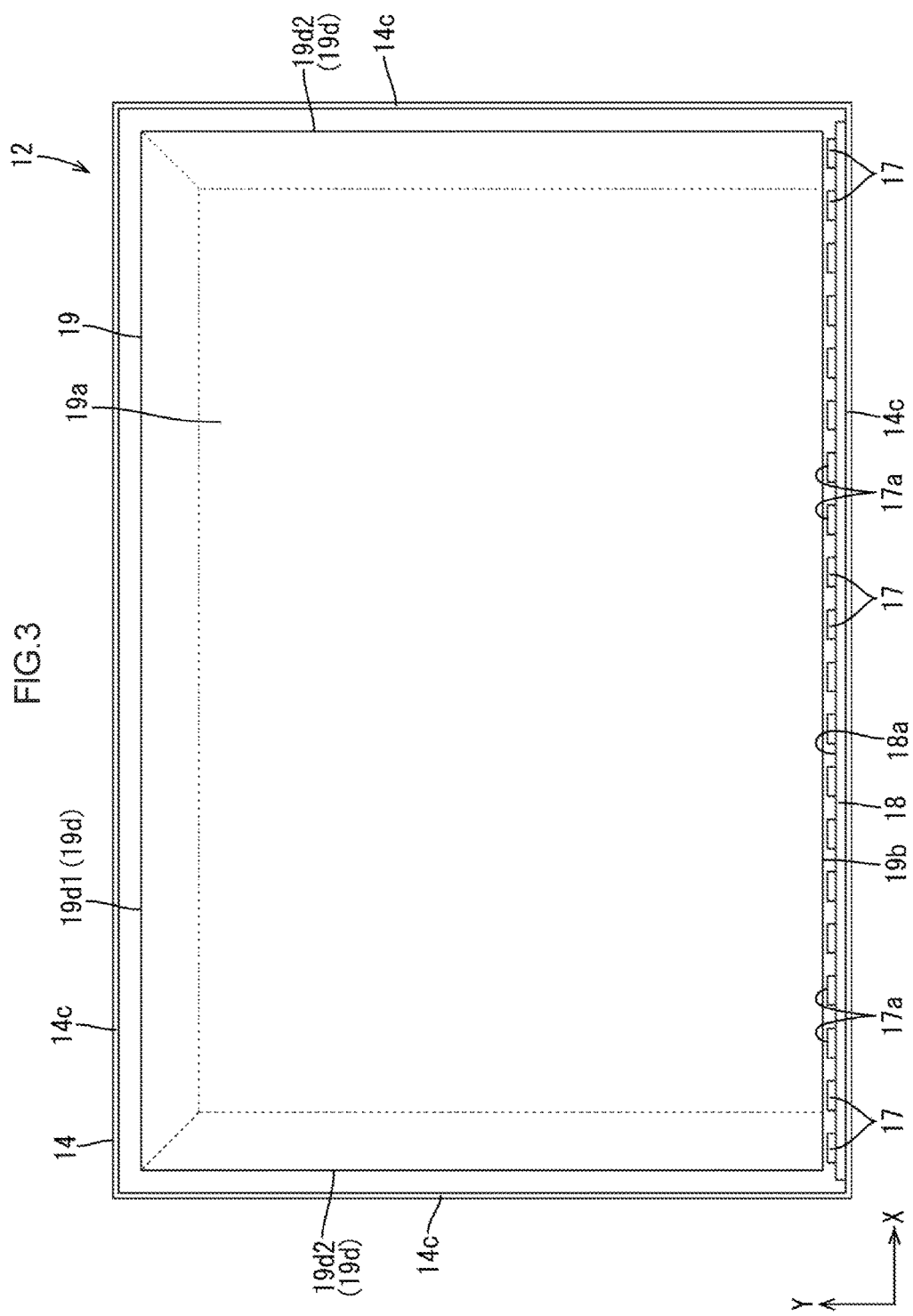
FIG. 3 is a plan view of a backlight unit provided in the liquid crystal display device.

The chassis 14 is made of metal, and as illustrated in FIGS. 2 and 3, includes: a bottom portion 14a having a laterally elongated rectangular shape similar to the liquid crystal panel 11; and side portions 14c rising from the outer end of each side of the bottom portion 14a. The chassis 14 has a shallow box shape that opens toward the front as a whole. The long side direction of the chassis 14 (the bottom portion 14a) coincides with the X-axis direction (horizontal direction), and the short side direction coincides with the Y-axis direction (vertical direction). Further, the frame 16 and the bezel 13 can be fixed to the side portions 14c.

Figure 4:
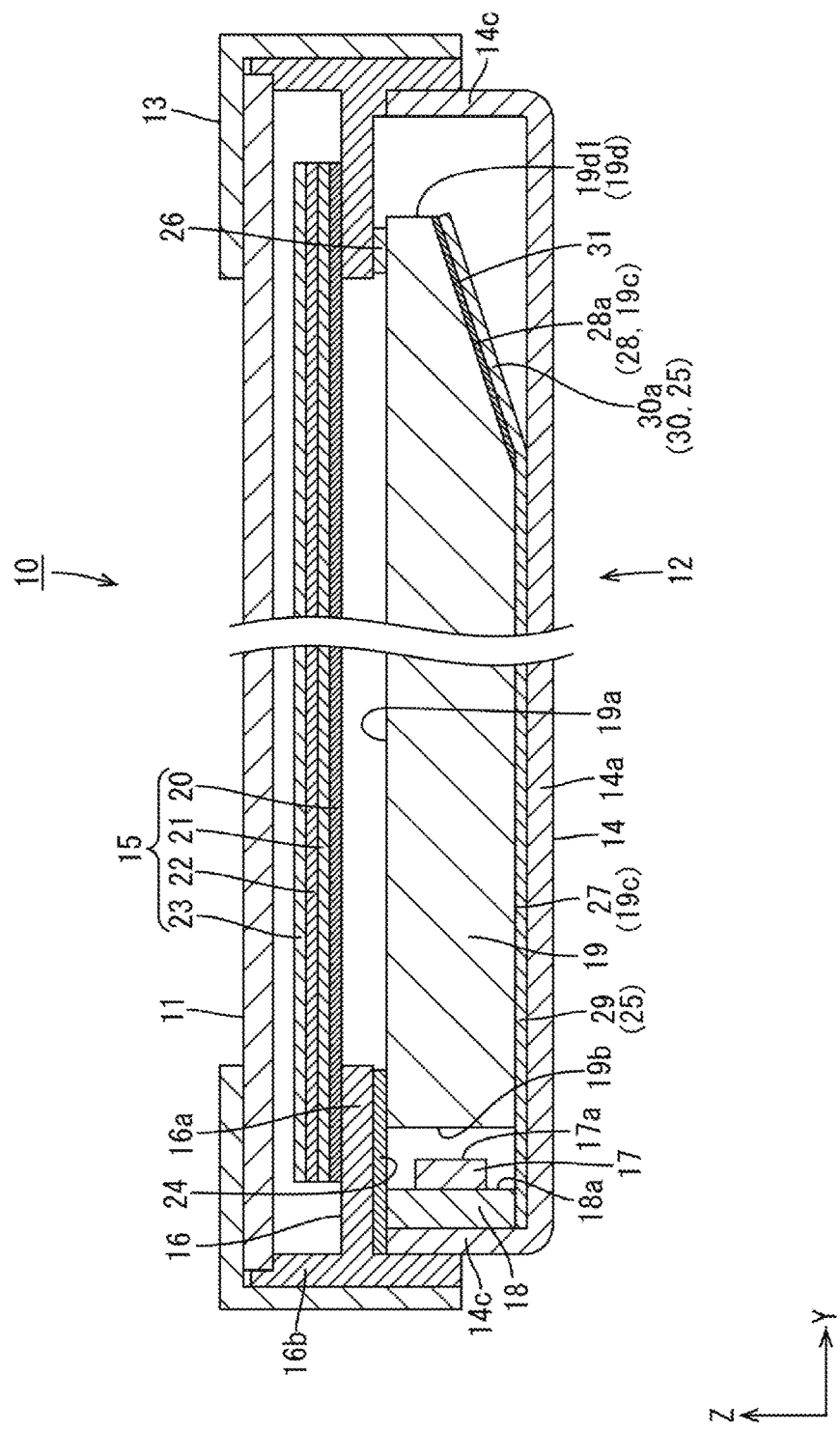
FIG. 4 is a cross sectional view taken along line iv-iv of FIG. 3.
Figure 5:
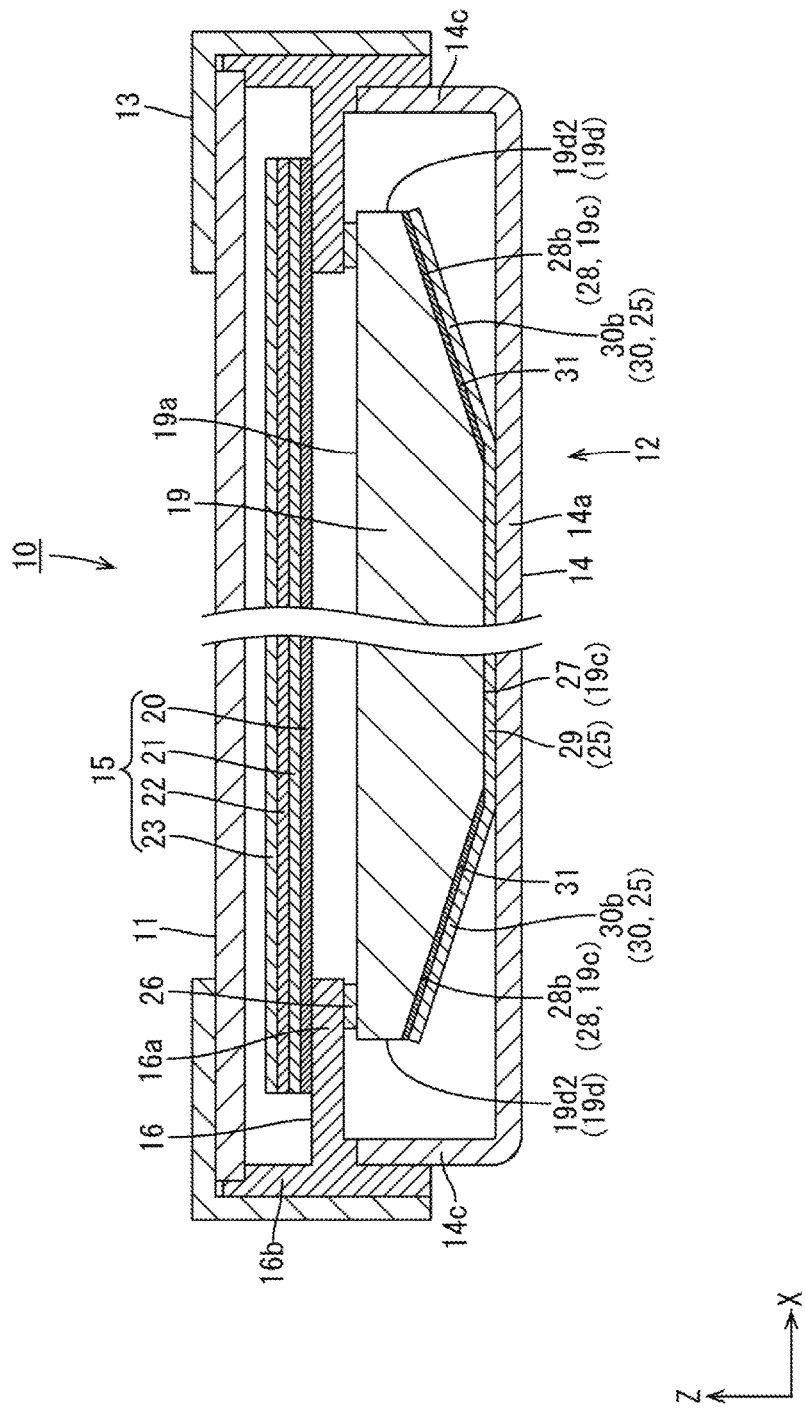
FIG. 5 is a cross sectional view taken along line v-v of FIG. 3.

As illustrated in FIG. 2, the optical members 15 have a laterally elongated rectangular shape as viewed in plan, similar to the liquid crystal panel 11 and the chassis 14. The optical members 15 cover the light emitting portion 14b of the chassis 14 and are interposed between the liquid crystal panel 11 and the light guide plate 19. The optical members 15 are in the form of a sheet, and include a total of four optical members. Specifically, the optical members 15 include: a wavelength conversion sheet (wavelength conversion member) 20 that wavelength-converts the light (primary light) emitted from the LEDs 17 to light of another wavelength (secondary light); a microlens sheet 21 that imparts a isotropic light condensing action to light; a prism sheet 22 that imparts an anisotropic light condensing action to light; and a reflection type polarizing sheet 23 that polarizes and reflects light. In the optical members 15, as illustrated in FIG. 4 and FIG. 5, the wavelength conversion sheet 20, the microlens sheet 21, the prism sheet 22, and the reflection type polarizing sheet 23 are stacked upon each other in this order from the back side, with their outer edge portions placed on the front side of the frame 16. That is, the wavelength conversion sheet 20, the microlens sheet 21, the prism sheet 22, and the reflection type polarizing sheet 23 constituting the optical members 15 are disposed on the front side, i.e., the light exit side, so as to oppose the light guide plate 19 with an interval corresponding to the frame 16 (a flange portion 16a, which will be described in detail later). The specific configuration of the wavelength conversion sheet 20 will be described in detail later.

The microlens sheet 21 has a base member and a microlens portion provided on the front side plate surface of the base member. The microlens portion has a large number of unit microlenses arranged in a planar matrix configuration (matrix form) along the X-axis direction and the Y-axis direction. The unit microlenses are convex lenses having a substantially circular shape when viewed in plan and a generally substantially hemispherical shape. With this configuration, the microlens sheet 21 imparts an isotropic light condensing action (anisotropic light condensing action) to the light with respect to the X-axis direction and the Y-axis direction. The prism sheet 22 has a base member and a prism portion provided on the front sideplate surface of the base member. The prism portion is composed of a number of unit prisms extending along the X-axis direction and arranged along the Y-axis direction. The unit prisms have the shape of parallel rails (lines) in the X-axis direction as viewed in plan, and has a cross sectional shape along the Y-axis direction that is substantially an isosceles triangle shape. With this configuration, the prism sheet 22 selectively imparts a light condensing action (anisotropic light condensing action to the light with respect to the Y-axis direction (the direction in which the unit prisms are arranged, the direction orthogonal to the extending direction of the unit prisms). The reflection type polarizing sheet 23 is composed of a reflective polarizing film that polarizes and reflects light and a pair of diffusing films that sandwich the reflective polarizing film from the front and back. The reflective polarizing film has a multilayer structure in which, for example, layers having different refractive indexes are alternately laminated, and is configured to transmit p waves contained in light and reflect s waves to the back side. The s waves reflected by the reflective polarizing film are reflected again to the front side by a reflection sheet 25 and the like which will be described later, where the s waves are separated into an s wave and a p wave. As described above, the reflection type polarizing sheet 23, being provided with the reflective polarizing film, can reflect the s-wave that would be absorbed by the polarizing plate of the liquid crystal panel 11 to the back side (the side of the reflection sheet 25) for reutilization, whereby the light utilization efficiency (and eventually brightness) can be increased. The pair of diffusion films is made of a synthetic resin material such as polycarbonate, and embossed on the plate surface on the side opposite to the reflective polarizing film side, thereby imparting a diffusing action to the light.

The frame 16, as illustrated in FIG. 2, includes the laterally elongated flange portion (picture-frame shaped portion) 16a extending along the outer peripheral edge portions of the light guide plate 19 and the optical members 15. The flange portion 16a presses the outer peripheral edge portions of the light guide plate 19 from the front side substantially all around. As illustrated in FIG. 4, a frame-side reflection sheet 24 for reflecting light is attached to the back side surface of one of the long-side portions of the flange portion 16a, that is, the back side surface opposing the light guide plate 19 and the LED substrate 18 (LEDs 17). The frame-side reflection sheet 24 has a white surface for excellent optical reflection, and is sized to extend along substantially the entire length of the one of the long-side portions of the flange portion 16a. The frame-side reflection sheet 24 is directly brought into contact with the end portion of the light guide plate 19 on a side of the LEDs 17, and covers the end portion of the light guide plate 19 and the LED substrate 18 collectively from the front side. The flange portion 16a of the frame 16 is interposed between the optical member 15 (wavelength conversion sheet 20) and the light guide plate 19, and supports the outer peripheral edge portions of the optical members 15 from the back side. In this way, the optical members 15 are maintained at a position spaced apart from the light guide plate 19 with an interval corresponding to the flange portion 16a. Of the flange portion 16a of the frame 16, on the back-side (the light guide plate 19 side) surfaces of the three side portions except for the one long-side portion where the frame-side reflection sheet 24 is installed, a buffer material 26 made of PORON (registered trademark), for example, is provided. The frame 16 further includes a liquid crystal panel support portion 16b which protrudes from the flange portion 16a toward the front side, and which supports the outer peripheral edge portions of the liquid crystal panel 11 from the back side.

The LEDs 17 and the LED substrate 18 on which the LEDs 17 are mounted will be described. The LEDs 17, as illustrated in FIG. 3 and FIG. 4, are surface-mounted on the LED substrate 18. The LEDs 17 are of the so-called top-emitting type, and have light emitting surfaces 17a facing on the opposite side from the side of the LED substrate 18. Specifically, the LEDs 17 include blue LED elements (blue light-emitting elements, blue LED chips) as light-emitting sources each encapsulated in a case using an encapsulant. That is, the LEDs 17 are blue LEDs that emit single-color light of blue. Some of the blue light emitted from the LEDs 17 is wavelength-converted into green light or red light by the wavelength conversion sheet 20 as will be described later. The wavelength-converted green light and red light (secondary light) are additively mixed with the blue light (primary light) from the LEDs 17, whereby approximately white output light is obtained from the backlight unit 12. The blue LED elements of the LEDs 17 are semiconductors, for example, including a semiconductor material such as InGaN. The blue LED elements are configured to emit single-color light of blue of wavelengths included in a blue wavelength region (about 420 nm to about 500 nm) upon application of a voltage in the forward direction. That is, the emitted light of the LEDs 17 is the single-color light of the same color as the emitted light of the blue LED elements. The blue LED elements are connected, via a lead frame which is not illustrated, to a wiring pattern on the LED substrate 18 disposed outside the case.

As illustrated in FIG. 3 and FIG. 4, the LED substrate 18 has a thin and long plate shape extending along the long-side direction of the chassis 14 (X-axis direction; the longitudinal direction of the light entry end surface 19b of the light guide plate 19). The LED substrate 18 is housed in the chassis 14 with the plate surface thereof in parallel with the X-axis direction and the Z-axis direction, namely, with the plate surface orthogonal to the plate surface of the liquid crystal panel 11 and that of the light guide plate 19 (optical members 15). In other words, the LED substrate 18 has a long-side direction (length direction) of the plate surface aligned with the X-axis direction and a short-side direction (width direction) aligned with the Z-axis direction, and further has a plate thickness direction orthogonal to the plate surface that is aligned with the Y-axis direction. The LED substrate 18 is interposed between the light guide plate 19 and the side portion 14c on the side of one of the long-sides of the chassis 14. The LED substrate 18 is configured to be housed in the chassis 14 from the front side along the Z-axis direction. The LED substrate 18 is disposed such that its plate surface on the opposite side from the mount surface 18a having the LEDs 17 mounted thereon contacts the inner surface of the long-side side portion 14c of the chassis 14. Accordingly, the light emitting surfaces 17a of the LEDs 17 mounted on the LED substrate 18 are opposed to a long-side end surface (light entry end surface 19b) of the light guide plate 19 as will be described later. The optical axes of the LEDs 17, i.e., the direction of travel of the light with the highest emission intensity, are substantially aligned with the Y-axis direction (the direction which is parallel with the plate surface of the liquid crystal panel 11; the direction along which the LEDs 17 and the light guide plate 19 arranged; and the direction normal to the light entry end surface 19b).

As illustrated in FIG. 3 and FIG. 4, the mount surface 18a of the LED substrate 18 on which the LEDs 17 configured as described above are surface-mounted is on the inside of the LED substrate 18, i.e., on the plate surface facing the light guide plate 19 (the surface opposing the light guide plate 19). On the mount surface 18a of the LED substrate 18, a plurality of LEDs 17 are arranged side by side in a row at predetermined intervals (linearly) along the length direction (the X-axis direction). In other words, a plurality of LEDs 17 are arranged side by side intermittently along the long-side direction on one long-side end of the backlight unit 12. Accordingly, the arranged direction of the LEDs 17 is aligned with the length direction of the LED substrate 18 (the X-axis direction). The intervals of the LEDs 17 that are adjacent with respect to the X-axis direction, i.e., the arrangement intervals (arrangement pitch) of the LEDs 17 are substantially equal. In other words, the LEDs 17 are arranged at regular pitches. The mount surface 18a of the LED substrate 18 has a wiring pattern (not illustrated) formed of a metal film (such as copper foil) extending along the X-axis direction and across the LEDs 17 and connecting the adjacent LEDs 17 in series. To a terminal portion formed at the end of the wiring pattern, an LED drive circuit substrate, not illustrated, is electrically connected via a wiring member and the like, not illustrated, so as to supply drive electric power to the LEDs 17. The LED substrate 18 is of a one-side mount type with the mount surface 18a disposed only on one side of the plate surface. The LED substrate 18 includes a base member of metal, such as aluminum, on a surface of which the wiring pattern (not illustrated) is formed via an insulating layer. The material of the base member of the LED substrate 18 maybe an insulating material, such as synthetic resin or ceramic.

The light guide plate 19 includes a synthetic resin material (for example, acrylic resin material such as PMMA) that has a refractive index sufficiently higher than air, and that is substantially transparent (for excellent transparency). As illustrated in FIG. 2 and FIG. 3, the light guide plate 19 has a laterally elongated rectangular shape as viewed in plan, similar to the liquid crystal panel 11 and the chassis 14, and a plate shape with a greater thickness than the optical members 15. In the plate surface of the light guide plate 19, the long-side direction is aligned with the X-axis direction, and the short-side direction is aligned with the Y-axis direction. The plate thickness direction orthogonal to the plate surface is aligned with the Z-axis direction. As illustrated in FIG. 4 and FIG. 5, the light guide plate 19 is disposed directly under the liquid crystal panel 11 and the optical members 15 in the chassis 14. Of the outer peripheral end surfaces of the light guide plate 19, one long-side end surface (the fore side of FIG. 2 and FIG. 3; the left side of FIG. 4) is opposed to the respective LEDs 17 on the LED substrate 18 disposed on one long-side end of the chassis 14. Accordingly, while the arranged direction of the LEDs 17 (LED substrate 18) and the light guide plate 19 is aligned with the Y-axis direction, the arranged direction of the optical members 15 (the liquid crystal panel 11) and the light guide plate 19 is aligned with the Z-axis direction, the arranged directions being orthogonal to each other. The light guide plate 19 has the function of inwardly guiding the light emitted from the LEDs 17 in the Y-axis direction, and causing the light to rise and to be emitted toward the optical members 15 (the front side) while causing the light to propagate therein.

As illustrated in FIG. 4 and FIG. 5, of the pair of plate surfaces of the light guide plate 19, the plate surface on the front side constitutes a light output plate surface (light exit surface) 19a for causing the internal light to be emitted toward the optical members 15 and the liquid crystal panel 11. The light guide plate 19 has the outer peripheral end surfaces that are adjacent with respect to the plate surfaces thereof. The outer peripheral end surfaces include the pair of long-side end surfaces extending longitudinally along the X-axis direction (the arranged direction of the LEDs 17; the long-side direction of the LED substrate 18). Of the pair of long-side end surfaces, one (on the fore side of FIG. 2 and FIG. 3) is the light entry end surface (light incidence plane) 19b which is opposed to the LEDs 17 (LED substrate 18) via a predetermined space, and into which the light emitted from the LEDs 17 directly enters. The light entry end surface 19b, being opposed to the LEDs 17, may be referred to as "an LED-opposing end surface (light source-opposing end surface)". The light entry end surface 19b is a plane which is parallel with the X-axis direction and the Z-axis direction, and which is substantially orthogonal to the light output plate surface 19a. On the other hand, of the outer peripheral end surfaces of the light guide plate 19, the surfaces other than the light entry end surface 19b (the other long-side end surface, and the pair of short-side end surfaces) constitute no-light entry end surfaces 19d on which the light emitted from the LEDs 17 does not directly enter. The no-light entry end surfaces 19d, being not opposed to the LEDs 17, may be referred to as "LED non-opposing end surfaces (light source non-opposing end surfaces)". The no-light entry end surfaces 19d includes: a no-light entry opposite end surface 19d1 which is the other of the pair of long-side end surfaces among the outer peripheral end surfaces of the light guide plate 19, i.e., the end surface on the opposite side from the light entry end surface 19b; and a pair of no-light entry side end surfaces 19d2 which are the pair of short-side end surfaces adjacent to the light entry end surface 19b and the no-light entry opposite end surface 19d1. While in the present embodiment, the LED non-opposing end surfaces are described as being the "no-light entry end surfaces 19d", this does not mean that no light at all enters these surfaces. For example, when light that has once leaked out of the no-light entry end surfaces 19d may be reflected and returned by, for example, the side portions 14c of the chassis 14, the returned light may enter the no-light entry end surfaces 19d.

On the back side of the light guide plate 19, i.e., an opposite plate surface 19c on the opposite side from the light output plate surface 19a, a reflection sheet (a light guide plate side reflection member; a reflection member) 25 is disposed so as to overlap the back side. The reflection sheet 25 is made from synthetic resin (for example, foamed PET) and has a white surface for excellent optical reflection. The reflection sheet 25 reflects the light that has propagated in the light guide plate 19 and reached the opposite plate surface 19c, and thereby causes the light to rise toward the front side, i.e., the light output plate surface 19a. The reflection sheet 25 is disposed so as to cover substantially all of the areas of the opposite plate surface 19c of the light guide plate 19. The reflection sheet 25, as viewed in plan, extends to an area superposed with the LED substrate 18 (LEDs 17), and is disposed so as to sandwich the LED substrate 18 (LEDs 17) between the extension portion and the frame-side reflection sheet 24 on the front side. In this way, the light from the LEDs 17 is repeatedly reflected between the reflection sheets 24, 25, thereby causing the light to efficiently enter the light entry end surface 19b. The opposite plate surface 19c of the light guide plate 19 is formed with a light reflection pattern (not illustrated). The opposite plate surface 19c includes a light reflection portion for reflecting the light in the light guide plate 19 toward the light output plate surface 19a, thereby promoting optical emission from the light output plate surface 19a. The light reflection portion of the light reflection pattern includes a number of light reflecting dots, of which the distribution density is varied in accordance with the distance from the light entry end surface 19b (LEDs 17). Specifically, the distribution density of the light reflecting dots of the light reflection portion is increased as the distance from the light entry end surface 19b with respect to the Y-axis direction increases (i.e., as the light reflecting dots become closer to the no-light entry opposite end surface 19d1); conversely, the distribution density is decreased as the distance to the light entry end surface 19b decreases (i.e., as the light reflecting dots become farther from the no-light entry opposite end surface 19d1). In this way, the output light from the light output plate surface 19a is controlled to have a uniform in-plane distribution.

Figure 6:
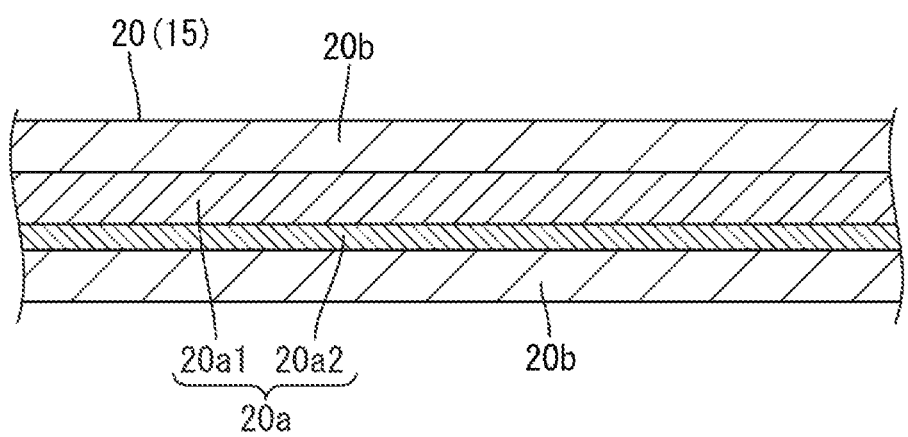
FIG. 6 is a cross sectional view of a wavelength conversion sheet.

The wavelength conversion sheet 20 will now be described in detail. The wavelength conversion sheet 20, as illustrated in FIG. 4 and FIG. 5, has the outer peripheral edge portions thereof directly placed on the flange portion 16a of the frame 16 from the front side. As illustrated in FIG. 6, the wavelength conversion sheet 20 includes: a wavelength conversion layer (phosphor film) 20a containing a phosphor (wavelength conversion substance) for wavelength conversion of the light from the LEDs 17; and a pair of protection layers (protection films) 20b sandwiching the wavelength conversion layer 20a between the top and bottom to protect the same. The wavelength conversion layer 20a has a red phosphor and a green phosphor dispersed and compounded therein. The red phosphor emits red light (visible light rays of a specific wavelength region belonging to red) and the green phosphor emits green light (visible light rays of a specific wavelength region belonging to green), using the monochromatic light of blue from the LEDs 17 as the excitation light. In this way, the wavelength conversion sheet 20 wavelength-converts the emitted light from the LEDs 17 (blue light; primary light) into secondary light (green light and red light) that produces a color tint (yellow) of a complementary color to the color tint (blue) of the emitted light. The wavelength conversion layer 20a includes a film-shaped base member (phosphor carrier) 20a1 made from substantially transparent synthetic resin, and a phosphor layer 20a2 coating the base member 20a1 and having red phosphor and green phosphor dispersed and compounded therein. The protection layers 20b are made from substantially transparent synthetic resin and are film-shaped, and have excellent moisture resistance and the like.

More specifically, the phosphors of the respective colors contained in the wavelength conversion layer 20a exhibit emission spectra as follows when excited by blue light. The green phosphor, using blue light as excitation light, emits light of a wavelength region corresponding to green (about 500 nm to about 570 nm), i.e., green light, as fluorescent light. The green phosphor preferably has an emission spectrum with a peak wavelength of about 530 nm in a green light wavelength range, and with a half value width of less than 40 nm. The red phosphor emits, using blue light as excitation light, light of a wavelength region corresponding to red (about 600 nm to about 780 nm), i.e., red light, as fluorescent light. The red phosphor preferably has an emission spectrum with a peak wavelength of about 610 nm in a red light wavelength range and a half value width of less than 40 nm.

Thus, the phosphors for the respective colors are of down-conversion type (downshifting type) in which the excitation wavelength is shorter than the fluorescence wavelength. The down-conversion type phosphors convert excitation light of relatively short wavelength with high energy into fluorescent light of relatively long wavelength with low energy. Accordingly, compared with the case of an up-conversion type of phosphor with an excitation wavelength longer than the fluorescence wavelength (where the quantum efficiency is on the order of 28%, for example), the quantum efficiency (light conversion efficiency) is higher on the order of 30% to 50%. The phosphors of the respective colors are quantum dot phosphors. Quantum dot phosphors have discrete energy levels due to the confinement of electrons, holes, and excitons in a nano-size (for example, on the order of 2 nm to 10 nm in diameter) semiconductor crystal in all orientations of the three-dimensional space. By varying the size of the dots, the peak wavelength (emitted color) of the emitted light can be selected as appropriate, for example. The emitted light (fluorescent light) of the quantum dot phosphor has a sharp peak in the emission spectrum and a resultant narrow half value width thereof, and therefore exhibits extremely high chromatic purity and a wide color gamut. Examples of the material of the quantum dot phosphor include: material combining Zn, Cd, Hg, Pb, or the like that becomes a divalent cation, and O, S, Se, Te, or the like that become a divalent anion (such as CdSe (cadmium selenide) and ZnS (zinc sulfide)); material combining Ga, In, or the like that becomes a trivalent cation and P, As, Sb or the like that becomes a trivalent anion (such as InP (indium phosphide) and GaAs (gallium arsenide)); and a chalcopyrite type compound (such as $CuInSe_2$). In the present embodiment, as the quantum dot phosphor material, CdSe and ZnS from the above are used in combination. In the present embodiment, the quantum dot phosphors are so-called core-shell type quantum dot phosphor. A core-shell type quantum dot phosphor has a structure in which a quantum dot is covered with a shell including a semiconductor substance with a relatively large band gap. Specifically, as the core-shell type quantum dot phosphor, the "Lumidot (registered trademark) CdSe/ZnS" product available from Sigma-Aldrich Japan is preferably used.

In the edge light backlight unit 12 as in the present embodiment, as illustrated in FIG. 4 and FIG. 5, the light emitted from the light output plate surface 19a of the light guide plate 19 is not necessarily entirely wavelength-converted by the wavelength conversion sheet 20 and utilized as is as the output light of the backlight unit 12. Some of the light may be retroreflected and returned toward the light guide plate 19 side, and then utilized as the output light of the backlight unit 12. The retroreflected light tends to have a smaller number of times of retroreflection, i.e., a smaller number of times of passage through the wavelength conversion sheet 20, and hence a reduced probability of being wavelength-converted, on the outer peripheral sides of the light guide plate 19 than in the center thereof. Accordingly, the retroreflected light emitted from the outer peripheral sides of the light guide plate 19 (including the no-light entry end surfaces 19*d*) has a color tint which is closer to the color tint of the light of the LEDs 17, i.e., blue, compared with the retroreflected light emitted from the center of the light guide plate 19. In addition, the light propagating in the light guide plate 19 is not necessarily entirely emitted from the light output plate surface 19*a*, and some of the light may be emitted from the no-light entry end surfaces 19*d*. In particular, the light that is emitted from the LEDs 17, enters the light entry end surface 19*b* of the light guide plate 19, propagates in the light guide plate 19, and is then emitted as is from the no-light entry end surfaces 19*d* exhibits the color of blue. Conventionally, it has been difficult to wavelength-convert the light emitted from the outer peripheral sides of the light guide plate 19 using the wavelength conversion sheet 20. Accordingly, once the light leaks externally via a gap between the buffer material 26 and the light guide plate 19, for example, the output light of the backlight unit 12 is likely to have a blue tint only on the outer peripheral sides. As a result, the output light of the backlight unit 12 has tended to have a color tint difference between the outer peripheral sides and the center.

Accordingly, in the backlight unit 12 according to the present embodiment, as illustrated in FIG. 3 to FIG. 5, at least the central portion of the opposite plate surface 19*c* of the light guide plate 19 is a parallel plate surface 27 which is parallel with the light output plate surface 19*a*. At least apart of the outer peripheral side portions of the opposite plate surface 19*c* is an inclined plate surface 28 which is inclined with respect to the light output plate surface 19*a* so as to become closer to the light output plate surface 19*a* with decreasing distance from the outer peripheral end surface. In addition, the reflection sheet 25 includes a parallel reflection portion 29 disposed along the parallel plate surface 27 of the light guide plate 19, and an inclined reflection portion 30 disposed along the inclined plate surface 28 of the light guide plate 19. In this configuration, the optical path length of the light that is present in the portion, among the outer peripheral side portions of the light guide plate 19, in which the inclined plate surface 28 is provided on the opposite plate surface 19*c*, as the light travels from the inclined plate surface 28 of the opposite plate surface 19*c* to the light output plate surface 19*a*, is shorter than the optical path length of the light present in the central portion as the light travels from the parallel plate surface 27 of the opposite plate surface 19*c* to the light output plate surface 19*a*. The shorter the optical path length becomes, the greater the number of times of repeated total reflection of the light between the opposite plate surface 19*c* and the light output plate surface 19*a* becomes, and the greater the probability tends to become of being scattered and reflected by the light reflection pattern disposed on the opposite plate surface 19*c*. Then, the light that is present in the portion, among the outer peripheral side portions of the light guide plate 19, in which the inclined plate surface 28 is provided on the opposite plate surface 19*c* (including the light scattered and reflected by the light reflection pattern) is reflected by the inclined reflection portion 30 of the reflection sheet 25 disposed along the inclined plate surface 28, and is caused to rise toward the front side. That is, of the outer peripheral side portions of the light guide plate 19, in the portion in which the inclined plate surface 28 is provided on the opposite plate surface 19*c*, the light that is present therein is more easily scattered and reflected by the light reflection pattern, and, by being reflected by the inclined reflection portion 30, the output of light from the light output plate surface 19*a* is promoted. Accordingly, the reflected light due to the inclined reflection portion 30, compared with the reflected light due to the parallel reflection portion 29 disposed along the parallel plate surface 27, has a relatively greater number of times of retroreflection, i.e., a relatively greater number of times of passage through the wavelength conversion sheet 20. In this way, the retroreflected light transmitted through the portion, among the outer peripheral side portions of the light guide plate 19, in which the inclined plate surface 28 is provided on the opposite plate surface 19*c* is sufficiently wavelength-converted by the wavelength conversion sheet 20. In this way, the difference in color tint of the output light between the center and the outer peripheral sides of the backlight unit 12 is made difficult to occur, thereby making color irregularity difficult to occur in the output light.

Figure 7:
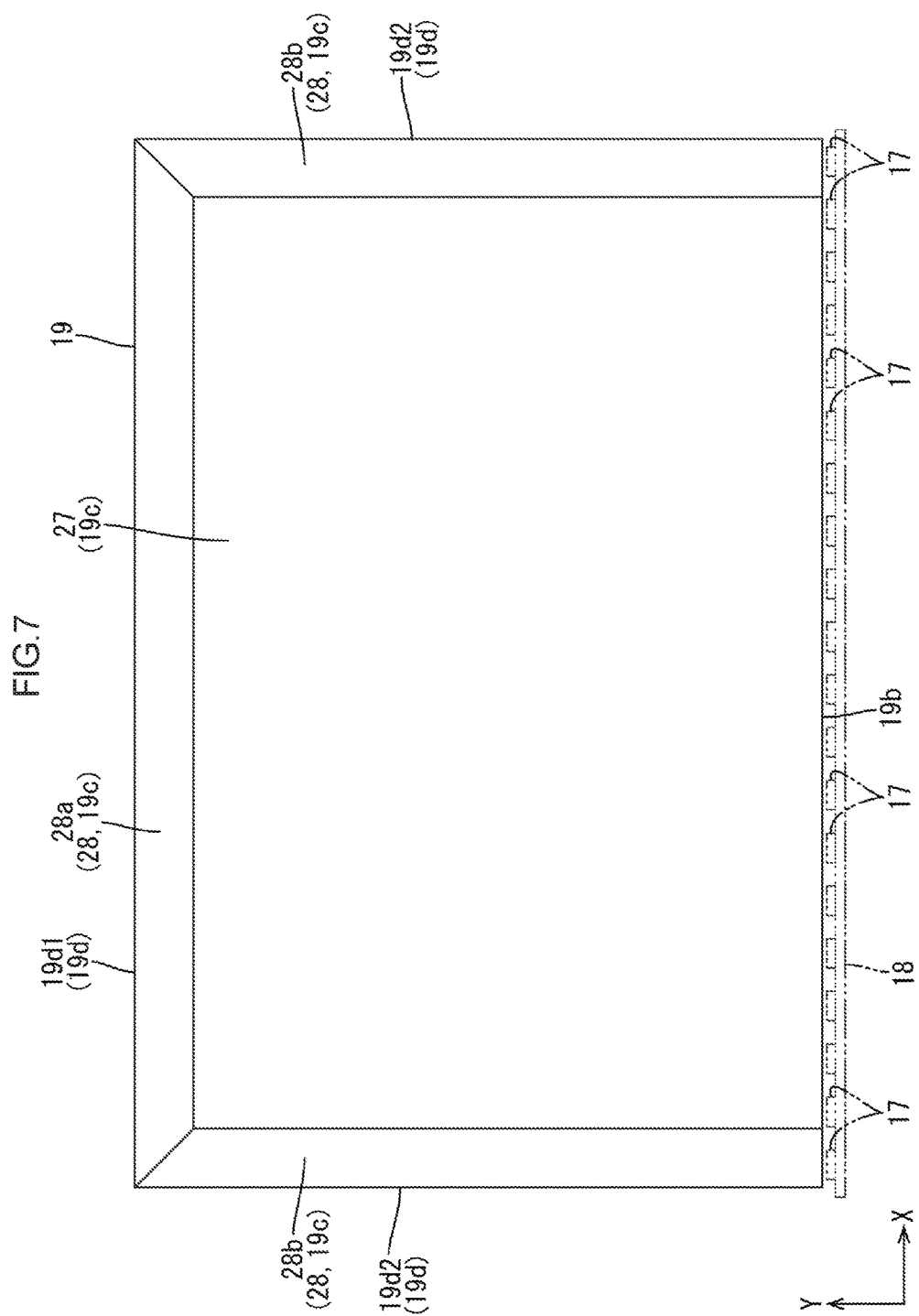
FIG. 7 is a bottom view of a light guide plate.
Figure 8:
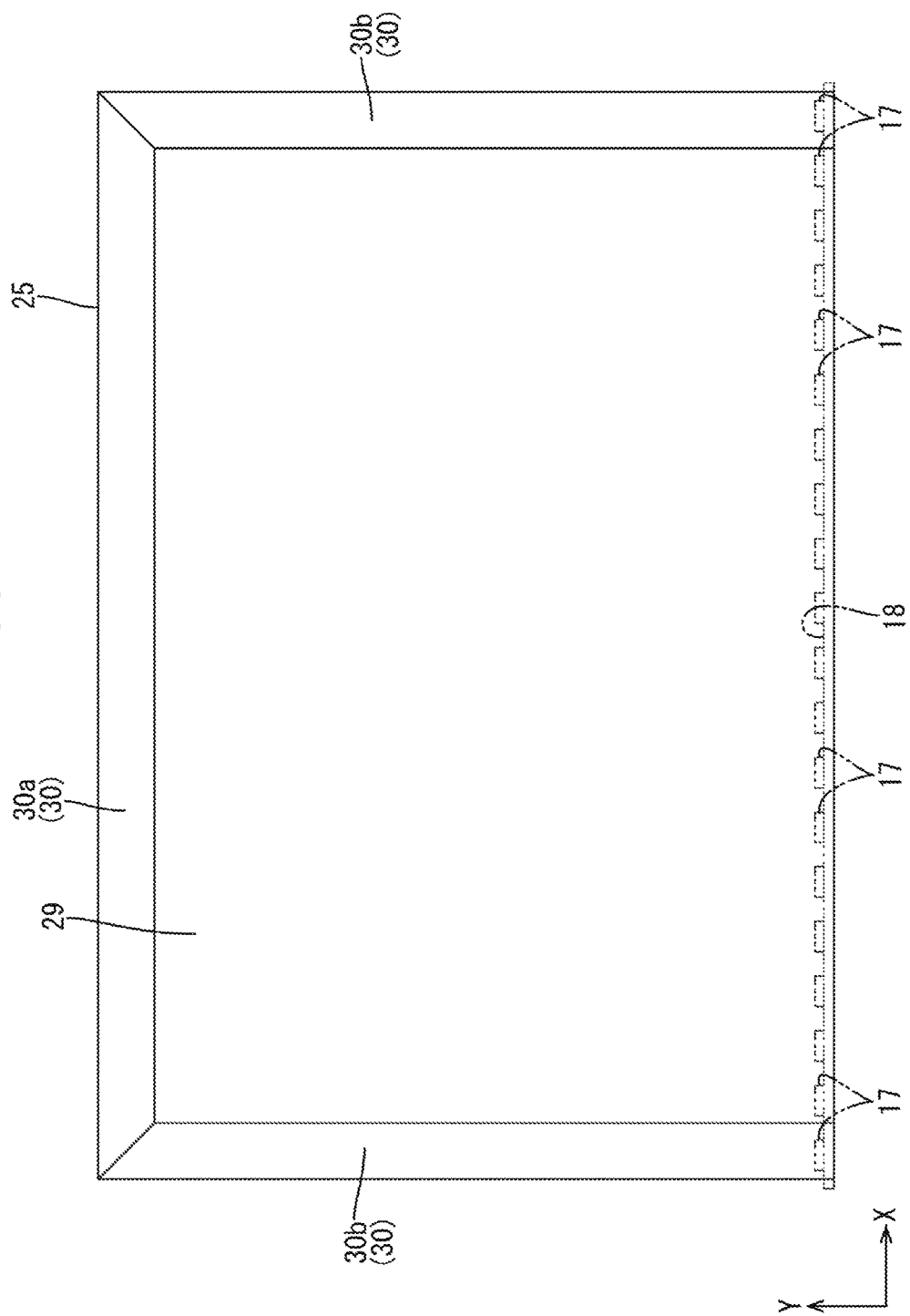
FIG. 8 is a plan view of a reflection sheet.

Specifically, the light guide plate 19 and the reflection sheet 25, as illustrated in FIG. 7, have a laterally elongated rectangular shape as viewed in plan where the central portion is slightly smaller than the outer shape of the light guide plate 19, whereas the outer peripheral side portions have a laterally elongated flange shape enclosing the central portion along the entire periphery thereof. The parallel plate surface 27 includes, of the opposite plate surface 19*c* of the light guide plate 19, the central portion and the portion (the lower long-side portion in FIG. 7) along the light entry end surface 19*b* of the outer peripheral side portions. The inclined plate surface 28 includes all of the areas of the opposite plate surface 19*c* of the light guide plate 19 except for the portion along the light entry end surface 19*b* of the outer peripheral side portions, i.e., all of the areas of the portions along the no-light entry end surfaces 19*d*. More specifically, the inclined plate surface 28 includes: a no-light-entry, opposite end surface-side inclined plate surface (the upper long-side portion in FIG. 7) 28*a* along a no-light entry opposite end surface 19*d*1 of the outer peripheral side portions of the opposite plate surface 19*c* of the light guide plate 19; and no-light entry side, end surface-side inclined plate surfaces (a pair of right and left long-side portions illustrated in FIG. 7) 28*b* along a pair of no-light entry side end surfaces 19*d*2. On the other hand, the parallel reflection portion 29, as illustrated in FIG. 8, includes, of the reflection sheet 25, the central portion and the portion along the light entry end surface 19*b* of the outer peripheral side portions (the long-side portion on the bottom in FIG. 8). The inclined reflection portion 30 includes, of the reflection sheet 25, all of the areas of the outer peripheral side portions except for the portion along the light entry end surface 19*b*, i.e., all of the areas of the portions along the no-light entry end surfaces 19*d*. The inclined reflection portion 30 includes, of the outer peripheral side portions of the reflection sheet 25, a no-light entry opposite end surface-side inclined reflection portion (the upper long-side portion in FIG. 8) 30*a* along the no-light entry opposite end surface 19*d*1, and no-light entry-side, end surface-side inclined reflection portions (the pair of right and left long-side portions in FIG. 8) 30*b* along a pair of no-light entry side end surfaces 19*d*2. There has been the concern that the light propagating in the light guide plate 19 after being emitted from the LEDs 17 and entering the light entry end surface 19*b* of the light guide plate 19 may be readily emitted via, of the outer peripheral end surfaces of the light guide plate 19, the no-light entry end surfaces 19*d* and not the light entry end surface 19*b*, and more of the light via the pair of no-light entry side end surfaces 19*d*2 in particular. In this respect, as described above, of the outer peripheral side portions of the opposite plate surface 19*c* of the light guide plate 19, all of the areas of the portions along the no-light entry end surfaces 19*d* (the no-light-entry, opposite end surface-side inclined plate surface 28a, and the pair of no-light entry side, end surface-side inclined plate surfaces 28b) constitute the inclined plate surface 28. Accordingly, the number of times of retroreflection of the retroreflected light transmitted through the vicinity of the no-light entry end surfaces 19d (the no-light entry opposite end surface 19d1 and the pair of no-light entry side end surfaces 19d2) of the outer peripheral side portions of the light guide plate 19, i.e., the number of times of passage through the wavelength conversion sheet 20, can be increased. In this way, even if the light emitted from the no-light entry end surfaces 19d is externally leaked via a gap between the buffer material 26 and the light guide plate 19, for example, the color tint difference is made difficult to occur between the output light on the outer peripheral sides of the backlight unit 12 and the output light on the center thereof. Accordingly, the occurrence of color irregularity can be more preferably suppressed. In FIG. 7 and FIG. 8, the outer shapes of the LEDs 17 and the LED substrate 18 are indicated by dashed-and-double-dotted lines.

Of the light guide plate 19, as illustrated in FIG. 4 and FIG. 5, the parallel plate surface 27 is a flat surface extending in parallel with the light output plate surface 19a along the X-axis direction and the Y-axis direction. On the other hand, the inclined plate surface 28 is a linearly inclined surface inclined with respect to the light output plate surface 19a and the parallel plate surface 27. Accordingly, the portion of the light guide plate 19 in which the parallel plate surface 27 is formed (a parallel plate surface formed portion) has a substantially constant thickness (the distance between the opposite plate surface 19c and the light output plate surface 19a) in all of the areas. On the other hand, the portion of the light guide plate 19 in which the inclined plate surface 28 is formed (an inclined plate surface formed portion) becomes thicker toward the parallel plate surface 27 (the center), the maximum value of the thickness becoming closer to the thickness of the parallel plate surface formed portion. The inclined plate surface formed portion becomes thinner toward the outer peripheral end surface (the outer side), the minimum value of the thickness being approximately less than half the thickness of the parallel plate surface formed portion, for example. That is, the inclined plate surface 28 is inclined such that the distance between the opposite plate surface 19c and the light output plate surface 19a becomes continuously gradually smaller from the center to the end side in the plane of the light guide plate 19. In this configuration, compared with if the inclined plate surface is a curved surface, the opposite plate surface 19c of the light guide plate 19 can be provided with the inclined plate surface 28 with higher dimensional accuracy. In addition, the inclined plate surface 28 has a substantially constant inclination angle with respect to the light output plate surface 19a in all of the areas of the portions along the no-light entry end surfaces 19d of the outer peripheral side portions of the light guide plate 19. The inclined plate surface 28 is disposed such that the inner-end position thereof, i.e., the position of boundary with the parallel plate surface 27, is on the inner side (on the center) than the inner-end position of the flange portion 16a of the frame 16, i.e., than the outer peripheral end position of the display region of the liquid crystal panel 11. In this way, the light reflected by the inclined reflection portion 30 along the inclined plate surface 28 can be efficiently supplied to the display region of the liquid crystal panel 11. The parallel reflection portion 29 and the inclined reflection portion 30 of the reflection sheet 25 are configured similarly to the parallel plate surface 27 and the inclined plate surface 28.

Of the reflection sheet 25, as illustrated in FIG. 4 and FIG. 5, the inclined reflection portion 30 is bonded to the inclined plate surface 28 of the light guide plate 19 via the adhesive layer 31. The adhesive layer 31 is made from a substantially transparent material, of which the examples include: a transparent optically adhesive film of OCA; a transparent adhesive; a transparent photocurable resin (including a transparent UV curable resin and the like); and a transparent double-sided tape. In this configuration, the adhesive layer 31 enables the inclined reflection portion 30 to be maintained in a stable positional relationship with the inclined plate surface 28 of the light guide plate 19. Accordingly, the light from the opposite plate surface 19c side of the light guide plate 19 can be reflected with high efficiency by the inclined reflection portion 30.

The operation of the present embodiment with the above-described structure will be described. When the power supply to the liquid crystal display device 10 configured as described above is turned on, the driving of the liquid crystal panel 11 is controlled by a panel control circuit on a control substrate not illustrated. When the drive electric power from an LED drive circuit on a LED drive circuit substrate not illustrated is supplied to the LEDs 17 on the LED substrate 18, the driving of the LEDs 17 is controlled. The light from the LEDs 17 is guided by the light guide plate 19 and directed to the liquid crystal panel 11 via the optical members 15, whereby a predetermined image is displayed on the liquid crystal panel 11. In the following, the operation of the backlight unit 12 will be described in detail.

Referring to FIG. 4, when the LEDs 17 are turned on, the light emitted from the LEDs 17 enters the light entry end surface 19b of the light guide plate 19. While a predetermined space is provided between the LEDs 17 and the light entry end surface 19b, the space is sandwiched between the frame-side reflection sheet 24 on the front side and the extension portion of the reflection sheet 25 on the back side. Accordingly, the light from the LEDs 17 is repeatedly reflected by the opposing portions of the reflection sheets 24, 25, whereby the light is caused to efficiently enter the light entry end surface 19b. The light that has entered the light entry end surface 19b is scattered and reflected by the light reflection portion of the light reflection pattern and propagates in the light guide plate 19 while being totally reflected at the interface between the light guide plate 19 and the external air layer or reflected by the reflection sheet 25. Thereby, the angle of incidence of the light with respect to the light output plate surface 19a becomes less than a critical angle, whereby the emission from the light output plate surface 19a is promoted. The light that has been emitted from the light output plate surface 19a of the light guide plate 19 is provided to the liquid crystal panel 11 after being subjected to the respective optical actions of the optical members 15 as the light passes therethrough. Some of the emitted light is retroreflected by the optical members 15 and thereby returned into the light guide plate 19. The returned light thereafter exits the light output plate surface 19a and the like as retroreflected light, and constitutes the output light of the backlight unit 12.

The optical action of the optical members 15 will be described in detail. Referring to FIG. 4, the blue light that has been emitted from the light output plate surface 19a of the light guide plate 19 is wavelength-converted into green light and red light (secondary light) by the green phosphor and red phosphor contained in the wavelength conversion sheet 20 disposed at an interval on the front side with respect to the light output plate surface 19a. The wavelength-converted green light and red light, i.e., yellow light (secondary light) and the blue light of the LEDs 17 (primary light) produce approximately white illumination light. The blue light of the LEDs 17 (primary light) and the wavelength-converted green light and red light (secondary light) are subjected to a light condensing action (isotropic light condensing action) by the microlens sheet 21 isotropically with respect to the X-axis direction and the Y-axis direction, and then subjected to a light condensing action by the prism sheet 22 selectively with respect to the Y-axis direction (anisotropic light condensing action). Thereafter, of the light that has exited the prism sheet 22, specific polarization light (p wave) is selectively transmitted by the reflection type polarizing sheet 23 and emitted toward the liquid crystal panel 11, while different specific polarization light (s wave) is selectively reflected toward the back side. The s wave reflected by the reflection type polarizing sheet 23 and the light that is reflected to the back side without being subjected to the light condensing action by prism sheet 22 and the microlens sheet 21, for example, are returned into the light guide plate 19 and again reflected by the reflection sheet 25, for example, during the process of propagating in the light guide plate 19, and are again emitted toward the front side via the light output plate surface 19a and the like.

Referring to FIG. 4 and FIG. 5, the light propagating in the light guide plate 19 includes the retroreflected light that has been emitted from the light output plate surface 19a and then returned into the light guide plate 19. The retroreflected light tends to have a smaller number of times of retroreflection, i.e., a smaller number of times of passage through the wavelength conversion sheet 20, on the outer peripheral sides of the light guide plate 19 than in the center thereof. As a result, the retroreflected light emitted from the outer peripheral sides of the light guide plate 19 (including the outer peripheral end surfaces) has a blue tint closer to the color tint of the blue light (primary light) of the LEDs 17, compared with the retroreflected light emitted from the center of the light guide plate 19. Furthermore, the blue light (primary light) emitted from the LEDs 17 and propagating in the light guide plate 19 is not necessarily entirely emitted from the light output plate surface 19a, and some of the light may be emitted as is from, of the outer peripheral end surfaces of the light guide plate 19, the no-light entry end surface 19d. In this respect, in the backlight unit 12 according to the present embodiment, of the light guide plate 19, at least the central portion of the opposite plate surface 19c constitutes the parallel plate surface 27 which is parallel with the light output plate surface 19a, and at least a part of the outer peripheral side portions of the opposite plate surface 19c constitutes the inclined plate surface 28 which is inclined with respect to the light output plate surface 19a so as to become closer to the light output plate surface 19a with decreasing distance from the outer peripheral end surface. In addition, the reflection sheet 25 includes the parallel reflection portion 29 disposed along the parallel plate surface 27 of the light guide plate 19, and the inclined reflection portion 30 disposed along the inclined plate surface 28 of the light guide plate 19. Accordingly, the optical path length of the light that is present in the portion, among the outer peripheral side portions of the light guide plate 19, in which the inclined plate surface 28 is provided on the opposite plate surface 19c, as the light travels from the inclined plate surface 28 of the opposite plate surface 19c to the light output plate surface 19a, is shorter than the optical path length of the light present in the central portion as the light travels from the parallel plate surface 27 of the opposite plate surface 19c to the light output plate surface 19a. As a result, the number of times of repeated total reflection of the light between the opposite plate surface 19c and the light output plate surface 19a is increased, and the probability of the light being scattered and reflected by the light reflection pattern disposed on the opposite plate surface 19c becomes higher. Then, the light that is present in the portion, among the outer peripheral side portions of the light guide plate 19, in which the inclined plate surface 28 is provided on the opposite plate surface 19c (including the light scattered and reflected by the light reflection pattern) is reflected by the inclined reflection portion 30 of the reflection sheet 25 disposed along the inclined plate surface 28, and is caused to rise toward the front side. That is, in the portion, among the outer peripheral side portions of the light guide plate 19, in which the inclined plate surface 28 is provided on the opposite plate surface 19c, the light that is present therein is more easily scattered and reflected by the light reflection pattern, and, by being reflected by the inclined reflection portion 30, the output of the light from the light output plate surface 19a is promoted. Accordingly, the reflected light due to the inclined reflection portion 30, compared with the reflected light due to the parallel reflection portion 29 disposed along the parallel plate surface 27, has a relatively greater number of times of retroreflection, i.e., a greater number of times of passage through the wavelength conversion sheet 20. In this way, the wavelength conversion of the blue light (primary light) is promoted, and the proportion of green light and red light (secondary light) included in the output light becomes higher, and it is made difficult for the output light on the outer peripheral sides of the backlight unit 12 to have a blue color tint. In this way, the difference in color tint of the output light is made difficult to occur between the center and the outer peripheral sides of the backlight unit 12, making color irregularity difficult to occur in the output light.

Further, the inclinedplate surface 28, as illustrated in FIG. 7, is provided in all of the areas of the outer peripheral side portions of the opposite plate surface 19c of the light guide plate 19 except for the portion along the light entry end surface 19b, i.e., all of the areas of the portions along the no-light entry end surfaces 19d (the portions along the no-light entry opposite end surface 19d1 and the pair of no-light entry side end surfaces 19d2), and includes the no-light-entry, opposite end surface-side inclined plate surface 28a and the pair of no-light entry side, end surface-side inclined plate surfaces 28b. Accordingly, the number of times of retroreflection of the retroreflected light transmitted through the vicinity of the no-light entry end surfaces 19d (the no-light entry opposite end surface 19d1 and the pair of no-light entry side end surfaces 19d2) of the outer peripheral side portions of the light guide plate 19, i.e., the number of times of passage through the wavelength conversion sheet 20, can be increased. In this way, even if the blue color tinted light emitted from the no-light entry end surfaces 19d is externally leaked via a gap between the buffer material 26 and the light guide plate 19, for example, the color tint difference is made difficult to occur between the output light on the outer peripheral sides of the backlight unit 12 and the output light in the center thereof, and the occurrence of color irregularity can be more preferably suppressed.

As described above, the backlight unit (lighting device) 12 according to the present embodiment includes: the LEDs (light source) 17; the light guide plate 19 including the light entry end surface 19b which is at least a part of the outer peripheral end surfaces and which the light from the LEDs 17 enters, the light output plate surface 19a which is one of the pair of plate surfaces and from which the light exits, and the opposite plate surface 19c of the pair of plate surfaces which is on the opposite side from the light output plate surface 19a, in which of the opposite plate surface 19c, at least the central portion is the parallel plate surface 27 parallel with the light output plate surface 19a, and at least a part of the outer peripheral side portions constitutes the inclined plate surface 28 which is inclined with respect to the light output plate surface 19a so as to become closer to the light output plate surface 19a with decreasing distance from the outer peripheral end surface; the wavelength conversion sheet (wavelength conversion member) 20 which overlaps the light output plate surface 19a of the light guide plate 19 and which contains the phosphor that wavelength-converts the light from the LEDs 17; and the reflection sheet (reflection member) 25 which overlaps the opposite plate surface 19c of the light guide plate 19 and which reflects light, the reflection sheet 25 including the parallel reflection portion 29 disposed along the parallel plate surface 27, and the inclined reflection portion 30 disposed along the inclined plate surface 28.

In this way, the light emitted from the LEDs 17 enters the light entry end surface 19b of the outer peripheral end surfaces of the light guide plate 19, is reflected, for example, by the reflection sheet 25, propagates in the light guide plate 19, and is then emitted from the light output plate surface 19a. The light emitted from the light output plate surface 19a is wavelength-converted by the phosphor contained in the wavelength conversion sheet 20 overlapping the light output plate surface 19a. In this case, the light emitted from the light output plate surface 19a of the light guide plate 19 is not necessarily entirely wavelength-converted by the wavelength conversion sheet 20 and utilized as is as the output light of the backlight unit 12. Some of the light may be retroreflected and returned toward the light guide plate 19 side, for example, and then utilized as the output light of the backlight unit 12. The retroreflected light tends to have a smaller number of times of retroreflection on the outer peripheral side of the backlight unit 12 than in the center thereof, so that the number of times of passage through the wavelength conversion sheet 20 is decreased, and the probability of being wavelength-converted becomes lower. In addition, the light propagating in the light guide plate 19 is not necessarily entirely emitted from the light output plate surface 19a. Some of the light may be emitted from the outer peripheral end surfaces of the light guide plate 19.

In this respect, the light guide plate 19 is configured such that at least the central portion of the opposite plate surface 19c is the parallel plate surface 27 parallel with the light output plate surface 19a, and at least a part of the outer peripheral side portions constitutes the inclined plate surface 28 which is inclined with respect to the light output plate surface 19a so as to become closer to the light output plate surface 19a with decreasing distance from the outer peripheral end surface. Accordingly, the optical path length of the light that is present in the outer peripheral side portions of the light guide plate 19 as the light travels from the opposite plate surface 19c to the light output plate surface 19a becomes shorter than the optical path length of the light present in the central portion as the light travels from the opposite plate surface 19c to the light output plate surface 19a. The reflection sheet 25 includes the parallel reflection portion 29 disposed along the parallel plate surface 27, and the inclined reflection portion 30 disposed along the inclined plate surface 28. Accordingly, of the light that is present in at least a part of the outer peripheral side portions of the light guide plate 19, the light with a relatively short optical path length is reflected by the inclined reflection portion 30, whereby the number of times of retroreflection of the retroreflected light transmitted through at least a part of the outer peripheral side portions of the light guide plate 19, i.e., the number of times of passage through the wavelength conversion sheet 20, can be increased. In this way, the retroreflected light transmitted through at least a part of the outer peripheral side portions of the light guide plate 19 is sufficiently wavelength-converted by the wavelength conversion sheet 20. In this way, the color irregularity is made difficult to occur in the output light of the backlight unit 12.

In addition, the light guide plate 19 is configured such that, of the outer peripheral end surfaces, the end surfaces adjacent to the light entry end surface 19b are the no-light entry side end surfaces 19d2 that the light from the LEDs 17 does not directly enter. Of the outer peripheral side portions of the opposite plate surface 19c, at least the portions along the no-light entry side end surfaces 19d2 constitute the inclined plate surface 28. The light propagating in the light guide plate 19 after being emitted from the LEDs 17 and entering the light entry end surface 19b of the light guide plate 19 is particularly easily emitted from, among the outer peripheral end surfaces of the light guide plate 19, the no-light entry side end surfaces 19d2 adjacent to the light entry end surface 19b, easily resulting in the color tint difference between the output light on the outer peripheral sides of the backlight unit 12 and the output light in the center thereof. In this respect, in the light guide plate 19, among the outer peripheral side portions of the opposite plate surface 19c, at least the portions along the no-light entry side end surfaces 19d2 constitute the inclined plate surface 28. Accordingly, the number of times of retroreflection of the retroreflected light transmitted through the vicinity of, among the outer peripheral side portions of the light guide plate 19, the no-light entry side end surfaces 19d2, i.e., the number of times of passage through the wavelength conversion sheet 20, can be increased. In this way, the color tint difference is made difficult to occur between the output light on the outer peripheral sides of the backlight unit 12 and the output light in the center thereof, and the occurrence of color irregularity can be more preferably suppressed.

Further, in the light guide plate 19, among the outer peripheral end surfaces, the end surface on the opposite side from the light entry end surface 19b is the no-light entry opposite end surface 19d1 that the light from the LEDs 17 does not directly enter. Among the outer peripheral side portions of the opposite plate surface 19c, at least the portion along the no-light entry opposite end surface 19d1 constitutes the inclined plate surface 28. The light propagating in the light guide plate 19 after being emitted from the LEDs 17 and entering the light entry end surface 19b of the light guide plate 19 is easily emitted, among the outer peripheral end surfaces of the light guide plate 19, the no-light entry opposite end surface 19d1 on the opposite side from the light entry end surface 19b, easily resulting in the color tint difference between the output light on the outer peripheral sides of the backlight unit 12 and the output light in the center thereof. In this respect, in the light guide plate 19, among the outer peripheral side portions of the opposite plate surface 19c, at least the portion along the no-light entry opposite end surface 19d1 constitutes the inclined plate surface 28. Accordingly, the number of times of retroreflection of the retroreflected light transmitted through, among the outer peripheral side portions of the light guide plate 19, the vicinity of the no-light entry opposite end surface 19d1, i.e., the number of times of passage through the wavelength conversion sheet 20, can be increased. In this way, the color tint difference is made difficult to occur between the output light on the outer peripheral sides of the backlight unit 12 and the output light in the center thereof, and the occurrence of color irregularity can be preferably suppressed.

In addition, in the light guide plate 19, among the outer peripheral end surfaces, the end surfaces except for the light entry end surface 19b constitute the no-light entry end surfaces 19d that the light from the LEDs 17 does not directly enter, and, among the outer peripheral side portions of the opposite plate surface 19c, all of the areas of the portions along at least the no-light entry end surfaces 19d constitutes the inclined plate surface 28. The light propagating in the light guide plate 19 after being emitted from the LEDs 17 and entering the light entry end surface 19b of the light guide plate 19 is easily emitted from, among the outer peripheral end surfaces of the light guide plate 19, the no-light entry end surfaces 19d except for the light entry end surface 19b, easily resulting in the color tint difference between the output light on the outer peripheral sides of the backlight unit 12 and the output light in the center thereof. In this respect, in the light guide plate 19, all of the areas of the portions, among the outer peripheral side portions of the opposite plate surface 19c, along at least the no-light entry end surfaces 19d constitutes the inclined plate surface 28. Accordingly, the number of times of retroreflection of the retroreflected light transmitted through the vicinity of, among the outer peripheral side portions of the light guide plate 19, the no-light entry end surface 19d, i.e., the number of times of passage through the wavelength conversion sheet 20, can be increased. In this way, the color tint difference is made difficult to occur between the output light on the outer peripheral sides of the backlight unit 12 and the output light in the center thereof, and the occurrence of color irregularity can be more preferably suppressed.

In addition, in the light guide plate 19, the inclined plate surface 28 is configured as a linearly inclined surface. In this way, the inclined plate surface 28 can be provided in the opposite plate surface 19c of the light guide plate 19 with higher dimensional accuracy.

In addition, in the reflection sheet 25, the inclined reflection portion 30 is bonded to the inclined plate surface 28 of the light guide plate 19 via the adhesive layer 31. In this way, the inclined reflection portion 30 is maintained in a stable positional relationship with respect to the inclined plate surface 28 of the light guide plate 19 by the adhesive layer 31. Accordingly, the light from the opposite plate surface 19c of the light guide plate 19 can be reflected with high efficiency by the inclined reflection portion 30.

As the phosphor, the wavelength conversion sheet 20 contains the quantum dot phosphor. In this way, the light wavelength conversion efficiency of the wavelength conversion sheet 20 is increased, and the chromatic purity of the wavelength-converted light is increased.

The liquid crystal display device 10 according to the present embodiment includes the above-described backlight unit 12, and the liquid crystal panel (display panel) 11 that displays an image by utilizing the light emitted from the backlight unit 12. With the liquid crystal display device 10 of the configuration, because the occurrence of color irregularity in the output light of the backlight unit 12 is suppressed, a display with excellent display quality can be achieved.

The television device 10TV according to the present embodiment includes the liquid crystal display device 10 as described above. With the television device 10TV, because the liquid crystal display device 10 has excellent display quality, a display of a television image with excellent display quality can be achieved.

Second Embodiment

A second embodiment of the present invention will be described with reference to FIG. 9. In the second embodiment, an inclined plate surface 128 and an inclined reflection portion 130 with modified configurations will be described. Redundant descriptions of the structures, operations, and effects similar to those of the first embodiment will be omitted.

Figure 9:
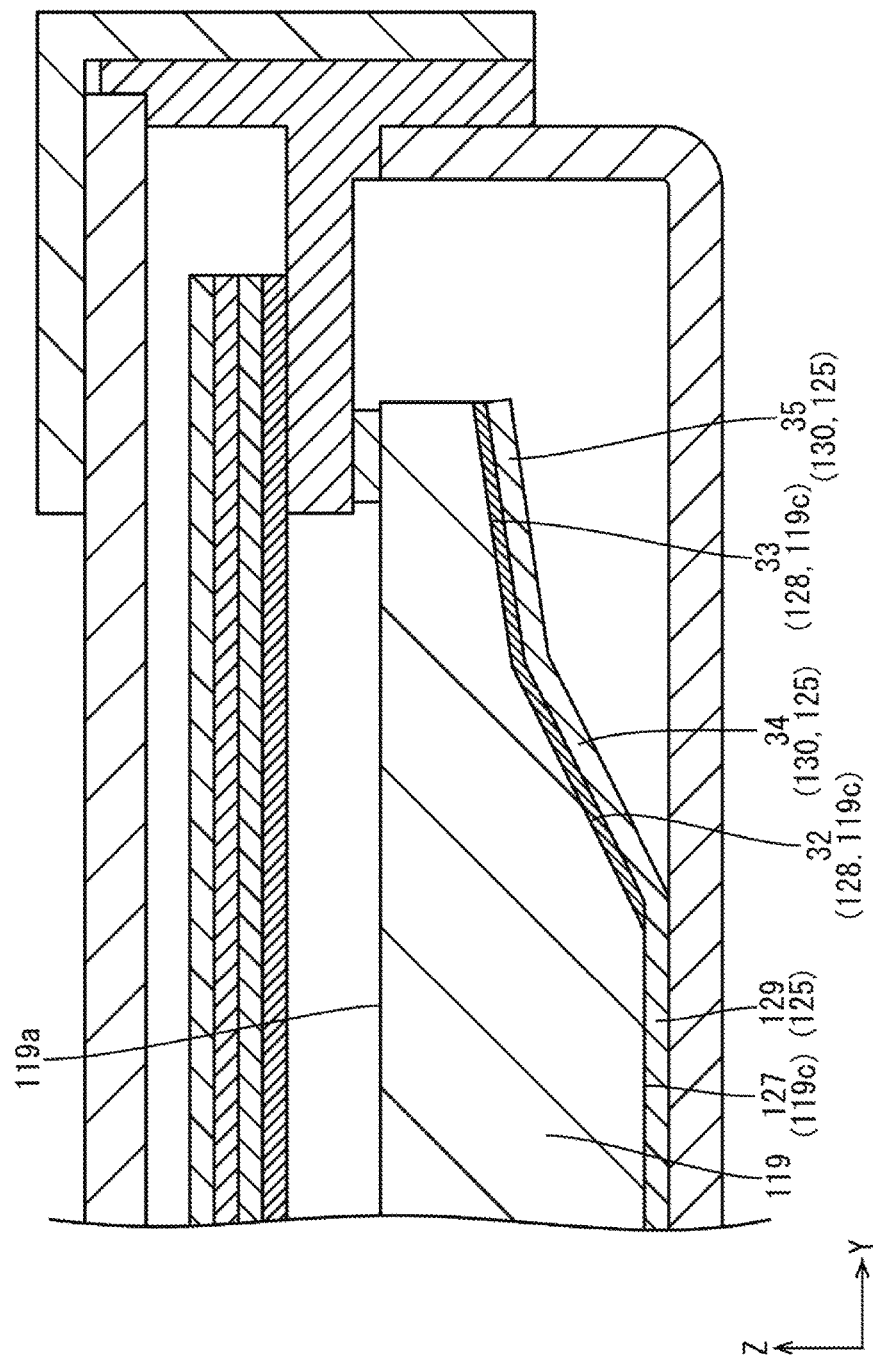
FIG. 9 is an enlarged cross sectional view of an end portion of a liquid crystal display device according to a second embodiment of the present invention.

The inclined plate surface 128 according to the present embodiment, as illustrated in FIG. 9, is configured such that the inclination angle of a light guide plate 119 with respect to a light output plate surface 119a is varied at an intermediate position between a parallel plate surface 127 and the outer peripheral end surface. In this configuration, the optical path length in the portion, among the outer peripheral side portions of the light guide plate 119, in which the inclined plate surface 128 is provided in the opposite plate surface 119c (the inclined plate surface formed portion), i.e., the number of times of retroreflection of light, can be easily controlled in the plane of the inclined plate surface 128, whereby the color irregularity can be suppressed more preferably.

Specifically, the inclined plate surface 128 includes a parallel plate surface-side inclined plate surface (central inclined plate surface) 32 disposed on the parallel plate surface 127 side (on the central side of the light guide plate 119), and an outer peripheral end surface-side inclined plate surface 33 disposed on the outer peripheral end surface side of the light guide plate 119. The parallel plate surface-side inclined plate surface 32 has a relatively large inclination angle with respect to the light output plate surface 119a than the outer peripheral end surface-side inclined plate surface 33. That is, the inclination angle of the inclined plate surface 128 with respect to the light output plate surface 119a is varied in two steps such that the parallel plate surface-side inclined plate surface 32, disposed relatively closer to the central portion of the opposite plate surface 119c, has a relative greater inclination angle, while the outer peripheral end surface-side inclined plate surface 33, disposed relatively farther from the central portion of the opposite plate surface 119c, has a relatively small inclination angle. In addition, the parallel plate surface-side inclined plate surface 32 and the outer peripheral end surface-side inclined plate surface 33 have substantially equal distances (a surface-extension distance; a width size) from the respective inner-end positions (rising proximal end position) to external end positions (rising distal end position), with the position of boundary between the parallel plate surface-side inclined plate surface 32 and the outer peripheral end surface-side inclined plate surface 33 being substantially aligned with the center position of the inclined plate surface 128.

On the other hand, the inclined reflection portion 130 of the reflection sheet 125 is configured of a parallel reflection portion-side inclined reflection portion (central inclined reflection portion) 34 disposed along the parallel plate surface-side inclined plate surface 32, and an outer peripheral end surface-side inclined reflection portion 35 disposed along the outer peripheral end surface-side inclined plate surface 33. That is, the inclination angle of the inclined reflection portion 130 with respect to the light output plate surface 119a is varied in two steps. The parallel reflection portion-side inclined reflection portion 34 disposed relatively closer to the parallel reflection portion 129 (central portion of the opposite plate surface 119c) has a relatively large inclination angle, while the outer peripheral end surface-side inclined reflection portion 35 disposed relatively farther from the parallel reflection portion 129 has a relatively small inclination angle. The detailed configurations of the parallel reflection portion-side inclined reflection portion 34 and the outer peripheral end surface-side inclined reflection portion 35 other than the above are similar to those of the parallel plate surface-side inclined plate surface 32 and the outer peripheral end surface-side inclined plate surface 33.

The inclination angle of the inclined plate surface 128 with respect to the light output plate surface 119a has a proportional correlation with the rate of change in distance (thickness) between the opposite plate surface 119c and the light output plate surface 119a of the light guide plate 119. That is, there is the tendency such that the greater the inclination angle becomes, the greater the rate of change in distance becomes; conversely, the smaller the angle becomes, the smaller the rate of change in distance becomes. Accordingly, the difference in the above-mentioned distance between the inner-end position (the position of boundary with the parallel plate surface 127) and the external end position (the position of boundary with the outer peripheral end surface-side inclined plate surface 33; the end position on the outer peripheral end surface-side inclined plate surface 33 side) of the parallel plate surface-side inclined plate surface 32 is relatively greater than the above-mentioned difference in the distance between the inner-end position (the position of boundary with the parallel plate surface-side inclined plate surface 32; the end position on the parallel plate surface-side inclined plate surface 32 side) and the external end position (the position of the outer peripheral end surface of the light guide plate 119) of the outer peripheral end surface-side inclined plate surface 33. Thus, compared with if the magnitude relationship of the inclination angle of the parallel plate surface-side inclined plate surface and the outer peripheral end surface-side inclined plate surface is reversed from the above, the distance at the inner-end position of the outer peripheral end surface-side inclined plate surface 33, i.e., the optical path length of the light that is present in the light guide plate 119, becomes relatively shorter. In this way, the number of times of retroreflection of the light in the portion, among the outer peripheral side portions of the light guide plate 119, in which the outer peripheral end surface-side inclined plate surface 33 is provided can be increased, whereby the color irregularity can be suppressed in a more preferable manner.

As described above, according to the present embodiment, the light guide plate 119 is configured such that the inclined plate surface 128 has an inclination angle variation at the intermediate position between the parallel plate surface 127 and the outer peripheral end surface with respect to the light output plate surface 119a. In this way, the optical path length in the portion, among the outer peripheral side portions of the light guide plate 119, in which the inclined plate surface 128 is provided in the opposite plate surface 119c, i.e., the number of times of retroreflection of light, can be easily controlled in the plane of the inclined plate surface 128, whereby the color irregularity can be suppressed more preferably.

In addition, the light guide plate 119 is configured such that the inclined plate surface 128 includes at least the parallel plate surface-side inclined plate surface 32 disposed on the parallel plate surface 127 side and having a relatively large inclination angle, and the outer peripheral end surface-side inclined plate surface 33 disposed on the outer peripheral end surface side and having a relatively small inclination angle. In this way, compared with if the magnitude relationship of the inclination angle between the parallel plate surface-side inclined plate surface and the outer peripheral end surface-side inclined plate surface is reversed from the above, the inclination angle of the parallel plate surface-side inclined plate surface 32 is relatively large, so that the optical path length at the end position of the outer peripheral end surface-side inclined plate surface 33 on the parallel plate surface-side inclined plate surface 32 side becomes relatively short. In this way, the number of times of retroreflection of light in the portion, among the outer peripheral side portions of the light guide plate 119, in which the outer peripheral end surface-side inclined plate surface 33 is provided can be increased, whereby the color irregularity can be suppressed in a more preferable manner.

Third Embodiment

A third embodiment of the present invention will be described with reference to FIG. 10 to FIG. 12. Third embodiment describes a modification of the first embodiment in the area in which an inclined plate surface 228 and an inclined reflection portion 230 are formed. Redundant descriptions of the structures, operations, and effects similar to those of the first embodiment will be omitted.

Figure 10:
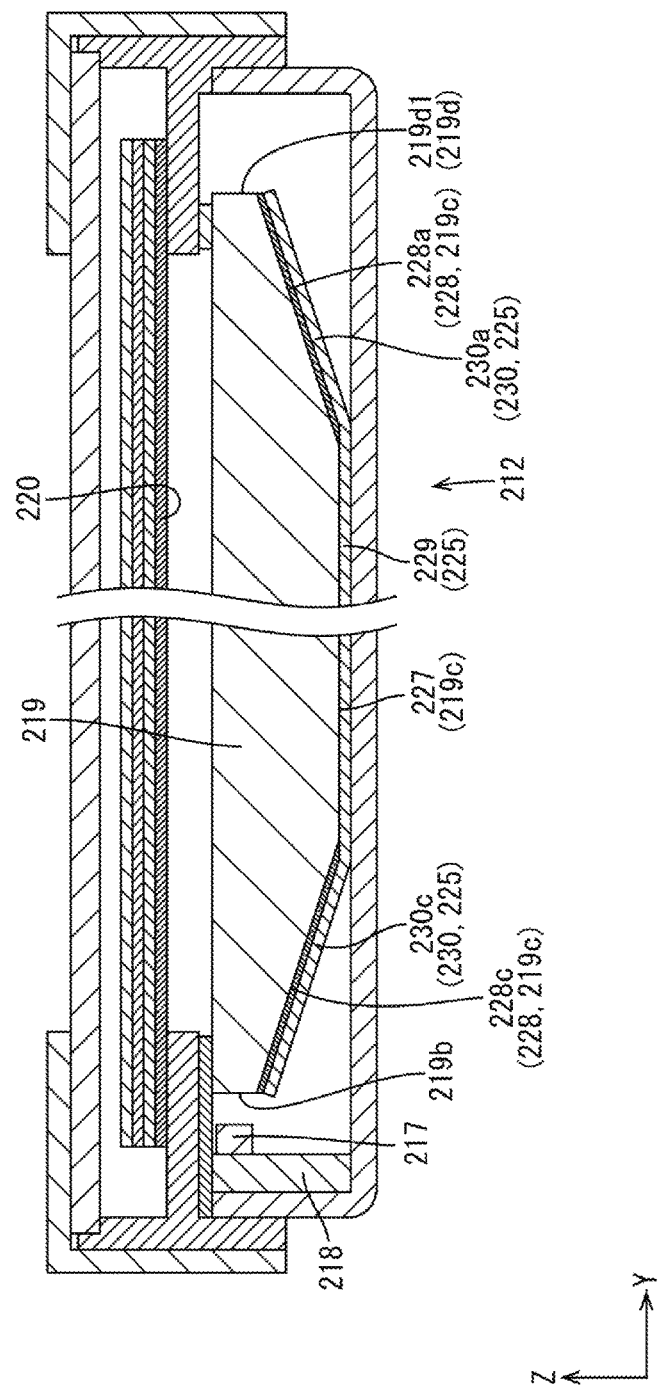
FIG. 10 is a cross sectional view of a liquid crystal display device according to a third embodiment of the present invention.
Figure 11:
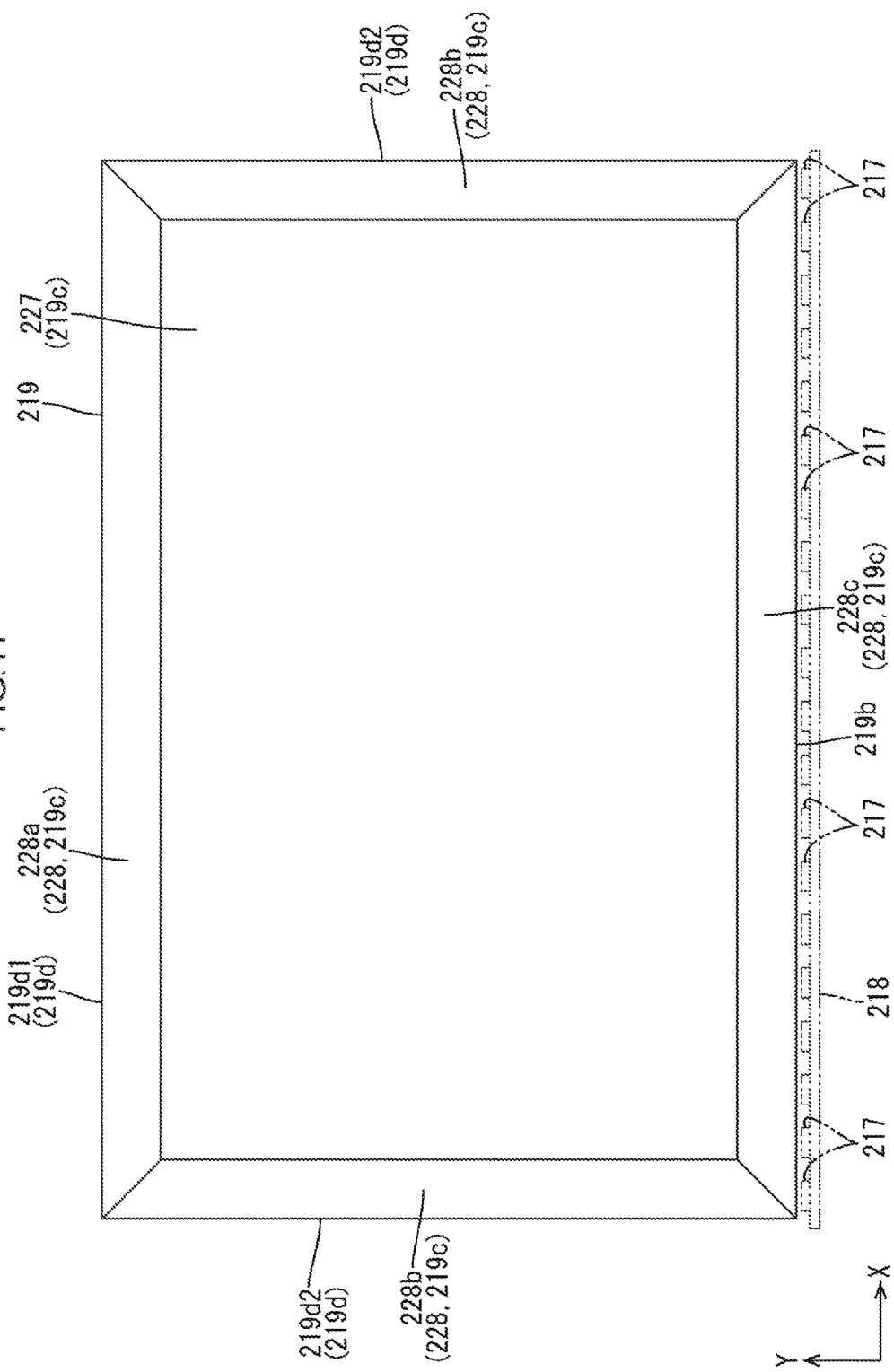
FIG. 11 is a bottom view of the light guide plate.

According to the present embodiment, the inclined plate surface 228, as illustrated in FIG. 10 and FIG. 11, is provided in all of the areas of the outer peripheral side portions of the opposite plate surface 219c of the light guide plate 219. That is, the inclined plate surface 228 is provided in, of the outer peripheral side portions of the opposite plate surface 219c of the light guide plate 219, the portion along a light entry end surface 219b, in addition to all of the areas of the portions along a no-light entry end surface 219d. More specifically, the inclined plate surface 228 is configured of, of the outer peripheral side portions of the opposite plate surface 219c of the light guide plate 219: a no-light-entry, opposite end surface-side inclined plate surface (the upper long-side portion in FIG. 11) 228a along a no-light entry opposite end surface 219d1; no-light entry side, end surface-side inclined plate surfaces (a pair of right and left short-side portions in FIG. 11) 228b along a pair of no-light entry side end surfaces 219d2; and a light entry end surface-side inclined plate surface (the lower long-side portion in FIG. 11) 228c along the light entry end surface 219b. In addition, a parallel plate surface 227 is configured of the central portion of the opposite plate surface 219c of the light guide plate 219. As the light entry end surface-side inclined plate surface 228c is provided on the opposite plate surface 219c of the light guide plate 219, as illustrated in FIG. 10, the center position of the light entry end surface 219b of the light guide plate 219 with respect to the height direction (the Z-axis direction) is displaced toward the front side (the side closer to a wavelength conversion sheet 220) with respect to the center position in the thickness direction (the Z-axis direction) of the central portion of the light guide plate 219. Accordingly, LEDs 217 are displaced toward the front side from the center position in the width direction (the Z-axis direction) of an LED substrate 218, so that the center position in the height direction (the Z-axis direction) of the LEDs 217 is in a positional relationship of being substantially aligned with the center position of the light entry end surface 219b with respect to the height direction. In addition, the LEDs 217 have a height size which is approximately the same as the height size of the light entry end surface 219b. In FIG. 11, the outer shapes of the LEDs 217 and the LED substrate 218 are indicated by dashed-and-double-dotted lines.

Figure 12:
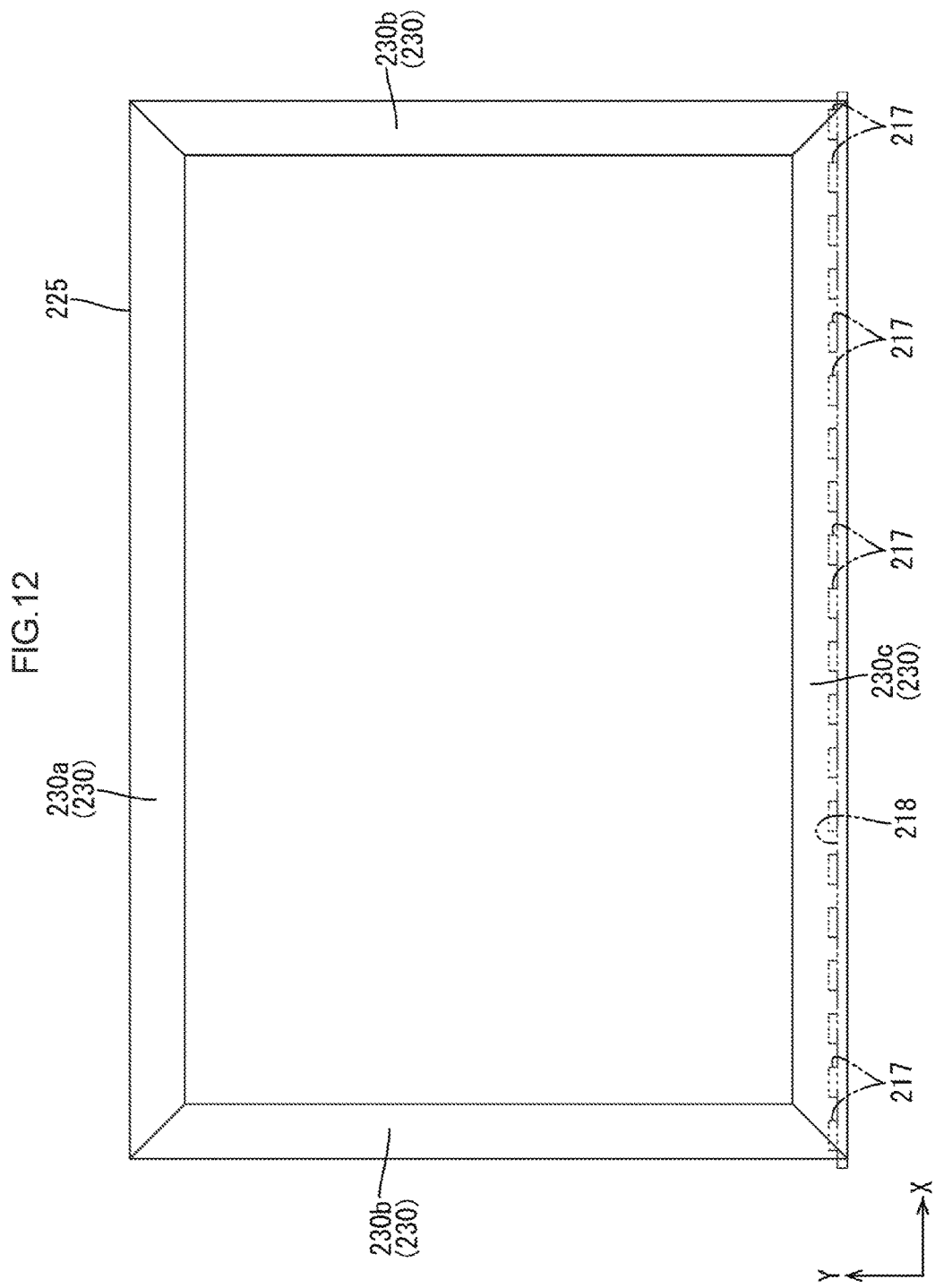
FIG. 12 is a plan view of the reflection sheet.

On the other hand, the inclined reflection portion 230, as illustrated in FIG. 10 and FIG. 12, is provided in, of the outer peripheral side portions of a reflection sheet 225, the portion along the light entry end surface 219b, in addition to all of the areas of the portions along the no-light entry end surface 219d. That is, the inclined reflection portion 230 includes, of the outer peripheral side portions of the reflection sheet 225: a no-light entry opposite end surface-side inclined reflection portion (the upper long-side portion in FIG. 12) 230a along a no-light entry opposite end surface 219d1; no-light entry-side, end surface-side inclined reflection portions (a pair of right and left long-side portion in FIG. 12) 230b along a pair of no-light entry side end surfaces 219d2; and a light entry end surface-side inclined reflection portion (the lower long-side portion in FIG. 12) 230c along the light entry end surface 219b. A parallel reflection portion 229 is configured of the central portion of the reflection sheet 225. In FIG. 12, the outer shapes of the LEDs 217 and the LED substrate 218 are indicated by dashed-and-double-dotted lines.

Thus, because all of the areas of the outer peripheral side portions of the opposite plate surface 219c of the light guide plate 219 constitute the inclined plate surface 228, the number of times of retroreflection of the retroreflected light transmitted through the outer peripheral side portions of the light guide plate 219, i.e., the number of times of passage through the wavelength conversion sheet 220, can be increased. In particular, the number of times of retroreflection of the retroreflected light transmitted through the vicinity of the light entry end surface 219b of the outer peripheral side portions of the light guide plate 219, i.e., the number of times of passage through the wavelength conversion sheet 220, can be increased. Accordingly, even if the blue light is emitted from the light entry end surface 219b as is in the process of propagation in the light guide plate 219, the color tint difference is made difficult to occur between the output light on the outer peripheral sides of the backlight unit 212 and the output light in the center thereof, whereby the occurrence of color irregularity can be more preferably suppressed.

As described above, according to the present embodiment, in the light guide plate 219, of the outer peripheral side portions of the opposite plate surface 219c, at least the portion along the light entry end surface 219b constitutes the inclined plate surface 228. The light that propagates in the light guide plate 219 after being emitted from the LEDs 217 and entering the light entry end surface 219b of the light guide plate 219 is easily emitted from, among the outer peripheral end surfaces of the light guide plate 219, the light entry end surface 219b, easily resulting in the color tint difference between the output light on the outer peripheral sides of the backlight unit 212 and the output light in the center thereof. In this respect, in the light guide plate 219, among the outer peripheral side portions of the opposite plate surface 219c, at least the portion along the light entry end surface 219b constitutes the inclined plate surface 228. Accordingly, the number of times of retroreflection of the retroreflected light transmitted through the vicinity of the light entry end surface 219b of the outer peripheral side portions of the light guide plate 219, i.e., the number of times of passage through the wavelength conversion sheet 220, can be increased. In this way, the color tint difference is made difficult to occur between the output light on the outer peripheral sides of the backlight unit 212 and the output light in the center thereof, whereby the occurrence of color irregularity can be more preferably suppressed.

In addition, in the light guide plate 219, all of the areas of the outer peripheral side portions of the opposite plate surface 219c constitute the inclined plate surface 228. The light emitted from the LEDs 217 after entering the light entry end surface 219b of the light guide plate 219 and propagating in the light guide plate 219 is easily emitted from the outer peripheral end surfaces of the light guide plate 219, easily resulting in the color tint difference between the output light on the outer peripheral sides of the backlight unit 212 and the output light in the center thereof. In this respect, in the light guide plate 219, all of the areas of the outer peripheral side portions of the opposite plate surface 219c constitute the inclined plate surface 228. Accordingly, the number of times of retroreflection of the retroreflected light transmitted through the outer peripheral side portions of the light guide plate 219, i.e., the number of times of passage through the wavelength conversion sheet 220, can be increased. In this way, the color tint difference is made difficult to occur between the output light on the outer peripheral sides of the backlight unit 212 and the output light in the center thereof, whereby the occurrence of color irregularity can be more preferably suppressed.

Fourth Embodiment

A fourth embodiment of the present invention will be described with reference to FIG. 13. In the fourth embodiment, addition of a support member 36 to the first embodiment will be described. Redundant descriptions of the structures, operations, and effects similar to those of the first embodiment will be omitted.

Figure 13:
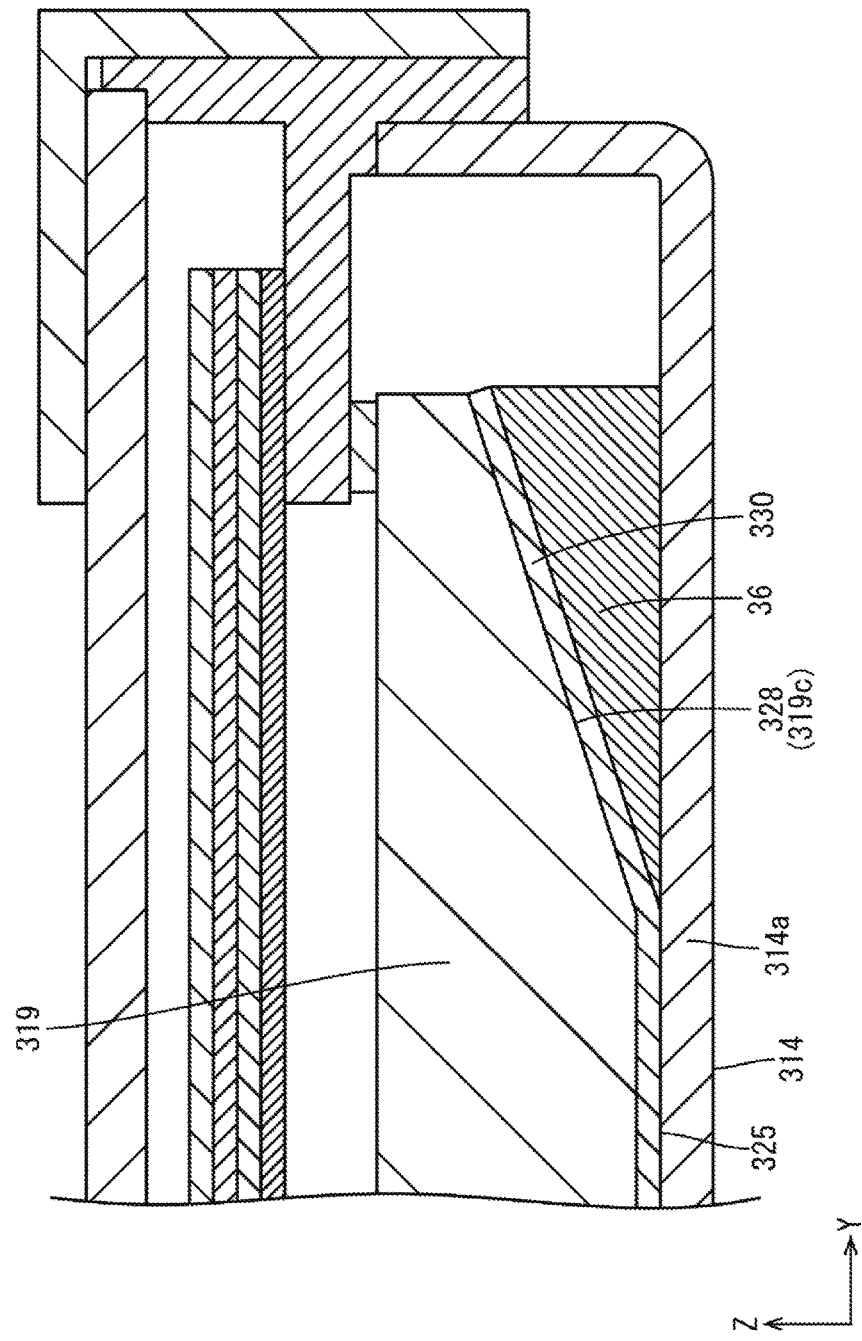
FIG. 13 is an enlarged cross sectional view of an end portion of a liquid crystal display device according to a fourth embodiment of the present invention.

According to the present embodiment, an inclined reflection portion 330 of a reflection sheet 325, as illustrated in FIG. 13, is supported by the support member 36 from the back side (the opposite side from the light guide plate 319 side). The support member 36 is interposed between an inclined reflection portion 330 and a bottom portion 314a of a chassis 314 so as to sandwich and hold the inclined reflection portion 330 with the outer peripheral side portion of the light guide plate 319. The support member 36 is made from synthetic resin, for example, and has a substantially triangular cross sectional shape. In addition, the support member 36 is disposed in substantially all of the area of the portion, among the outer peripheral side portions of the bottom portion 314a of the chassis 314, in which the inclined reflection portion 330 is provided. Thus, the support member 36 allows the inclined reflection portion 330 to be maintained in a stable positional relationship with respect to the inclined plate surface 328 of the light guide plate 319. Accordingly, the light from an opposite plate surface 319c of the light guide plate 319 can be reflected with high efficiency by the inclined reflection portion 330. In the present embodiment, the adhesive layer 31 (see FIG. 4 and FIG. 5) described in the first embodiment is omitted.

As described above, the present embodiment is provided with the support member 36 which supports the inclined reflection portion 330 of the reflection sheet 325 from the opposite side from the light guide plate 319 side. In this way, the support member 36 allows the inclined reflection portion 330 to be maintained in a stable positional relationship with respect to the inclined plate surface 328 of the light guide plate 319. Accordingly, the light from the opposite plate surface 319c of the light guide plate 319 can be reflected with high efficiency by the inclined reflection portion 330.

Fifth Embodiment

A fifth embodiment of the present invention will be described with reference to FIG. 14. The fifth embodiment describes a modification of the first embodiment in cross sectional shapes of an inclined plate surface 428 and an inclined reflection portion 430. Redundant descriptions of the structures, operations, and effects similar to those of the first embodiment will be omitted.

Figure 14:
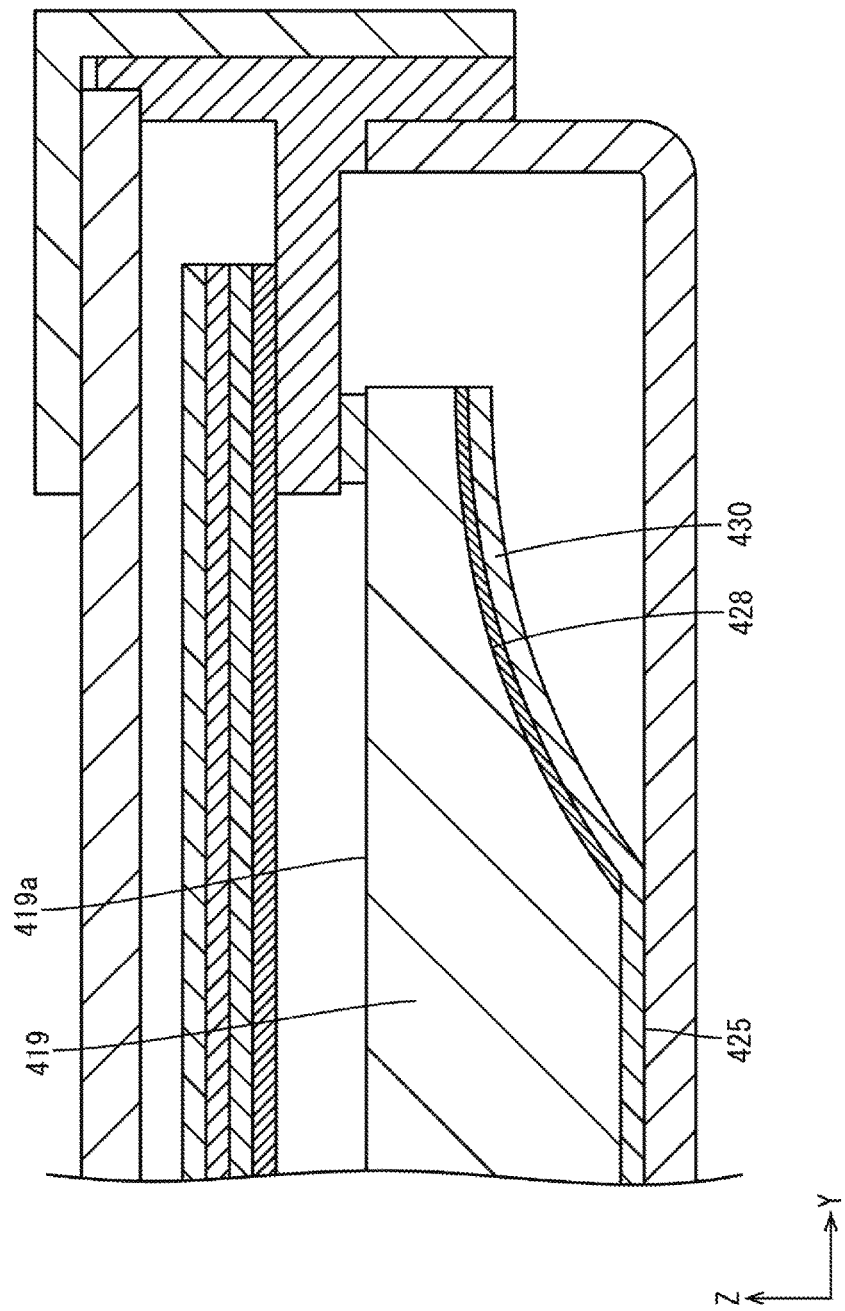
FIG. 14 is an enlarged cross sectional view of an end portion of a liquid crystal display device according to a fifth embodiment of the present invention.

According to the present embodiment, the inclined plate surface 428, as illustrated in FIG. 14, has a curved surface, and the inclined reflection portion 430 disposed therealong also has a curved cross section, with their tangential lines being both inclined with respect to a light output plate surface 419a. Specifically, the inclined plate surface 428 and the inclined reflection portion 430 have a substantially arcuate cross sectional shape with the center of curvature being present on the back side with respect to the light guide plate 419 and the reflection sheet 425.

Sixth Embodiment

A sixth embodiment of the present invention will be described with reference to FIG. 15. The sixth embodiment describes a modification of the fifth embodiment in cross sectional shapes of an inclined plate surface 528 and an inclined reflection portion 530. Redundant descriptions of the structures, operations, and effects similar to those of the fifth embodiment will be omitted.

Figure 15:
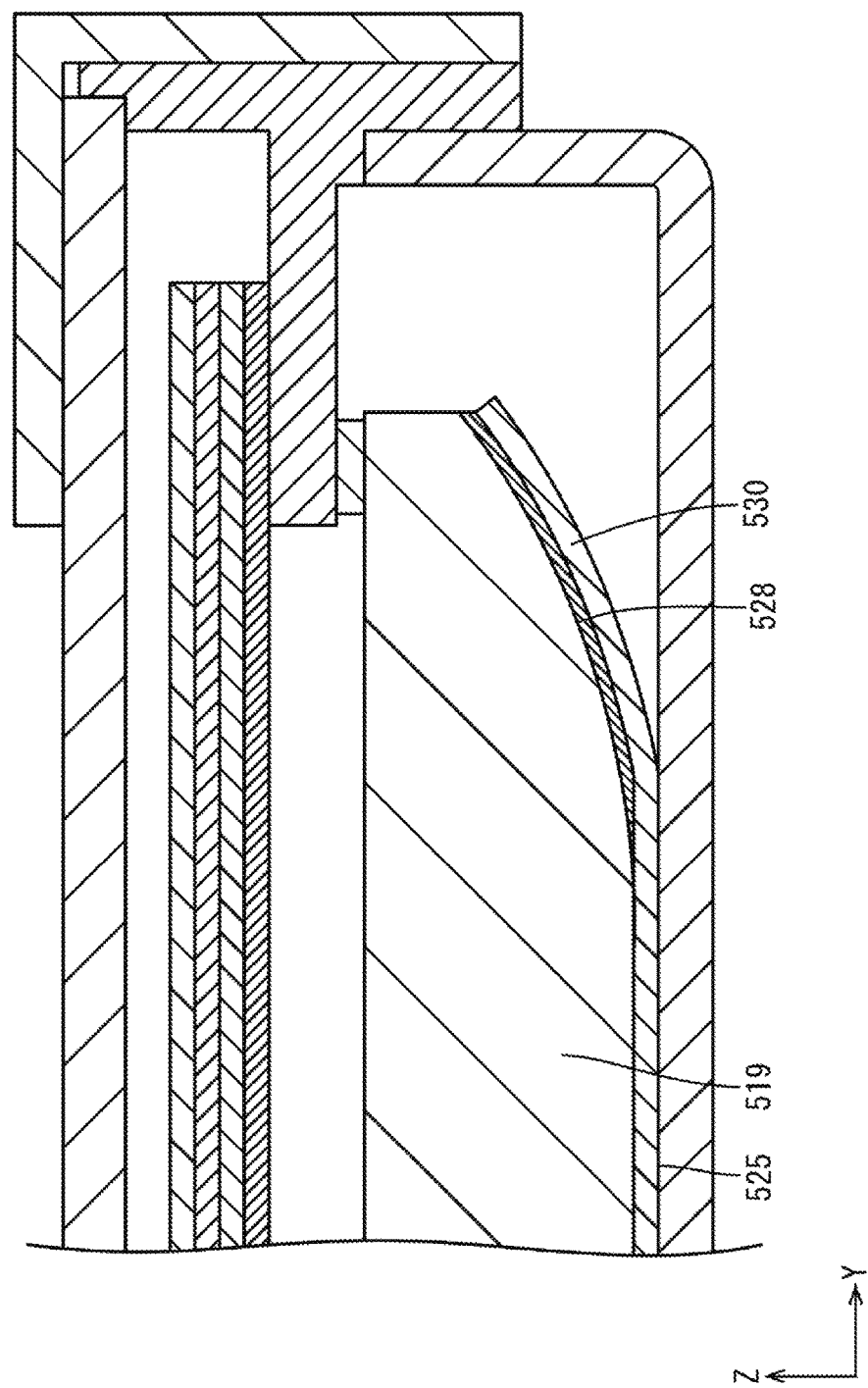
FIG. 15 is an enlarged cross sectional view of an end portion of a liquid crystal display device according to a sixth embodiment of the present invention.

According to the present embodiment, the inclined plate surface 528 and the inclined reflection portion 530, as illustrated in FIG. 15, have a substantially arcuate cross sectional shape with the center of curvature being present on the front side with respect to a light guide plate 519 and a reflection sheet 525.

Seventh Embodiment

A seventh embodiment of the present invention will be described with reference to FIG. 16. The seventh embodiment describes a modification of the second embodiment in the configuration of an inclined plate surface 628 and an inclined reflection portion 630. Redundant descriptions of the structures, operations, and effects similar to those of the second embodiment will be omitted.

Figure 16:
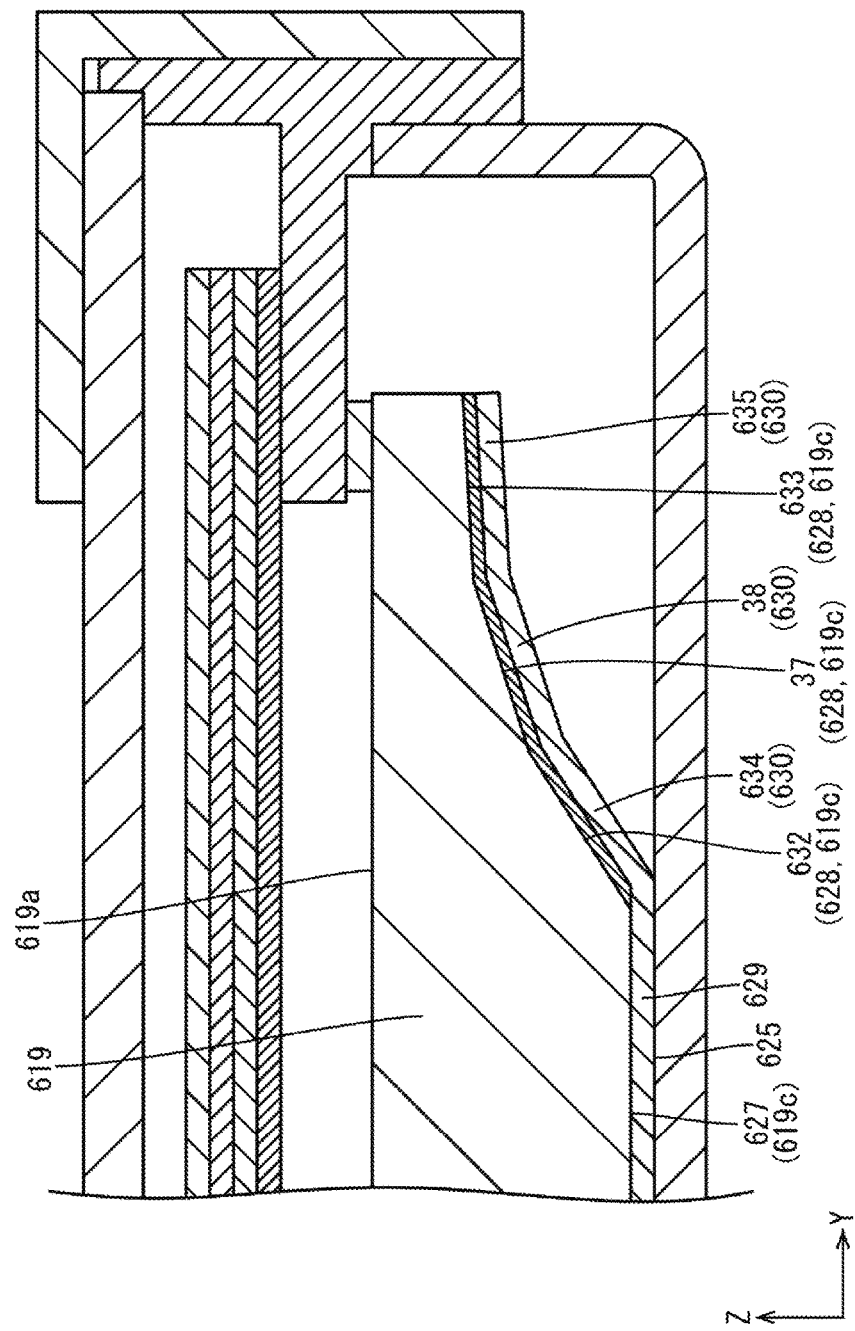
FIG. 16 is an enlarged cross sectional view of an end portion of a liquid crystal display device according to a seventh embodiment of the present invention.

According to the present embodiment, the inclined plate surface 628, as illustrated in FIG. 16, has the inclination angle with respect to the light output plate surface 619a which is varied in three steps. Specifically, the inclined plate surface 628 includes: a parallel plate surface-side inclined plate surface 632 disposed on the parallel plate surface 627 side (the center of a light guide plate 619); an outer peripheral end surface-side inclined plate surface 633 disposed on the outer peripheral end surface side of the light guide plate 619; and an intermediate inclined plate surface 37 disposed between the parallel plate surface-side inclined plate surface 632 and the outer peripheral end surface-side inclined plate surface 633. The inclination angle with respect to the light output plate surface 619a is varied in decreasing order from the parallel plate surface-side inclined plate surface 632, the outer peripheral end surface-side inclined plate surface 633, and the intermediate inclined plate surface 37. That is, the inclination angle of the intermediate inclined plate surface 37 with respect to the light output plate surface 619a is between the inclination angle of the parallel plate surface-side inclined plate surface 632 and the inclination angle of the outer peripheral end surface-side inclined plate surface 633. The parallel plate surface-side inclined plate surface 632 has the largest inclination angle with respect to the light output plate surface 619a. The outer peripheral end surface-side inclined plate surface 633 has the smallest inclination angle with respect to the light output plate surface 619a. In this way, the inclined plate surface 628 is configured such that the inclination angle with respect to the light output plate surface 619a increases with decreasing distance from the central portion of the light guide plate 619, and the inclination angle with respect to the light output plate surface 619a decreases with increasing distance from the central portion of the light guide plate 619.

On the other hand, the inclined reflection portion 630 of a reflection sheet 625 includes: a parallel reflection portion-side inclined reflection portion 634 disposed along the parallel plate surface-side inclined plate surface 632; an outer peripheral end surface-side inclined reflection portion 635 disposed along the outer peripheral end surface-side inclined plate surface 633; and an intermediate inclined reflection portion 38 disposed along the intermediate inclined plate surface 37. That is, the inclination angle of the inclined reflection portion 630 is varied in three steps with respect to the light output plate surface 619a. Specifically, the parallel reflection portion-side inclined reflection portion 634 disposed the closest to the parallel reflection portion 629 (the central portion of an opposite plate surface 619c) has the largest inclination angle, while the outer peripheral end surface-side inclined reflection portion 635 disposed the farthest from the parallel reflection portion 629 has the smallest inclination angle. The intermediate inclined reflection portion 38 disposed at the position which, with respect to the parallel reflection portion 629, is farther than the parallel reflection portion-side inclined reflection portion 634 and closer than the outer peripheral end surface-side inclined reflection portion 635, i.e., at the intermediate position, has an intermediate inclination angle.

Eighth Embodiment

An eighth embodiment of the present invention will be described with reference to FIG. 17. The eighth embodiment describes a modification of the first embodiment in the number of inclined plate surfaces 728 installed. Redundant descriptions of the structures, operations, and effects similar to those of the first embodiment will be omitted.

Figure 17:
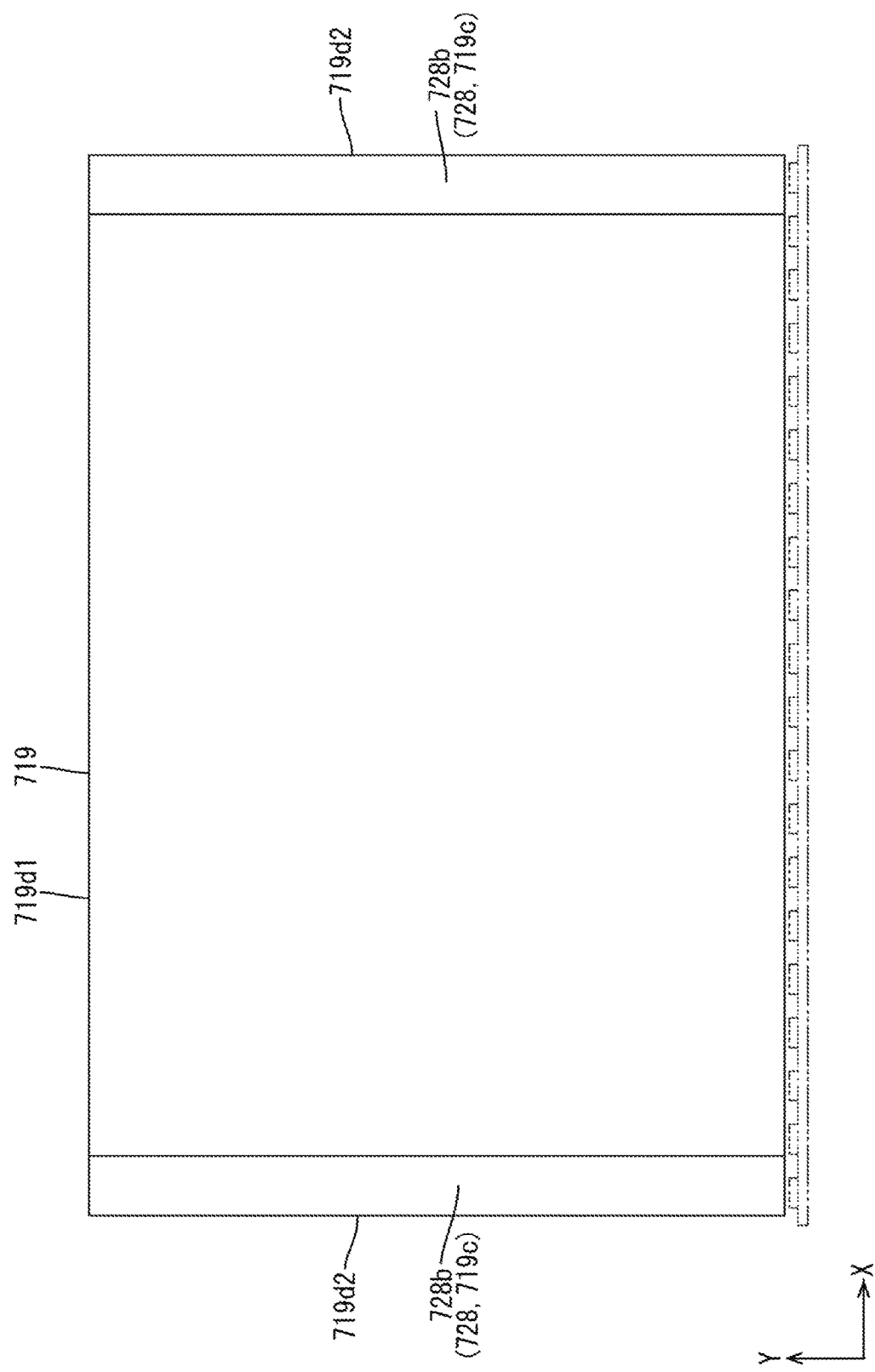
FIG. 17 is a bottom view of a light guide plate according to an eighth embodiment of the present invention.

According to the present embodiment, the inclined plate surface 728, as illustrated in FIG. 17, is not provided in, among the outer peripheral side portions of an opposite plate surface 719c of a light guide plate 719, the portion along a no-light entry opposite end surface 719d1, but is selectively provided only in the portions along a pair of no-light entry side end surfaces 719d2. That is, according to the present embodiment, the inclined plate surface 728 includes only a pair of no-light entry side, end surface-side inclined plate surfaces 728b. The inclined reflection portions, not illustrated, of the reflection sheet only include a pair of no-light entry-side, end surface-side inclined reflection portions disposed along the pair of no-light entry side, end surface-side inclined plate surface 728b. In FIG. 17, the outer shapes of the LEDs and the LED substrate are indicated by dashed-and-double-dotted lines.

Ninth Embodiment

A ninth embodiment of the present invention will be described with reference to FIG. 18. The ninth embodiment describes a modification of the first embodiment in the number of inclined plate surfaces 828 installed. Redundant descriptions of the structures, operations, and effects similar to those of the first embodiment will be omitted.

Figure 18:
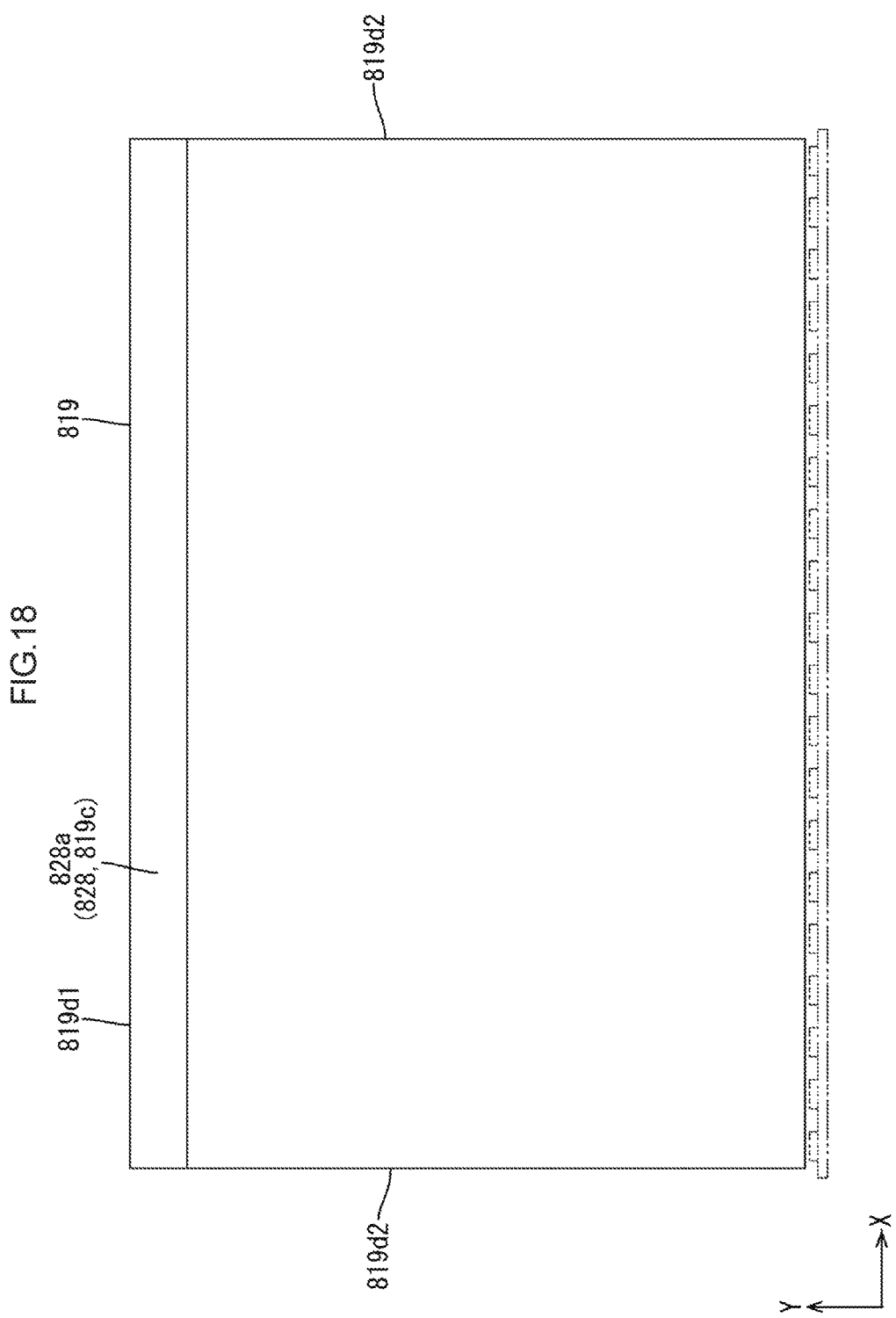
FIG. 18 is a bottom view of a light guide plate according to a ninth embodiment of the present invention.

According to the present embodiment, the inclined plate surface 828, as illustrated in FIG. 18, is not provided in, among the outer peripheral side portions of an opposite plate surface 819c of a light guide plate 819, the portions along a pair of no-light entry side end surfaces 819d2, but is selectively provided only in the portion along a no-light entry opposite end surface 819d1. That is, according to the present embodiment, the inclined plate surface 828 only includes a no-light-entry, opposite end surface-side inclined plate surface 828a. The inclined reflection portion of the reflection sheet, which is not illustrated, only includes a no-light entry opposite end surface-side inclined reflection portion disposed along the no-light-entry, opposite end surface-side inclined plate surface 828a. In FIG. 18, the outer shapes of the LEDs and the LED substrate are indicated by dashed-and-double-dotted lines.

Tenth Embodiment

A tenth embodiment of the present invention will be described with reference to FIG. 19. The tenth embodiment describes a modification of the first embodiment in the locations of LEDs 917 and an LED substrate 918. Redundant descriptions of the structures, operations, and effects similar to those of the first embodiment will be omitted.

Figure 19:
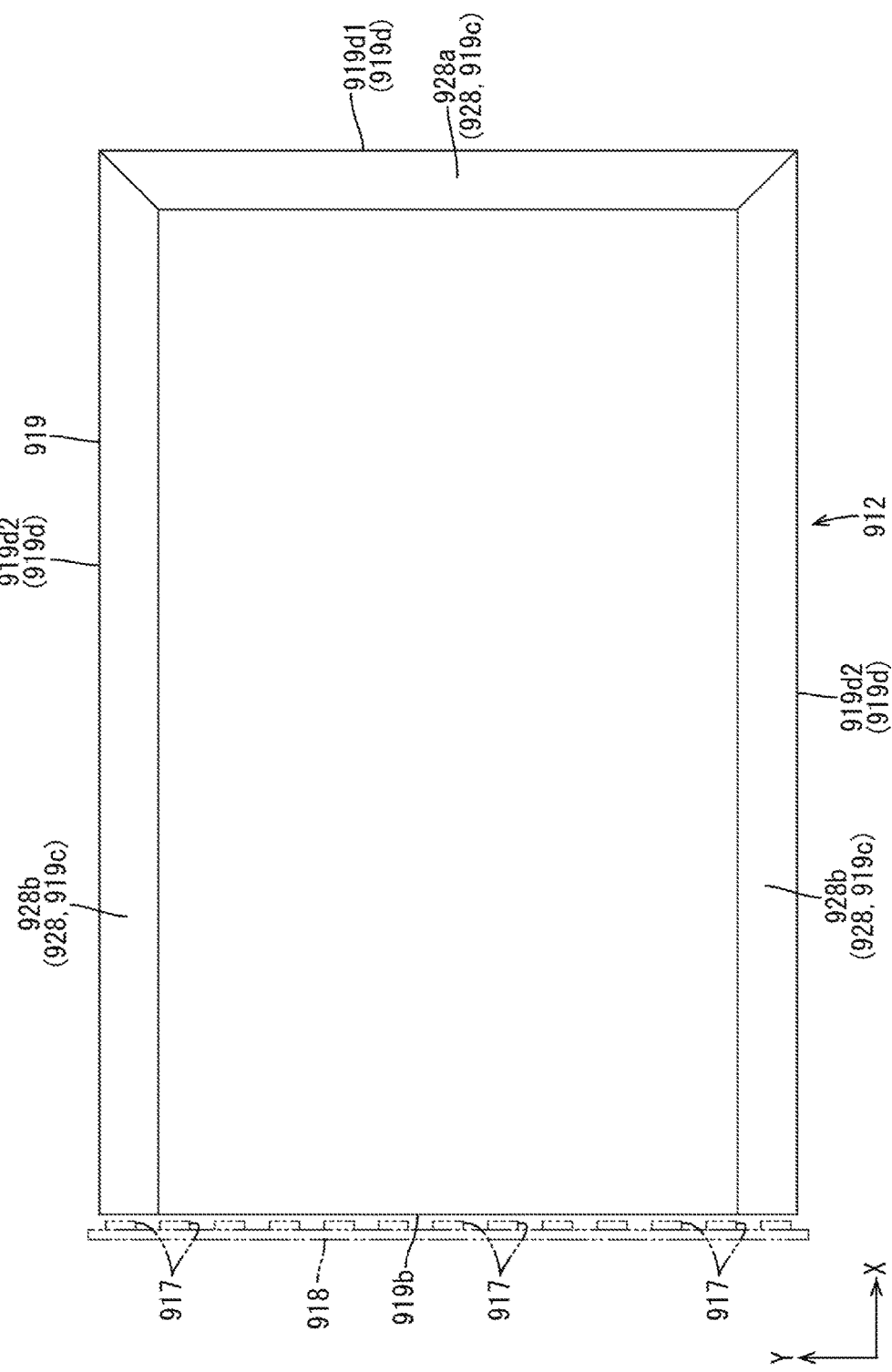
FIG. 19 is a bottom view of a light guide plate according to a tenth embodiment of the present invention.

According to the present embodiment, a backlight unit 912 is configured such that, as illustrated in FIG. 19, the LEDs 917 and LED substrate 918 are disposed at one of the short-side end portions (the left side in FIG. 19). Specifically, the LED substrate 918 is disposed with the LEDs 917 mounted thereon facing one short-side end surface among the outer peripheral end surfaces of light guide plate 919. Accordingly, in the present embodiment, among the outer peripheral end surfaces of the light guide plate 919, one short-side end surface constitutes a light entry end surface 919b that the light from the LEDs 917 enters, while the remaining three end surfaces (the other short-side end surface, and a pair of long-side end surfaces) constitute a no-light entry end surface 919d. Of the no-light entry end surface 919d, the other short-side end surface constitutes a no-light entry opposite end surface 919d1 disposed on the opposite side from the light entry end surface 919b, whereas the pair of long-side end surfaces constitute a pair of no-light entry side end surfaces 919d2 adjacent to the light entry end surface 919b.

An inclined plate surface 928 is provided, among the outer peripheral side portions of an opposite plate surface 919c of the light guide plate 919, in the end surfaces except for the portion along the one short-side end surface, i.e., the light entry end surface 919b. That is, the inclined plate surface 928 is provided in the portions along the no-light entry end surface 919d. Specifically, the inclined plate surface 928 includes, of the outer peripheral side portions of the opposite plate surface 919c of the light guide plate 919: a no-light-entry, opposite end surface-side inclined plate surface 928a provided the portion along the other short-side end surface, i.e., the no-light entry opposite end surface 919d1; and a pair of no-light entry side, end surface-side inclined plate surfaces 928b provided in the pair of long-side end surfaces, i.e., a pair of no-light entry side end surfaces 919d2. The inclined reflection portions of the reflection sheet, which is not illustrated, are disposed along the no-light-entry, opposite end surface-side inclined plate surface 928a of the inclined plate surface 928, and the no-light entry side, end surface-side inclined plate surfaces 928b. In FIG. 19, the outer shapes of the LEDs 917 and the LED substrate 918 are indicated by dashed-and-double-dotted lines.

Eleventh Embodiment

An eleventh embodiment of the present invention will be described with reference to FIG. 20. The eleventh embodiment describes a modification of the first embodiment involving a both-side light entry-type backlight unit 1012. Redundant descriptions of the structures, operations, and effects similar to those of the first embodiment will be omitted.

Figure 20:
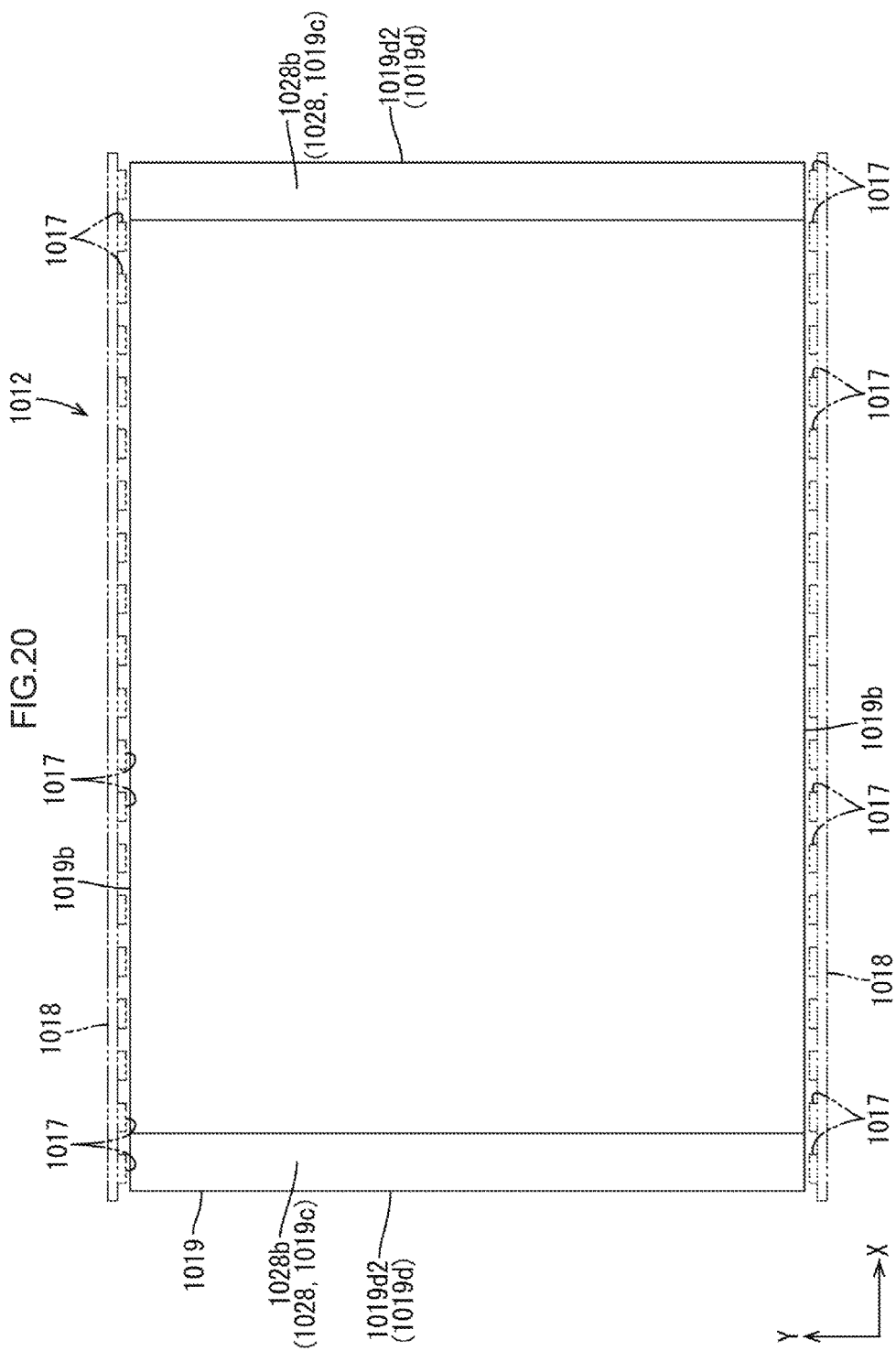
FIG. 20 is a bottom view of a light guide plate according to an eleventh embodiment of the present invention.

According to the present embodiment, the backlight unit 1012 is configured such that, as illustrated in FIG. 20, LEDs 1017 and an LED substrate 1018 are disposed in each of the long-side end portions. Specifically, a pair of LED substrates 1018 is disposed such that the respective LEDs 1017 mounted thereon are opposed to each of a pair of long-side end surfaces among the outer peripheral end surfaces of a light guide plate 1019. Accordingly, in the present embodiment, among the outer peripheral end surfaces of the light guide plate 1019, each of the pair of long-side end surfaces constitutes a light entry end surface 1019b that the light from the LEDs 1017 enters, whereas the remaining pair of short-side end surfaces constitute a no-light entry end surface 1019d. Accordingly, according to the present embodiment, the no-light entry end surface 1019d does not include the no-light entry opposite end surface 19d1 as in the first embodiment (see FIG. 3), and only includes a pair of no-light entry side end surfaces 1019d2 adjacent to the light entry end surface 1019b. Thus, according to the present embodiment, the backlight unit 1012 is of both-side light entry-type in which the light guide plate 1019 is sandwiched between the pair of LED substrates 1018 and the respective LEDs 1017 mounted thereon from both sides with respect to the short side direction (the Y-axis direction).

The inclined plate surface 1028 is selectively provided, among the outer peripheral side portions of an opposite plate surface 1019c of a light guide plate 1019, only in the portions along a pair of short-side end surfaces (a pair of no-light entry side end surfaces 1019d2), and not the portions along a pair of long-side end surfaces (a pair of light entry end surfaces 1019b). Specifically, the inclined plate surface 1028 includes, among the outer peripheral side portions of the opposite plate surface 1019c of the light guide plate 1019, only a pair of no-light entry side, end surface-side inclined plate surfaces 1028b provided in the portions along the pair of no-light entry side end surface 1019d2. The inclined reflection portions of the reflection sheet, which is not illustrated, are disposed along the pair of no-light entry side, end surface-side inclined plate surfaces 1028b of the inclined plate surface 1028. In FIG. 20, the outer shapes of the LEDs 1017 and the LED substrate 1018 are indicated by dashed-and-double-dotted lines.

Twelfth Embodiment

A twelfth embodiment of the present invention will be described with reference to FIG. 21. The twelfth embodiment describes a modification of the eleventh embodiment in the locations of LEDs 1117 and LED substrates 1118. Redundant descriptions of the structures, operations, and effects similar to those of the eleventh embodiment will be omitted.

Figure 21:
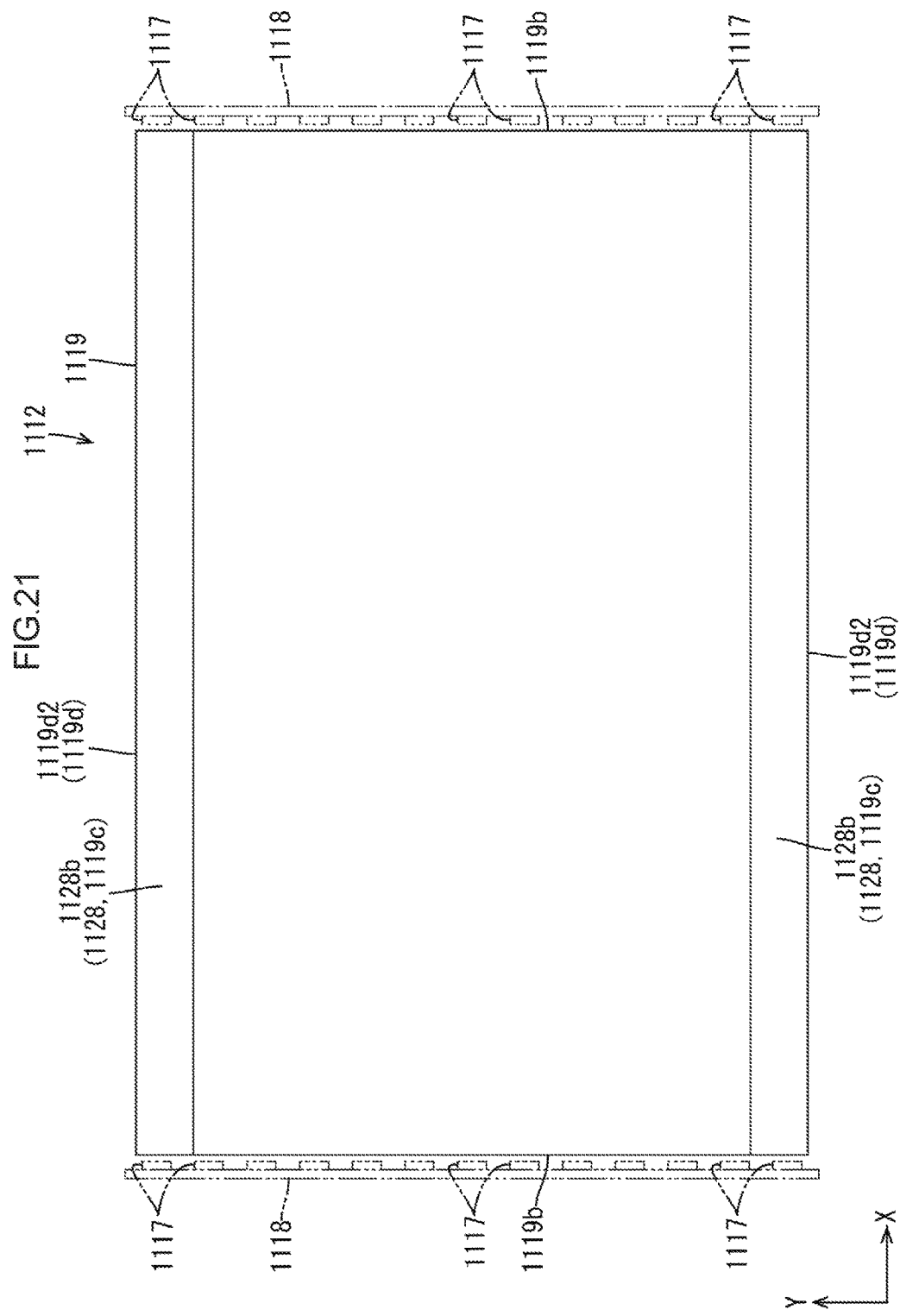
FIG. 21 is a bottom view of a light guide plate according to a twelfth embodiment of the present invention.

According to the present embodiment, a backlight unit 1112 is configured such that, as illustrated in FIG. 21, the LEDs 1117 and the LED substrates 1118 are disposed in both short-side end portions. Specifically, the LED substrates 1118 are disposed such that the LEDs 1117 mounted thereon face each of a pair of short-side end surfaces among the outer peripheral end surfaces of the light guide plate 1119. Accordingly, in the present embodiment, among the outer peripheral end surfaces of the light guide plate 1119, each of the pair of short-side end surfaces constitutes a light entry end surface 1119*b* that the light from the LEDs 1117 enters, whereas the remaining pair of long-side end surfaces constitute no-light entry end surfaces 1119*d* (a pair of no-light entry side end surfaces 1119*d*2). Thus, according to the present embodiment, the backlight unit 1112 is of the both-side light entry-type in which the light guide plate 1119 is sandwiched between the pair of LED substrates 1118 and the LEDs 1117 mounted thereon from both sides with respect to the long-side direction (the X-axis direction).

An inclined plate surface 1128 is selectively provided only in, among the outer peripheral side portions of an opposite plate surface 1119*c* of the light guide plate 1119, the portions along the pair of long-side end surfaces (the pair of no-light entry side end surface 1119*d*2) and not the pair of short-side end surfaces (the pair of light entry end surface 1119*b*). Specifically, the inclined plate surface 1128 is configured of only a pair of no-light entry side, end surface-side inclined plate surfaces 1128*b* provided in the portions, among the outer peripheral side portions of the opposite plate surface 1119*c* of the light guide plate 1119, along the pair of no-light entry side end surface 1119*d*2. The inclined reflection portions of a reflection sheet, which is not illustrated, is disposed along the pair of no-light entry side, end surface-side inclined plate surfaces 1128*b* of the inclined plate surface 1128. In FIG. 21, the outer shapes of the LEDs 1117 and the LED substrates 1118 are indicated by dashed-and-double-dotted lines.

Thirteenth Embodiment

A thirteenth embodiment of the present invention will be described with reference to FIG. 22. The thirteenth embodiment describes a modification of the eleventh embodiment in the number of LEDs 1217 and LED substrates 1218 installed. Redundant descriptions of the structures, operations, and effects similar to those of the eleventh embodiment will be omitted.

Figure 22:
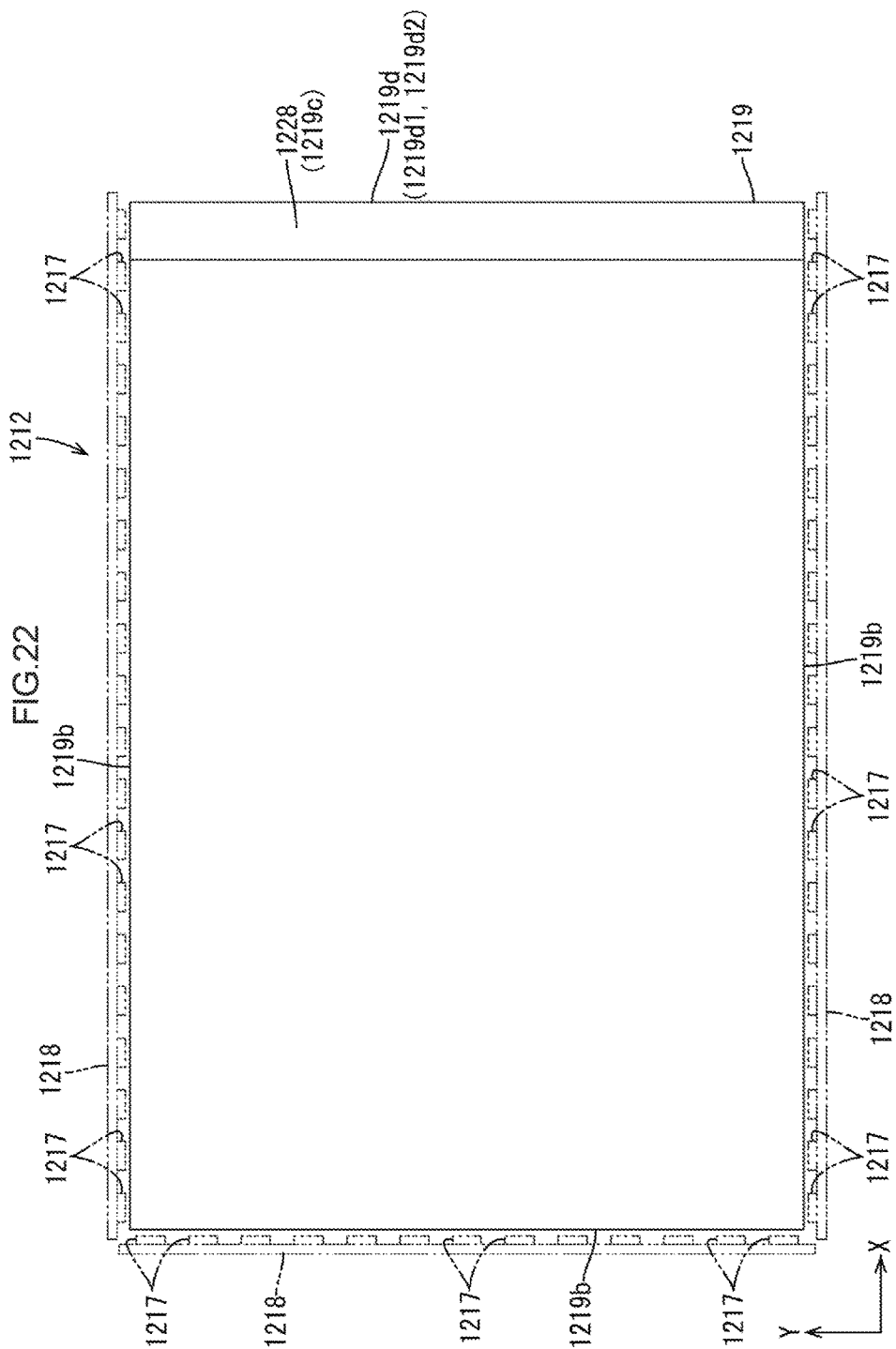
FIG. 22 is a bottom view of a light guide plate according to a thirteenth embodiment of the present invention.

The backlight unit 1212 according to the present embodiment is configured such that, as illustrated in FIG. 22, the LEDs 1217 and the LED substrate 1218 are disposed in both of the long-side end portions, and one (the left side in FIG. 22) of the short-side end portions. Specifically, the LED substrates 1218 are disposed such that the LEDs 1217 mounted thereon face, among the outer peripheral end surfaces of the light guide plate 1219, each of the pair of long-side end surfaces and the one short-side end surface. Accordingly, in the present embodiment, among the outer peripheral end surfaces of the light guide plate 1219, each of the pair of long-side end surfaces and the one short-side end surface constitutes a light entry end surface 1219*b* that the light from the LEDs 1217 enter, whereas the remaining other short-side end surface constitutes a no-light entry end surface 1219*d*. Thus, according to the present embodiment, the no-light entry end surface 1219*d* constitutes a no-light entry opposite end surface 1219*d*1 with respect to the short-side light entry end surface 1219*b*, and constitutes a no-light entry side end surface 1219*d*2 with respect to the pair of long-side light entry end surfaces 1219*b*. Accordingly, the backlight unit 1212 according to the present embodiment is of the three-side light entry type in which the light from the three LED substrates 1218 and the LEDs 1217 mounted thereon enters the light guide plate 1219 along the three sides of which the three LED substrates 1218 and the LEDs 1217 are disposed.

An inclined plate surface 1228 is selectively provided only in, among the outer peripheral side portions of an opposite plate surface 1219*c* of the light guide plate 1219, the portions along the other short-side end surface (no-light entry end surface 1219*d*), and not the portion along the other short-side end surface (light entry end surface 1219*b*) and the portions along the pair of long-side end surfaces (the pair of no-light entry side end surface 1219*d*2). Specifically, there is only one inclined plate surface 1228 disposed in, among the outer peripheral side portions of the opposite plate surface 1219*c* of the light guide plate 1219, the portion along the one no-light entry end surface 1219*d*. The inclined reflection portion of the reflection sheet, which is not illustrated, is disposed along the inclined plate surface 1228. In FIG. 22, the outer shapes of the LEDs 1217 and the LED substrate 1218 are indicated by dashed-and-double-dotted lines.

Fourteenth Embodiment

A fourteenth embodiment of the present invention will be described with reference to FIG. 23. The fourteenth embodiment describes a modification of the thirteenth embodiment in the number of LEDs 1317 and LED substrates 1318 installed. Redundant descriptions of the structures, operations, and effects similar to those of the thirteenth embodiment will be omitted.

Figure 23:
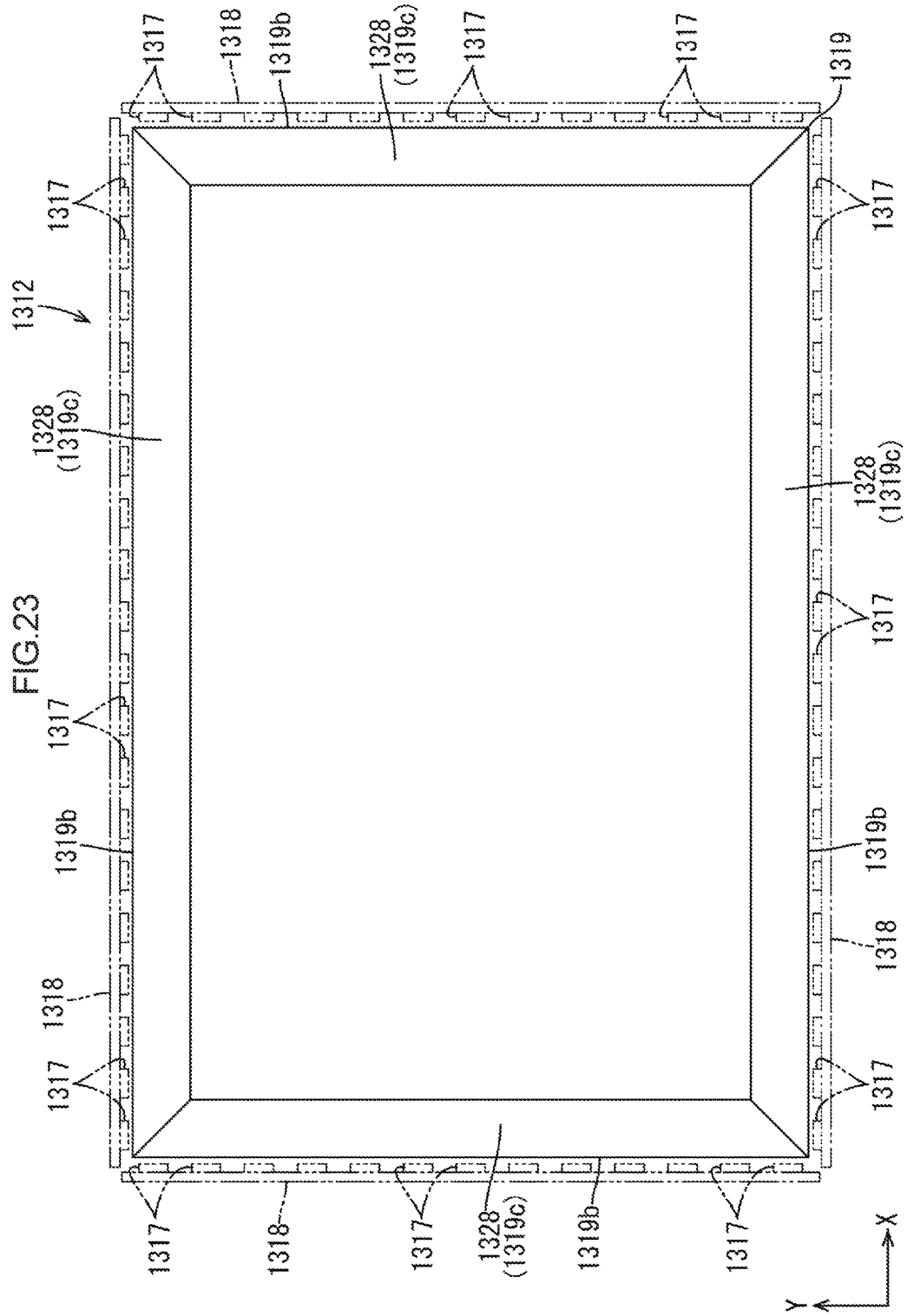
FIG. 23 is a bottom view of a light guide plate according to a fourteenth embodiment of the present invention.

According to the present embodiment, a backlight unit 1312 is configured such that, as illustrated in FIG. 23, the LEDs 1317 and the LED substrates 1318 are disposed in both of the long-side end portions and both of the short-side end portions, i.e., along the periphery of the outer peripheral side end portions. Specifically, the LED substrates 1318 are disposed such that the LEDs 1317 mounted thereon face the outer peripheral end surfaces of the light guide plate 1319 along the periphery thereof. Accordingly, in the present embodiment, the outer peripheral end surfaces of the light guide plate 1319 constitute light entry end surfaces 1319*b* that the light from the LEDs 1317 enter along the periphery thereof, and the outer peripheral end surfaces of the light guide plate 1319 do not include a no-light entry end surface. Thus, according to the present embodiment, a backlight unit 1313 is of the four-side light entry type in which the light from the four LED substrates 1318 and the LEDs 1317 mounted thereon enter the light guide plate 1319 along the four side portions of which the LED substrates 1318 and the LEDs 1317 are disposed.

An inclined plate surface 1328 is provided in all of the areas of the outer peripheral side portions of an opposite plate surface 1319*c* of the light guide plate 1319. That is, the inclined plate surface 1328, similarly to the inclined plate surface 228 (see FIG. 11) of the third embodiment, is provided in, among the outer peripheral side portions of the opposite plate surface 1319*c* of the light guide plate 1319, each of the portions along the four light entry end surfaces 1319*b*. The inclined reflection portions of the reflection sheet, which is not illustrated, are disposed along the inclined plate surface 1328, and is configured similarly to the inclined reflection portion 230 (see FIG. 12) of the third embodiment. In FIG. 23, the outer shapes of the LEDs 1317 and the LED substrates 1318 are indicated by dashed-and-double-dotted lines.

Fifteenth Embodiment

Figure 27:
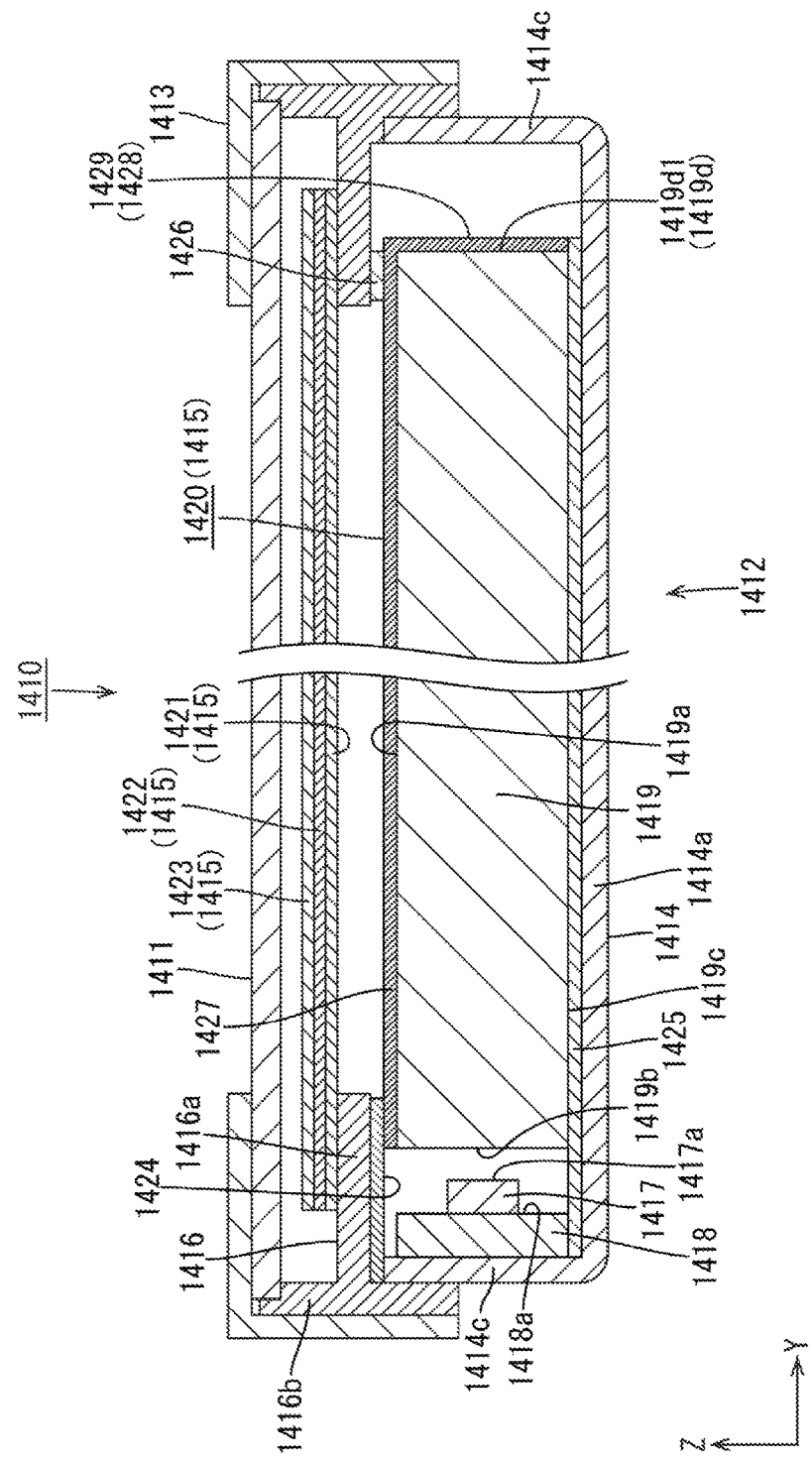
FIG. 27 is a cross sectional view taken along line xxvii-xxvii of FIG. 26.
Figure 28:
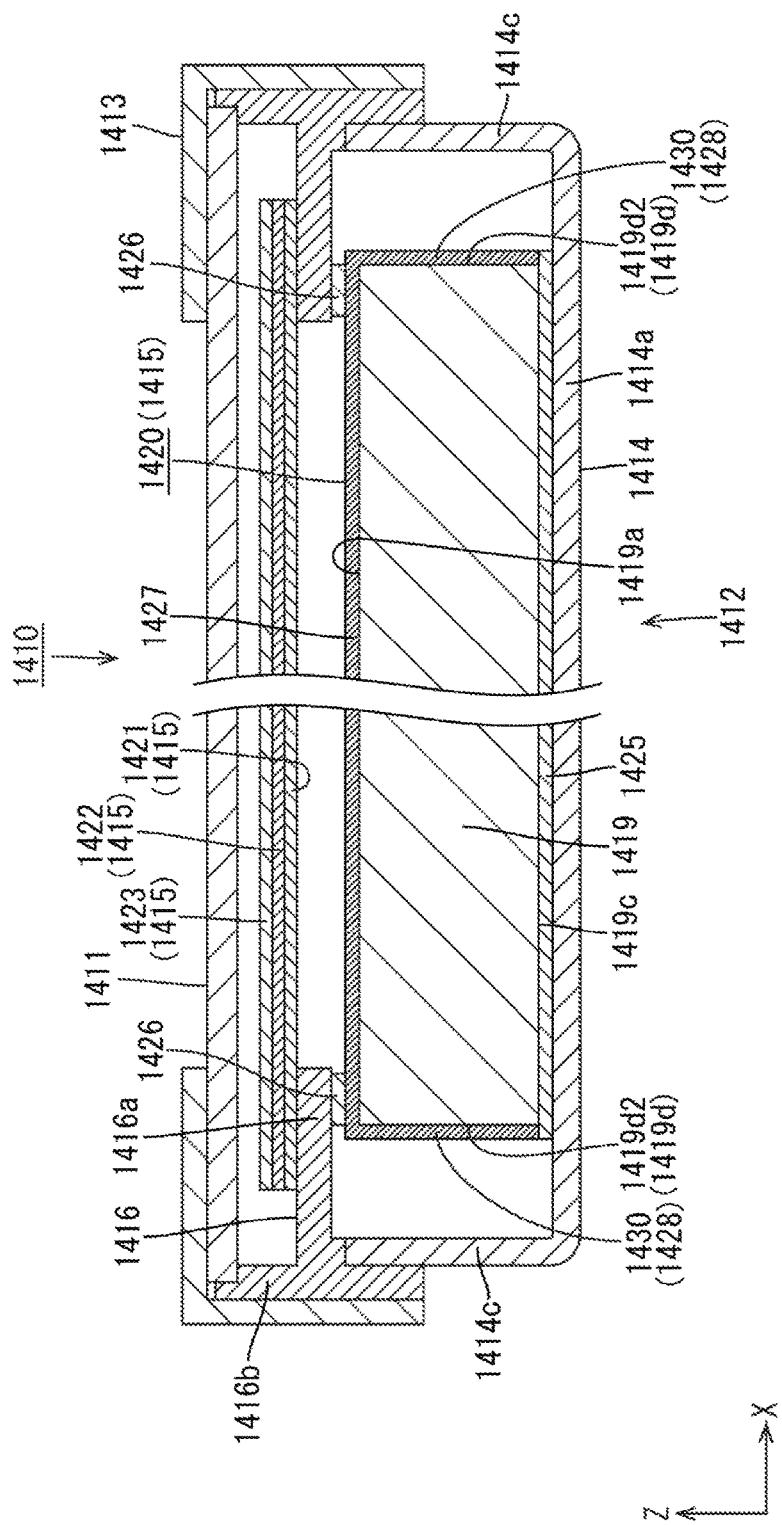
FIG. 28 is a cross sectional view taken along line xxviii-xxviii of FIG. 26.

A fifteenth embodiment of the present invention will be described with reference to FIG. 24 to FIG. 30. In the present embodiment, a backlight unit 1412 and a liquid crystal display device 1410 using the same will be described by way of example. In some of the drawings, the X-axis, the Y-axis, and the Z-axis are indicated, the respective axis directions corresponding to the directions indicated in the respective drawings. In FIG. 27 and FIG. 28 and the like, the top corresponds to the front side, and the bottom corresponds to the back side.

Figure 24:
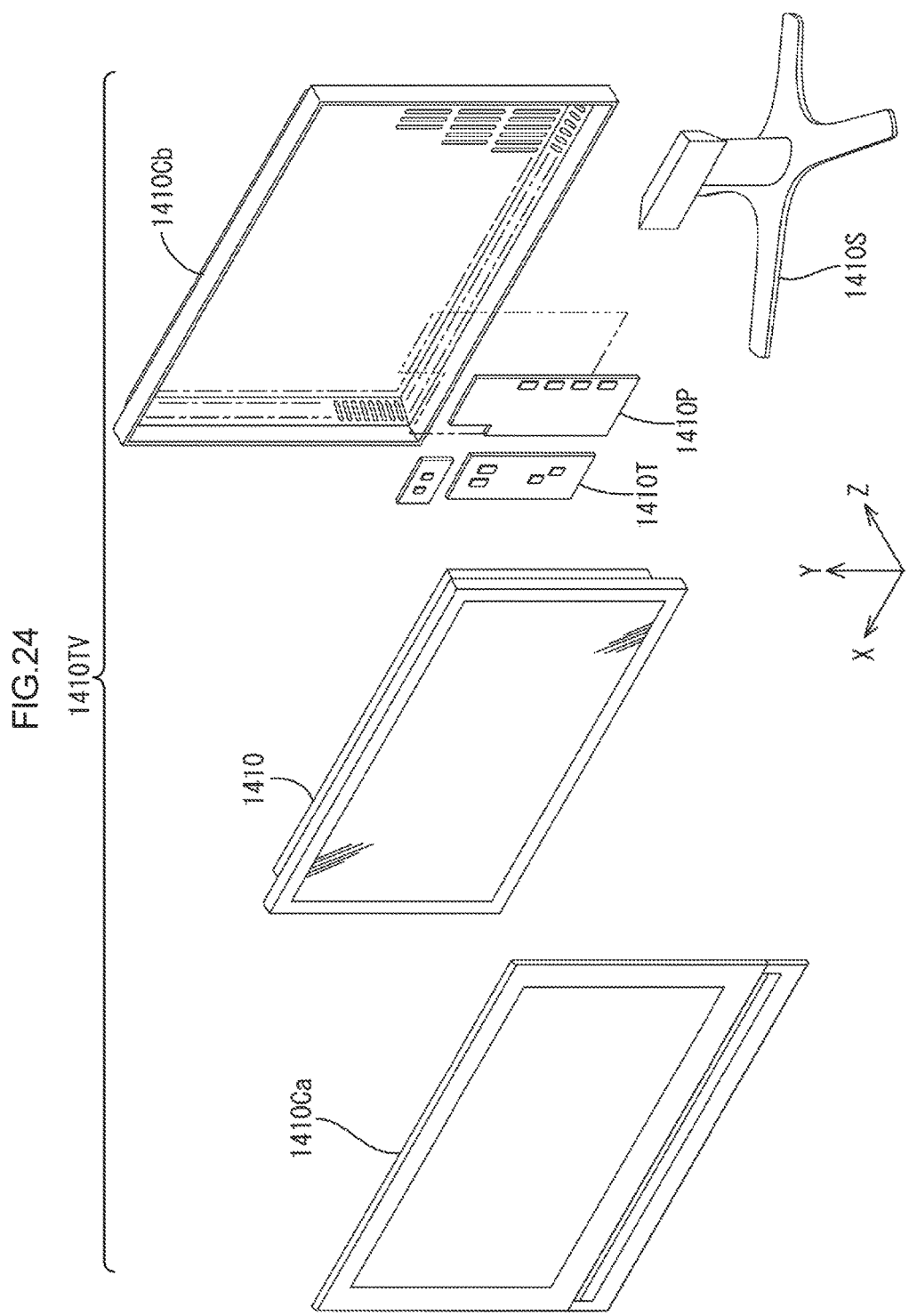
FIG. 24 is an exploded perspective view illustrating a schematic configuration of a television device according to a fifteenth embodiment of the present invention.

According to the present embodiment, a television device 1410TV, as illustrated in FIG. 24, is configured from: the liquid crystal display device 1410 similar to that of the first embodiment; cabinets 1410Ca, 1410Cb; a power supply 1410P; a tuner (reception unit) 1410T; and a stand 1410S. The liquid crystal display device 1410 includes a liquid crystal panel 1411 with a configuration similar to that of the liquid crystal panel 11 of the first embodiment.

Figure 25:
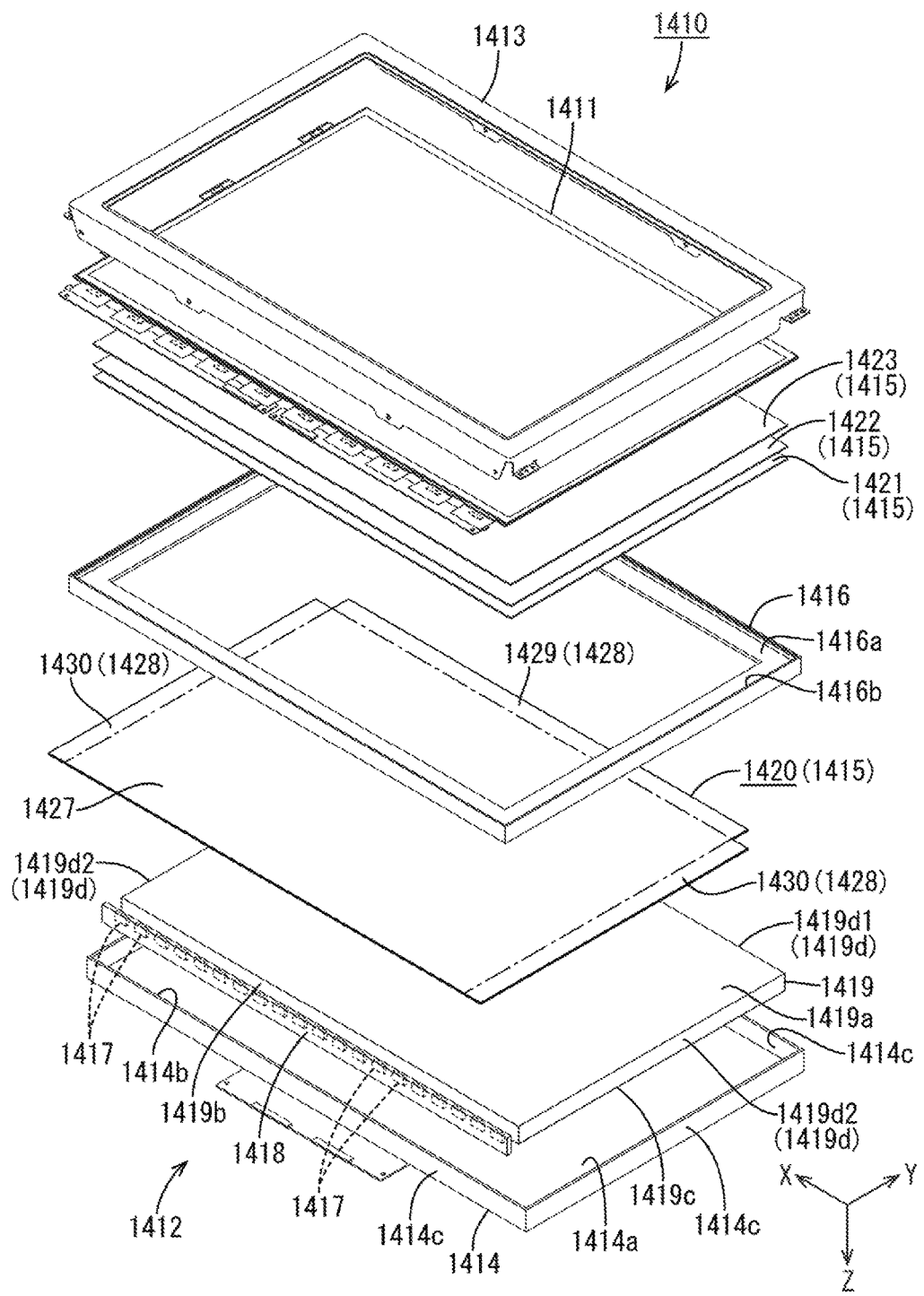
FIG. 25 is an exploded perspective view illustrating a schematic configuration of a liquid crystal display device provided in the television device.

The backlight unit 1412, as illustrated in FIG. 25, includes: a substantially box-shaped chassis 1414 with a light emitting portion 1414b which is opened toward the front side (the liquid crystal panel 1411 side); and an optical member (optical sheet) 1415 disposed so as to cover the light emitting portion 1414b of the chassis 1414. Further, the chassis 1414 houses: LEDs 1417 as a light source; an LED substrate 1418 with the LEDs 1417 mounted thereon; a light guide plate 1419 which guides the light from the LEDs 1417 to the optical member 1415 (liquid crystal panel 1411); and a frame 1416 which presses the light guide plate 1419 and the like from the front side. In the backlight unit 1412, the LED substrate 1418 is disposed in one of a pair of long-side end portions (the front side in FIG. 25 and FIG. 26; the left side in FIG. 27), so that the LEDs 1417 mounted on the LED substrate 1418 are displaced toward one of the long-side end portions of the liquid crystal panel 1411. Thus, the backlight unit 1412 according to the present embodiment is an edge light (side light) backlight unit which is of a one-side light entry type in which the light from the LEDs 1417 enters the light guide plate 1419 from only one side. In the following, the constituent parts of the backlight unit 1412 will be described in detail.

Figure 26:
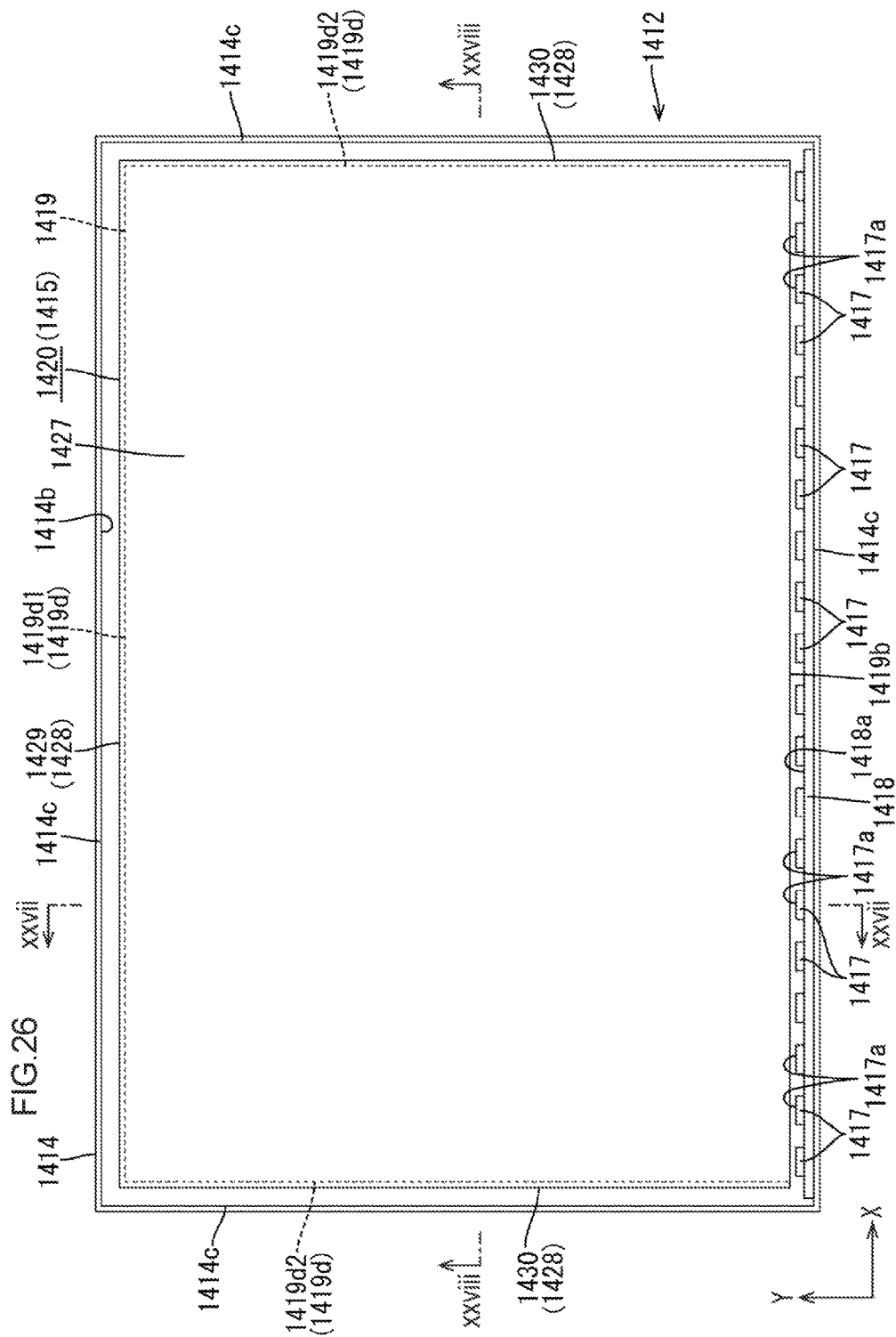
FIG. 26 is a plan view of a backlight unit provided in the liquid crystal display device.

The chassis 1414 is made of metal and, as illustrated in FIG. 25 and FIG. 26, includes a bottom portion 1414a having a laterally elongated rectangular shape similar to the liquid crystal panel 1411, and side portions 1414c respectively rising from the outer ends of the respective sides of the bottom portion 1414a. As a whole, the chassis 1414 has a shallow substantially box-shape with an opening toward the front side. The chassis 1414 (bottom portion 1414a) has a long-side direction aligned with the X-axis direction (horizontal direction), and a short side direction aligned with the Y-axis direction (vertical direction). To the side portions 1414c, the frame 1416 and a bezel 1413 can be fixed.

The frame 1416, as illustrated in FIG. 25, includes a laterally elongated flange portion (picture-frame shaped portion) 1416a extending along the outer peripheral edge portions of the light guide plate 1419 and the optical member 1415. The flange portion 1416a presses the outer peripheral edge portions of the light guide plate 1419 substantially all around from the front side, via a wavelength conversion sheet 1420 which will be described later. A first reflection sheet (frame-side reflection sheet) 1424 for reflecting light is attached to the back side surface of one of the long-side portions of the flange portion 1416a, that is, the surface opposing the light guide plate 1419 and the LED substrate 1418 (LEDs 1417), as illustrated in FIG. 27. The first reflection sheet 1424 has a white surface for excellent optical reflection, and is sized to extend along substantially the entire length of one of the long-side portions of the flange portion 1416a. The first reflection sheet 1424 is directly brought into contact with the end portion of the light guide plate 1419 on a side of the LEDs 1417, and covers the end portion of the light guide plate 1419 and the LED substrate 1418 collectively from the front side. The flange portion 1416a of the frame 1416 is interposed between a microlens sheet 1421 of the optical member 1415 and the wavelength conversion sheet 1420, and supports the outer peripheral edge portions of the microlens sheet 1421 from the back side. In this way, the microlens sheet 1421 is maintained at a position spaced apart from the wavelength conversion sheet 1420 via an interval corresponding to the flange portion 1416a. In addition, the frame 1416 includes a liquid crystal panel support portion 1416b which protrudes from the flange portion 1416a toward the front side, and which supports the outer peripheral edge portion of the liquid crystal panel 1411 from the back side.

The detailed description of the LEDs 1417 and the LED substrate 1418 on which the LEDs 1417 are mounted will be omitted because their configurations are similar to those of the LEDs 17 and the LED substrate 18 according to the first embodiment. It should be noted, however, that some of the blue light emitted from the LEDs 1417 is wavelength-converted by the wavelength conversion sheet 1420 into green light or red light as will be described later, and that the output light of the backlight unit 1412 is made approximately white by the additive color mixture of the wavelength-converted green light and red light (secondary light) and the blue light (primary light) of the LEDs 1417.

The light guide plate 1419 is made of a substantially transparent (highly light transmissive) synthetic resin material (for example, acrylic resin material such as PMMA) having a refractive index sufficiently higher than air. The light guide plate 1419, as illustrated in FIG. 25 and FIG. 26, has a laterally elongated rectangular shape as viewed in plan which is similar to the liquid crystal panel 1411 and the chassis 1414, and has a board-like shape with a greater thickness than the optical member 1415. The light guide plate 1419 has a plate surface of which a long-side direction is aligned with the X-axis direction and a short side direction aligned with the Y-axis direction, and has a plate thickness direction perpendicular to the plate surface which is aligned with the Z-axis direction. The light guide plate 1419, as illustrated in FIG. 27 and FIG. 28, is disposed immediately below the liquid crystal panel 1411 and the optical member 1415 in the chassis 1414, with one of the long-side end surfaces among the outer peripheral end surfaces thereof (the front side in FIG. 25 and FIG. 26; the left side in FIG. 27) facing the LEDs 1417 on the LED substrate 1418 disposed on one long-side end portion of the chassis 1414. Accordingly, the direction along which the LEDs 1417 (the LED substrate 1418) and the light guide plate 1419 are arranged is aligned with the Y-axis direction, whereas the direction along which the optical member 1415 (the liquid crystal panel 1411) and the light guide plate 1419 are arranged is aligned with the Z-axis direction, the arranged directions being perpendicular to each other. The light guide plate 1419 has the function of introducing the light emitted from the LEDs 1417 in the Y-axis direction, and causing the light to rise and to be emitted toward the optical member 1415 (the front side) while causing the light to propagate therein.

Of the pair of plate surfaces of the light guide plate 1419, the front side plate surface, as illustrated in FIG. 27 and FIG. 28, constitutes a light output plate surface (light emitting surface) 1419a from which the internal light is emitted toward the optical member 1415 and the liquid crystal panel 1411. Among the outer peripheral end surfaces adjacent to the plate surface of the light guide plate 1419, of the pair of long-side end surfaces extending along the X-axis direction (the direction in which the LEDs 1417 are arranged; the long-side direction of the LED substrate 1418), one long-side end surface (the front side in FIG. 25 and FIG. 26) is opposed to the LEDs 1417 (the LED substrate 1418) via a predetermined space, and constitutes a light entry end surface (light input surface) 1419b that the light emitted from the LEDs 1417 directly enters. The light entry end surface 1419b, being opposed to the LEDs 1417, may be referred to as "an LED-opposing end surface (light source-opposing end surface)". The light entry end surface 1419b is a surface which is parallel to the X-axis direction and the Z-axis direction, and which is substantially perpendicular to the light output plate surface 1419a. On the other hand, among the outer peripheral end surfaces of the light guide plate 1419, the portions other than the light entry end surface 1419b (the other long-side end surface and the pair of short-side end surfaces) constitute a no-light entry end surface 1419d that the light emitted from the LEDs 1417 does not directly enter. The no-light entry end surface 1419d, being not opposed to the LEDs 1417, may be referred to as "a no-LED-opposing end surface (a no-light source-opposing end surface)". The no-light entry end surface 1419d includes: a no-light entry opposite end surface 1419d1 constituted by the other end surface of the pair of long-side end surfaces of the outer peripheral end surfaces of the light guide plate 1419, i.e., the end surface on the opposite side from the light entry end surface 1419b; and a pair of no-light entry side end surfaces 1419d2 constituted by a pair of short-side end surfaces adjacent to the light entry end surface 1419b and the no-light entry opposite end surface 1419d1. While in the present embodiment the no-LED-opposing end surface is being described as the "no-light entry end surface 1419d", this does not mean that there is no entry of light at all. For example, if the light that has externally leaked from the no-light entry end surface 1419d is reflected and returned by the side portions 1414c of the chassis 1414, the returning light may enter the no-light entry end surface 1419d.

On the back side of the light guide plate 1419, i.e., an opposite plate surface 1419c on the opposite side from the light output plate surface 1419a, a second reflection sheet (reflection member, light guide plate side reflection sheet) 1425 is disposed so as to overlap the back side. The second reflection sheet 1425 has a white surface for excellent optical reflection, and, by reflecting the light that has propagated in the light guide plate 1419 and reached the opposite plate surface 1419c, causes the light to rise toward the front side, i.e., the light output plate surface 1419a. The second reflection sheet 1425 is disposed so as to cover substantially all of the areas of the opposite plate surface 1419c of the light guide plate 1419. The second reflection sheet 1425 extends to an area superposed with the LED substrate 1418 (LEDs 1417) as viewed in plan, and is disposed so as to sandwich the LED substrate 1418 (LEDs 1417) with the first reflection sheet 1424 on the front side. In this way, the light from the LEDs 1417, by being repeatedly reflected between the reflection sheets 1424, 1425, can efficiently enter the light entry end surface 1419b. On the opposite plate surface 1419c of the light guide plate 1419, alight reflection pattern (not illustrated) is formed, including a light reflecting portion for reflecting the light in the light guide plate 1419 toward the light output plate surface 1419a and thereby promoting the emission of the light from the light output plate surface 1419a. The light reflecting portion of the light reflection pattern includes a number of light reflecting dots of which a distribution density is varied in accordance with the distance from the light entry end surface 1419b (the LEDs 1417). Specifically, the distribution density of the light reflecting dots of the light reflecting portion is increased with increasing distance from the light entry end surface 1419b with respect to the Y-axis direction (with decreasing distance from the no-light entry opposite end surface 1419d1). Conversely, the distribution density is decreased with decreasing distance from the light entry end surface 1419b (with increasing distance from the no-light entry opposite end surface 1419d1). In this way, the output light from the light output plate surface 1419a is controlled to have a uniform in-plane distribution.

Figure 29:
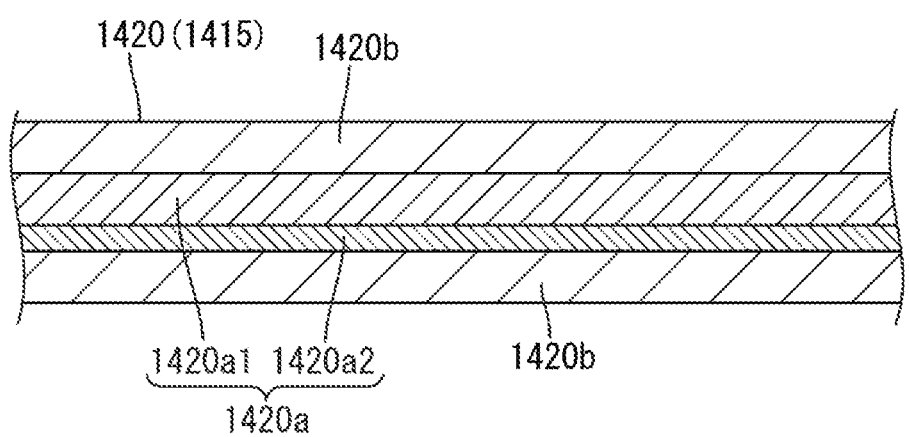
FIG. 29 is a cross sectional view of the wavelength conversion sheet.

The wavelength conversion sheet 1420 will be described in detail. The wavelength conversion sheet 1420, as illustrated in FIG. 27 and FIG. 28, is disposed so as to directly overlap the front side of the light output plate surface 1419a of the light guide plate 1419. The outer peripheral edge portions of the wavelength conversion sheet 1420 are pressed from the front side along the periphery thereof by the flange portion 1416a of the frame 1416. Of the flange portion 1416a of the frame 1416, on the back side surfaces (on the wavelength conversion sheet 1420 side) of the three side portions except for the one long-side portion where the first reflection sheet 1424 is installed, a buffer material 1426 made of PORON (registered trademark), for example, is provided. In this way, the pressing force acting on the wavelength conversion sheet 1420 from the frame 1416 can be released. The wavelength conversion sheet 1420, as illustrated in FIG. 29, is configured of: a phosphor layer (wavelength conversion layer, phosphor film) 1420a containing a phosphor (wavelength conversion substance) for wavelength-converting the light from the LEDs 1417; and a pair of protection layers (protection films) 1420b sandwiching the phosphor layer 1420a from top to bottom to protect the same. The phosphor layer 1420a has a red phosphor and a green phosphor dispersed and compounded therein. The red phosphor emits red light (visible light rays of a specific wavelength region belonging to red) and a green phosphor emits green light (visible light rays of a specific wavelength region belonging to green), using the monochromatic light of blue from the LEDs 1417 as the excitation light. The phosphor layer 1420a includes a film-shaped base member (phosphor carrier) 1420a1 made from substantially transparent synthetic resin, and a phosphor paint 1420a2 coating the base member 1420a1 and having the red phosphor and the green phosphor dispersed and compounded therein. The protection layer 1420b is made from a substantially transparent synthetic resin and film-shaped, and has excellent moisture resistance and the like.

More specifically, each of the phosphors of the respective colors contained in the phosphor layer 1420a uses blue light as the excitation light, and has an emission spectrum as follows. The green phosphor, using blue light as the excitation light, emits light of a wavelength region belonging to green (about 500 nm to about 570 nm), i.e., green light, as fluorescence light. The green phosphor preferably has an emission spectrum with a peak wavelength at about 530 nm in the green light wavelength range, and a half value width of less than 40 nm. The red phosphor, using blue light as the excitation light, emits light of a wavelength region belonging to red (about 600 nm to about 780 nm), i.e., red light, as fluorescence light. The red phosphor preferably has an emission spectrum with a peak wavelength at about 610 nm in the red light wavelength range, and a half value width of less than 40 nm.

Thus, the phosphors of the respective colors are of down-conversion type (down-shifting type) in which the excitation wavelength is shorter than the fluorescence wavelength. The down-conversion type phosphor converts excitation light having a relatively short wavelength and high energy into fluorescence light having a relatively long wavelength and low energy. Accordingly, compared with if an up-conversion type phosphor is used in which the excitation wavelength is longer than the fluorescence wavelength (where the quantum efficiency is on the order of 28%, for example), the quantum efficiency (light conversion efficiency) is higher on the order of 30% to 50%. The phosphors of the respective colors are quantum dot phosphors. The quantum dot phosphor, by confining electrons, holes, or excitons in nano-size (for example, on the order of 2 nm to 10 nm in diameter) semiconductor crystals in all of three-dimensional spatial orientations, has discrete energy levels. By varying the size of the dots, it is possible to select the peak wavelength (emitted light color) and the like of the emitted light as appropriate. The emitted light (fluorescence light) of the quantum dot phosphor has a steep peak in the emission spectrum and a narrow half value width, so that the chromatic purity is extremely high and the color gamut is wide. Examples of the material of the quantum dot phosphor include: material combining Zn, Cd, Hg, Pb, or the like that becomes a divalent cation, and O, S, Se, Te, or the like that become a divalent anion (such as CdSe (cadmium selenide) and ZnS (zinc sulfide)); material combining Ga, In, or the like that becomes a trivalent cation and P, As, Sb or the like that becomes a trivalent anion (such as InP (indium phosphide) and GaAs (gallium arsenide)); and a chalcopyrite type compound (such as CuInSe2). In the present embodiment, as the quantum dot phosphor material, CdSe and ZnS from the above are used in combination. In the present embodiment, the quantum dot phosphors are so-called core-shell type quantum dot phosphor. A core-shell type quantum dot phosphor has a structure in which a quantum dot is covered with a shell including a semiconductor substance with a relatively large band gap. Specifically, as the core-shell type quantum dot phosphor, the "Lumidot (®) CdSe/ZnS" product available from Sigma-Aldrich Japan is preferably used.

As illustrated in FIG. 27 and FIG. 28, in the edge light backlight unit 1412 as in the present embodiment, the light propagating in the light guide plate 1419 is not necessarily entirely emitted from the light output plate surface 1419a, and some of the light may also be emitted from the no-light entry end surfaces 1419d. In particular, the light that is emitted from the LEDs 1417, enters the light entry end surface 1419b of the light guide plate 1419, propagates in the light guide plate 1419, and is then emitted as is from the no-light entry end surfaces 1419d exhibits the color of blue. The light that propagates in the light guide plate 1419 includes the retroreflected light that after having been emitted from the light output plate surface 1419a and reflected by the optical members 1415 and the like, returns into the light guide plate 1419. The retroreflected light tends to have a smaller number of times of reflections, i.e., a smaller number of times of passage through the plate surface-side wavelength conversion portion 1427, on the outer peripheral sides of the light guide plate 1419 than in the center thereof. Accordingly, the retroreflected light that is emitted from the outer peripheral sides of the light guide plate 1419 (including the no-light entry end surfaces 1419d) has a color tint which is closer to the color tint of the light of the LEDs 1417, i.e., blue, than that of the retroreflected light emitted from the center of the light guide plate 1419. Conventionally, it has been difficult to wavelength-convert the light emitted from the no-light entry end surfaces 1419d using the wavelength conversion sheet 1420. Accordingly, once the light leaks externally via a gap between the buffer material 1426 and the light guide plate 1419, for example, the output light of the backlight unit 1412 could have a blue tint only on the outer peripheral sides. As a result, the output light of the backlight unit 1412 has tended to have a color tint difference between the outer peripheral sides and the center.

Accordingly, the backlight unit 1412 according to the present embodiment is configured such that the wavelength conversion sheet 1420, as illustrated in FIG. 27 and FIG. 28, includes: a plate surface-side wavelength conversion portion 1427 disposed so as to overlap the light output plate surface 1419a of the light guide plate 1419; and an end surface-side wavelength conversion portion 1428 which is continuous with the plate surface-side wavelength conversion portion 1427 and disposed so as to overlap the no-light entry end surface 1419d of the light guide plate 1419. In this configuration, the light emitted from the no-light entry end surface 1419d of the light guide plate 1419 (including retroreflected light) can be wavelength-converted by a phosphor contained in the end surface-side wavelength conversion portion 1428. That is, the blue light emitted from the no-light entry end surface 1419d as is after being emitted from the LEDs 1417, entering the light entry end surface 1419b of the light guide plate 1419, and propagating in the light guide plate 1419, or the retroreflected light having a blue color tint (a high content of blue light) due to a small number of times of reflections, is wavelength-converted into green light and red light by green phosphor and red phosphor included in the end surface-side wavelength conversion portion 1428 as the light is transmitted therethrough. In this way, even if the light emitted from the no-light entry end surfaces 1419d is externally leaked via a gap between the buffer material 1426 and the light guide plate 1419, for example, the color tint difference in output light between the center of the backlight unit 1412 and the outer peripheral sides thereof is made difficult to occur, whereby the occurrence of color irregularity is suppressed. In addition, because the end surface-side wavelength conversion portion 1428 is continuous with the plate surface-side wavelength conversion portion 1427, the manufacturing cost of the wavelength conversion sheet 1420 is reduced, and degradation of the contained phosphor is made difficult to occur.

Figure 30:
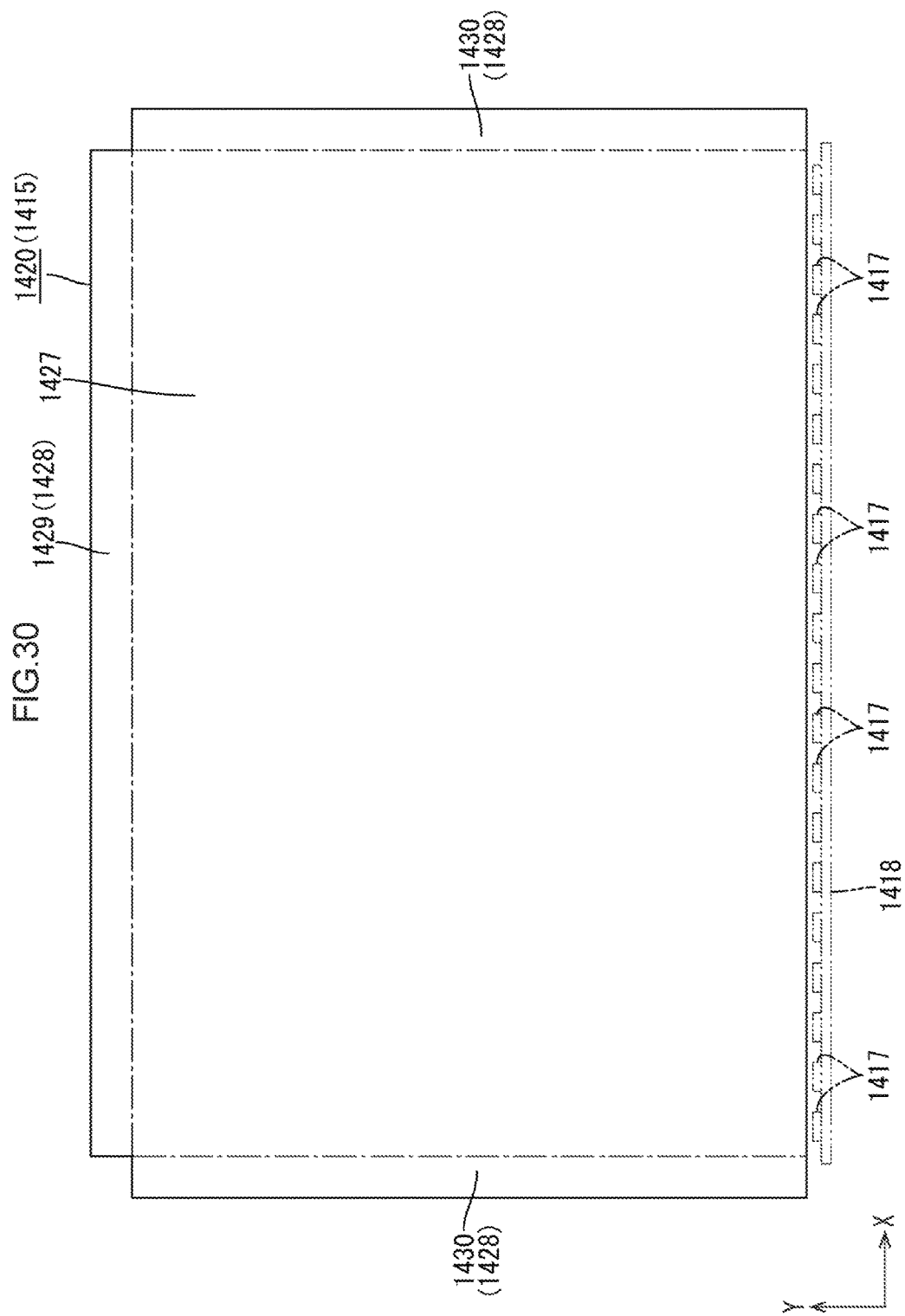
FIG. 30 is a plan view of the wavelength conversion sheet in an expand state.

The plate surface-side wavelength conversion portion 1427 of the wavelength conversion sheet 1420, as illustrated in FIG. 25 and FIG. 30, has a laterally elongated rectangular shape as viewed in plan similar to the light guide plate 1419 and the like, and has a long side dimension and a short side dimension which are approximately the same as the corresponding dimensions of the light guide plate 1419. Three end surface-side wavelength conversion portions 1428 are provided so as to be respectively continuous with the three side portions (the long-side portion on the opposite side from the LEDs 1417, and the pair of short-side portions) of the plate surface-side wavelength conversion portion 1427 except for the one long-side portion on the LEDs 1417 side. In FIG. 25 and FIG. 30, the wavelength conversion sheet 1420 in the expanded state before being folded is illustrated, where the folding position (folding line) of each of the end surface-side wavelength conversion portions with respect to the plate surface-side wavelength conversion portion is indicated by a dashed-and-dotted-line. In FIG. 30, the LEDs 1417 and the LED substrate 1418 are indicated by dashed-and-double-dotted lines.

The end surface-side wavelength conversion portion 1428, as illustrated in FIG. 27 and FIG. 28, is overlapped on the no-light entry end surface 1419d of the light guide plate 1419 by being folded at substantially right angles with respect to the side portions of the plate surface-side wavelength conversion portion 1427 along their extending directions. The end surface-side wavelength conversion portion 1428 includes: an opposite end surface-side wavelength conversion portion 1429 disposed so as to overlap the no-light entry opposite end surface 1419d1 of the no-light entry end surface 1419d of the light guide plate 1419; and a pair of side end surface-side wavelength conversion portions 1430 respectively disposed so as to overlap the pair of no-light entry side end surfaces 1419d2. The opposite end surface-side wavelength conversion portion 1429, as illustrated in FIG. 27, is continuous with the long-side portion of the plate surface-side wavelength conversion portion 1427 on the opposite side from the LEDs 1417 side, and has a length dimension which is substantially the same as the long side dimension of the light guide plate 1419 and a width dimension substantially the same as the thickness dimension of the light guide plate 1419. The opposite end surface-side wavelength conversion portion 1429 overlaps the no-light entry opposite end surface 1419d1 along the entire length range and the entire height range thereof, and covers the entire area of the no-light entry opposite end surface 1419d1 from the outside. The side end surface-side wavelength conversion portions 1430, as illustrated in FIG. 28, are continuous with the pair of short-side portions of the plate surface-side wavelength conversion portion 1427, and has a length dimension which is substantially the same as the short side dimension of the light guide plate 1419, and a width dimension which is substantially the same as the thickness dimension of the light guide plate 1419. The side end surface-side wavelength conversion portions 1430 are respectively overlap the no-light entry side end surfaces 1419d2 along the entire length range and the entire height range thereof, and respectively cover the entire areas of the no-light entry side end surfaces 1419d2 from the outside. That is, the end surface-side wavelength conversion portion 1428, as illustrated in FIG. 27 and FIG. 28, may be said to be disposed so as to overlap all of the areas of the no-light entry end surface 1419d of the light guide plate 1419. In this configuration, the light emitted from the no-light entry opposite end surface 1419d1 that is the no-light entry end surface 1419d of the light guide plate 1419 can be wavelength-converted by a phosphor included in the opposite end surface-side wavelength conversion portion 1429, and the light emitted from the no-light entry side end surfaces 1419d2 can be wavelength-converted by a phosphor included in each of the side end surface-side wavelength conversion portions 1430. In this way, the blue light or the retroreflected light with a blue color tint present in the light guide plate 1419 can be prevented from being emitted as is on the outer peripheral sides of the backlight unit 1412, whereby the occurrence of color irregularity can be effectively suppressed.

The operation of the present embodiment with the above-described structure will be described. When the power supply to the liquid crystal display device 1410 configured as described above is turned on, the driving of the liquid crystal panel 1411 is controlled by a panel control circuit on a control substrate not illustrated. When the drive electric power from an LED drive circuit on a LED drive circuit substrate not illustrated is supplied to the LEDs 1417 on the LED substrate 1418, the driving of the LEDs 17 is controlled. The light from the LEDs 1417 is guided by the light guide plate 1419 and directed to the liquid crystal panel 1411 via the optical members 1415, whereby a predetermined image is displayed on the liquid crystal panel 1411. In the following, the operation of the backlight unit 1412 will be described in detail.

Referring to FIG. 27, when the LEDs 1417 are turned on, the light emitted from the LEDs 1417 enters the light entry end surface 1419b of the light guide plate 1419. While a predetermined space is provided between the LEDs 1417 and the light entry end surface 1419b, the space is sandwiched between the first reflection sheet 1424 on the front side and the extending portion of the second reflection sheet 1425 on the back side. Accordingly, the light from the LEDs 1417 is repeatedly reflected by the opposing portions of the reflection sheets 1424, 1425, whereby the light is caused to efficiently enter the light entry end surface 1419b. The light that has entered the light entry end surface 1419b is scattered and reflected by the light reflection portion of the light reflection pattern and propagates in the light guide plate 1419 while being totally reflected at the interface between the light guide plate 1419 and the external air layer or reflected by the second reflection sheet 1425. Thereby, the angle of incidence of the light with respect to the light output plate surface 1419a becomes less than a critical angle, whereby the emission from the light output plate surface 1419a is promoted. The light that has been emitted from the light output plate surface 1419a of the light guide plate 1419 is provided to the liquid crystal panel 1411 after being subjected to the respective optical actions of the optical members 1415 as the light passes therethrough. Some of the emitted light is retroreflected by the optical members 1415 and thereby returned into the light guide plate 1419. The returned light thereafter exits the light output plate surface 1419a and the like as retroreflected light, and constitutes the output light of the backlight unit 1412.

The optical actions of the optical members 1415 will be described in detail. Referring to FIG. 27, the blue light that has been emitted from the light output plate surface 1419a of the light guide plate 1419 is wavelength-converted into green light and red light (secondary light) by the green phosphor and red phosphor contained in the plate surface-side wavelength conversion portion 1427 on the wavelength conversion sheet 1420 overlapped directly on the front side of the light output plate surface 1419a. The wavelength-converted green light and red light, i.e., yellow light (secondary light) and the blue light from the LEDs 1417 (primary light) produce approximately white illumination light. The blue light from the LEDs 1417 (primary light) and the wavelength-converted green light and red light (secondary light) are subjected to a light condensing action (isotropic light condensing action) by the microlens sheet 1421 isotropically with respect to the X-axis direction and the Y-axis direction, and then subjected to a light condensing action by the prism sheet 1422 selectively with respect to the Y-axis direction (anisotropic light condensing action). Thereafter, of the light that has exited the prism sheet 1422, specific polarization light (p wave) is selectively transmitted by the reflection type polarizing sheet 1423 and emitted toward the liquid crystal panel 1411, while different specific polarization light (s wave) is selectively reflected toward the back side. The s wave reflected by the reflection type polarizing sheet 1423 and the light that is reflected to the back side without being subjected to the light condensing action by prism sheet 1422 and the microlens sheet 1421, for example, are returned into the light guide plate 1419 and again reflected by the second reflection sheet 1425, for example, during the process of propagating in the light guide plate 1419, and are again emitted toward the front side via the light output plate surface 1419*a* and the like.

Referring to FIG. 27 and FIG. 28, the blue light (primary light) emitted from the LEDs 1417 and propagating in the light guide plate 1419 is not necessarily entirely emitted from the light output plate surface 1419*a*. Rather, some of the light may be emitted as is from the no-light entry end surfaces 1419*d* of the outer peripheral end surfaces of the light guide plate 1419. The light propagating in the light guide plate 1419 includes the retroreflected light that has been emitted from the light output plate surface 1419*a* and then returned into the light guide plate 1419. The retroreflected light tends to have a smaller number of times of reflections (the number of times of retroreflection), i.e., a smaller number of times of passage through the plate surface-side wavelength conversion portion 1427, on the outer peripheral side of the light guide plate 1419 than in the center thereof. Accordingly, the retroreflected light emitted from the outer peripheral sides of the light guide plate 1419 (including the no-light entry end surfaces 1419*d*) has a blue tint closer to the color tint of the blue light from the LEDs 1417 compared with the retroreflected light emitted from the center of the light guide plate 1419. In this respect, according to the present embodiment, the wavelength conversion sheet 1420 includes the end surface-side wavelength conversion portion 1428 disposed so as to overlap the no-light entry end surface 1419*d* of the light guide plate 1419. Accordingly, the light emitted from the no-light entry end surface 1419*d* of the light guide plate 1419 (including the retroreflected light) can be wavelength-converted by the phosphor contained in the end surface-side wavelength conversion portion 1428. That is, the blue light (primary light) emitted from the LEDs 1417 and exiting the no-light entry end surface 1419*d* as is after entering the light entry end surface 1419*b* of the light guide plate 1419, or the retroreflected light having a blue color tint (high content of blue light) due to a small number of times of reflections is wavelength-converted into green light and red light (secondary light) by the green phosphor and red phosphor included in the end surface-side wavelength conversion portion 1428 as the light is transmitted therethrough. In this way, even if the light emitted from the no-light entry end surfaces 1419*d* is externally leaked via a gap between the buffer material 1426 and the light guide plate 1419, for example, the color tint difference in output light between the center of the backlight unit 1412 and the outer peripheral sides thereof is made difficult to occur, whereby the occurrence of color irregularity is suppressed. In addition, the no-light entry opposite end surface 1419*d*1 and the pair of no-light entry side end surfaces 1419*d*2 of the no-light entry end surface 1419*d* are covered in all of the areas thereof respectively by the opposite end surface-side wavelength conversion portion 1429 and the pair of side end surface-side wavelength conversion portions 1430 of the end surface-side wavelength conversion portion 1428. Accordingly, the light emitted from the no-light entry end surface 1419*d* can be wavelength-converted into green light and red light by the green phosphor and red phosphor with higher efficiency. In this way, the light emitted from the backlight unit 1412 is made difficult to have a blue tint more on the outer peripheral side than in the center, whereby the color irregularity is made difficult to occur. Accordingly, a decrease in the display quality of the image (television image) displayed in the display region of the liquid crystal panel 1411 is made difficult to occur.

As described above, the backlight unit (lighting device) 1412 of the present embodiment includes: the LEDs (light sources) 1417; the light guide plate 1419 that has, in at least a part of the outer peripheral end surfaces thereof, the light entry end surface 1419*b* that the light from the LEDs 1417 enters, and in which a portion of the outer peripheral end surface except for the light entry end surface 1419*b* constitutes a no-light entry end surface 1419*d* that the light from the LEDs 1417 does not directly enter, and that further has the light output plate surface 1419*a* for causing light to be emitted from a plate surface; and the wavelength conversion sheet (wavelength conversion member) 1420 that contains the phosphor for wavelength-converting the light from the LEDs 1417, the wavelength conversion sheet 1420 including at least the plate surface-side wavelength conversion portion 1427 disposed so as to overlap the light output plate surface 1419*a* of the light guide plate 1419, and the end surface-side wavelength conversion portion 1428 that is continuous with the plate surface-side wavelength conversion portion 1427 and disposed so as to overlap at least a part the no-light entry end surface 1419*d* of the light guide plate 1419.

In this way, the light emitted from the LEDs 1417, after entering the light entry end surface 1419*b* among the outer peripheral end surfaces of the light guide plate 1419 and propagating in the light guide plate 1419, is emitted from the light output plate surface 1419*a*. The light emitted from the light output plate surface 1419*a* is wavelength-converted by the phosphor contained in the plate surface-side wavelength conversion portion 1427 of the wavelength conversion sheet 1420 overlapped on the light output plate surface 1419*a*. In this case, the light propagating in the light guide plate 1419 is not necessarily entirely emitted from the light output plate surface 1419*a*, and some of the light may be emitted from the no-light entry end surface 1419*d* of the outer peripheral end surfaces of the light guide plate 1419. The light propagating in the light guide plate 1419 includes the retroreflected light that has been emitted from the light output plate surface 1419*a* and then returned into the light guide plate 1419. The retroreflected light tends to have a smaller number of times of reflections on the outer peripheral sides of the light guide plate 1419 than in the center thereof. As a result, the retroreflected light emitted from the outer peripheral sides of the light guide plate 1419 (including the no-light entry end surface 1419*d*) has a color tint closer to the color tint of the light of the LEDs 1417 than the retroreflected light emitted from the center of the light guide plate 1419.

In this respect, since the wavelength conversion sheet 1420 includes the end surface-side wavelength conversion portion 1428 disposed so as to overlap at least part of the no-light entry end surface 1419*d* of the light guide plate 1419, the light emitted from the no-light entry end surface 1419*d* of the light guide plate 1419 (including retroreflected light) can be wavelength-converted by a phosphor contained in the end surface-side wavelength conversion portion 1428. Thus, the color tint difference in output light between the center of the backlight unit 1412 and the outer peripheral sides thereof is made difficult to occur, whereby the occurrence of color irregularity is suppressed. In addition, because the end surface-side wavelength conversion portion 1428 is continuous with the plate surface-side wavelength conversion portion 1427, the manufacturing cost for the wavelength conversion sheet 1420 is reduced, and degradation of the contained phosphor is made difficult to occur.

Further, among the outer peripheral end surfaces of the light guide plate 1419, the end surface on the opposite side from the light entry end surface 1419b is the no-light entry opposite end surface 1419d1 constituting the no-light entry end surface 1419d, and the wavelength conversion sheet 1420 has the end surface-side wavelength conversion portion 1428 disposed so as to overlap at least the no-light entry opposite end surface 1419d1. The light emitted from the LEDs 1417 and entering the light entry end surface 1419b of the light guide plate 1419 tends to be easily emitted as is from the no-light entry opposite end surface 1419d1 on the opposite side from the light entry end surface 1419b. However, because the end surface-side wavelength conversion portion 1428 is disposed so as to overlap the no-light entry opposite end surface 1419d1, the light that may be emitted from the no-light entry opposite end surface 1419d1 can be wavelength-converted by the end surface-side wavelength conversion portion 1428, whereby the occurrence of color irregularity can be effectively suppressed.

In addition, among the outer peripheral end surfaces of the light guide plate 1419, the end surfaces adjacent to the light entry end surface 1419b are the no-light entry side end surfaces 1419d2 constituting the no-light entry end surface 1419d, and the wavelength conversion sheet 1420 has the end surface-side wavelength conversion portion 1428 disposed so as to overlap at least the no-light entry side end surfaces 1419d2. The light emitted from the LEDs 1417 and entering the light entry end surface 1419b of the light guide plate 1419 tends to be easily emitted as is from the no-light entry side end surfaces 1419d2 adjacent to the light entry end surface 1419b. However, because the end surface-side wavelength conversion portion 1428 is disposed so as to overlap the no-light entry side end surfaces 1419d2, the light that may be emitted from the no-light entry side end surfaces 1419d2 can be wavelength-converted by the end surface-side wavelength conversion portion 1428, whereby the occurrence of color irregularity can be effectively suppressed.

In addition, the wavelength conversion sheet 1420 has the end surface-side wavelength conversion portion 1428 disposed so as to overlap the entire area of the no-light entry end surface 1419d of the light guide plate 1419. In this way, the light emitted from the no-light entry end surface 1419d can be efficiently wavelength-converted by the end surface-side wavelength conversion portion 1428 disposed so as to overlap the entire area of the no-light entry end surface 1419d, whereby the occurrence of color irregularity can be more effectively suppressed.

In addition, the second reflection sheet (reflection member) 1425 that reflects light is disposed so as to face the opposite plate surface 1419c on the opposite side from the light output plate surface 1419a of the light guide plate 1419. In this way, the light traveling from the light output plate surface 1419a side toward the opposite plate surface 1419c while propagating in the light guide plate 1419 can be reflected by the second reflection sheet 1425 toward the light output plate surface 1419a, whereby the efficiency of propagation of light can be increased.

The LEDs 1417 emits blue light. The wavelength conversion sheet 1420 contains, as the phosphor, at least either a green phosphor that wavelength-converts blue light into green light and a red phosphor that wavelength-converts blue light into red light, or a yellow phosphor that wavelength-converts blue light into yellow light. In this way, the blue light emitted from the LEDs 1417 is wavelength-converted into green light and red light when the green phosphor and the red phosphor are contained in the wavelength conversion sheet 1420, or into yellow light when the yellow phosphor is contained. In this case, the light emitted from the no-light entry end surface 1419d of the light guide plate 1419 is the blue light from the LEDs 1417. Accordingly, if the light is included as is in the output light of the backlight unit 1412, the output light may have a blue color tint more on the outer peripheral side than in the center. In this respect, the light emitted from the no-light entry end surface 1419d of the light guide plate 1419 is wavelength-converted by the end surface-side wavelength conversion portion 1428. Accordingly, the ratio of blue light in the output light from the outer peripheral sides of the backlight unit 1412 can be decreased, whereby the color irregularity can be preferably suppressed.

As the phosphor, the wavelength conversion sheet 1420 contains the quantum dot phosphor. In this way, the light wavelength conversion efficiency of the wavelength conversion sheet 1420 is increased, and the chromatic purity of the wavelength-converted light is increased.

The liquid crystal display device 1410 according to the present embodiment includes the above-described backlight unit 1412, and the liquid crystal panel (display panel) 1411 that displays an image by utilizing the light emitted from the backlight unit 1412. With the liquid crystal display device 1410 of the configuration, because the occurrence of color irregularity in the output light of the backlight unit 1412 is suppressed, a display with excellent display quality can be achieved.

The television device 1410TV according to the present embodiment includes the liquid crystal display device 1410 as described above. With the television device 1410TV, because the liquid crystal display device 1410 has excellent display quality, a display of a television image with excellent display quality can be achieved.

Sixteenth Embodiment

A sixteenth embodiment of the present invention will be described with reference to FIG. 31. The sixteenth embodiment describes a modification of the configuration of a wavelength conversion sheet 15120. Redundant descriptions of the structures, operations, and effects similar to those of the fifteenth embodiment will be omitted.

Figure 31:
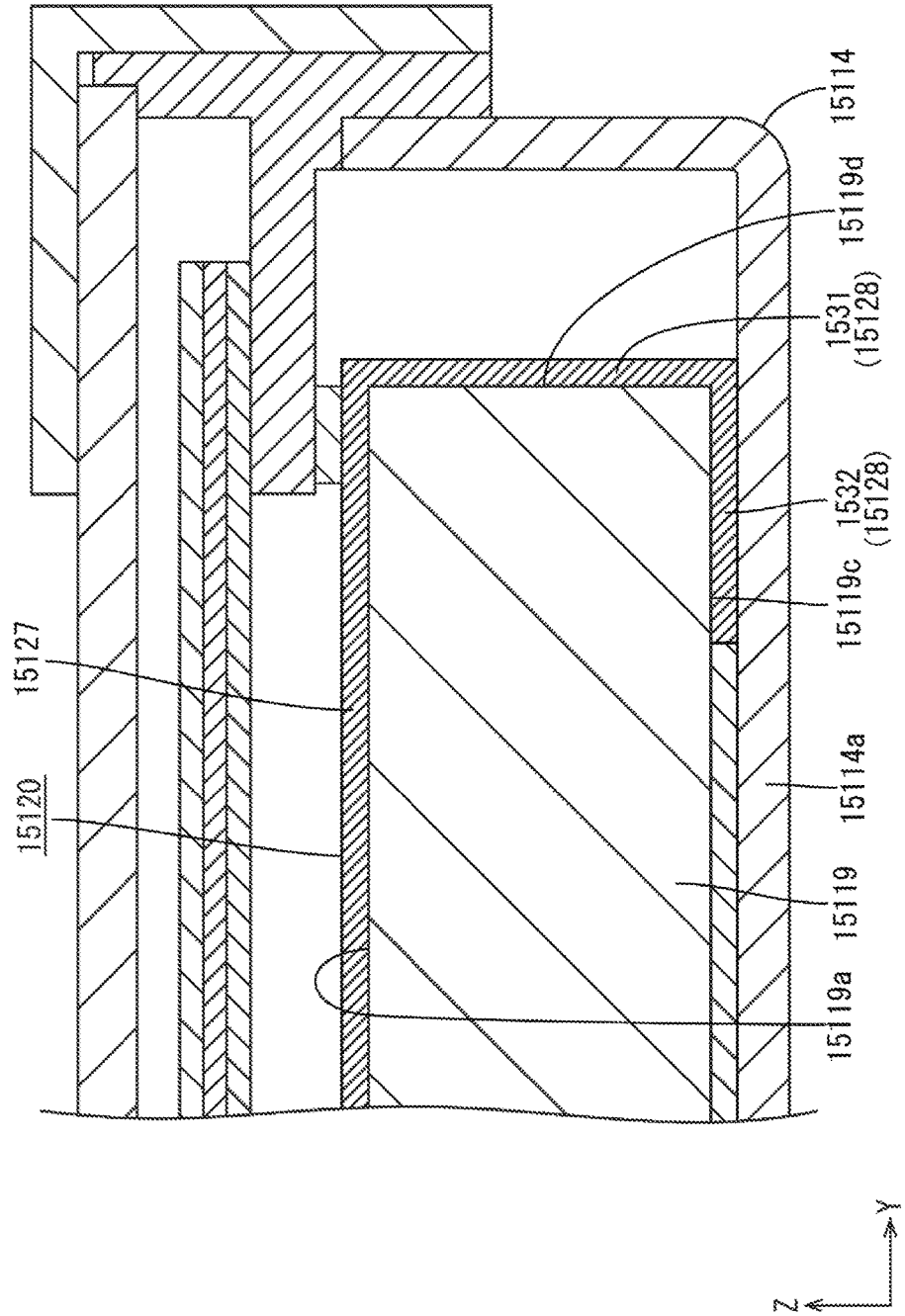
FIG. 31 is a cross sectional view of an end portion of a liquid crystal display device according to a sixteenth embodiment of the present invention.

According to the present embodiment, in the wavelength conversion sheet 15120, as illustrated in FIG. 31, an end surface-side wavelength conversion portion 15128 includes: a no-light entry end surface overlapping portion 1531 overlapping a no-light entry end surface 15119d; and an opposite plate surface overlapping portion 1532 overlapping an opposite plate surface 15119c of a light guide plate 15119. That is, the wavelength conversion sheet 15120 is folded at portions on the no-light entry end surface 15119d side, and the end portion of the light guide plate 15119 on the no-light entry end surface 15119d side is enclosed by the plate surface-side wavelength conversion portion 15127 and the end surface-side wavelength conversion portion 15128. The opposite plate surface overlapping portion 1532 of the end surface-side wavelength conversion portion 15128 is sandwiched between a bottom portion 15114a of a chassis 15114 and the light guide plate 15119, whereby the end surface-side wavelength conversion portion 15128 is held in place. Accordingly, the no-light entry end surface overlapping portion 1531 of the end surface-side wavelength conversion portion 15128 is maintained in a stable positional relationship with respect to the no-light entry end surface 15119d. Accordingly, even if light is emitted from the no-light entry end surface 15119d, the light can be wavelength-converted with high efficiency by the no-light entry end surface overlapping portion 1531 having a stable positional relationship with the no-light entry end surface 15119d.

As described above, according to the present embodiment, the chassis 15114 includes the bottom portion 15114a supporting the light guide plate 15119 from the side opposite to the light output plate surface 15119a. The wavelength conversion sheet 15120 is configured such that the end surface-side wavelength conversion portion 15128 includes: the no-light entry end surface overlapping portion 1531 overlapping the no-light entry end surface 15119d; and the opposite plate surface overlapping portion 1532 which is disposed so as to overlap the outer edge portion of the opposite plate surface 15119c of the light guide plate 15119 on the opposite side from the light output plate surface 15119a, and which is sandwiched between the opposite plate surface 15119c and the bottom portion 15114a of the chassis 15114. Thus, the opposite plate surface overlapping portion 1532 is disposed so as to overlap the outer edge portion of the opposite plate surface 15119c of the light guide plate 15119, and is sandwiched between the outer edge portion and the bottom portion 15114a of the chassis 15114, whereby the end surface-side wavelength conversion portion 15128 is held in place. Accordingly, the no-light entry end surface overlapping portion 1531 overlapping the no-light entry end surface 15119d is maintained in a stable positional relationship with respect to the no-light entry end surface 15119d. In this way, light emitted from the no-light entry end surface 15119d can be wavelength-converted with high efficiency by the no-light entry end surface overlapping portion 1531.

Seventeenth Embodiment

A seventeenth embodiment of the present invention will be described with reference to FIG. 32 or FIG. 33. The seventeenth embodiment describes a modification of the sixteenth embodiment in the configuration of an opposite plate surface overlapping portion 16232. Redundant descriptions of the structures, operations, and effects similar to those of the seventeenth embodiment will be omitted.

Figure 32:
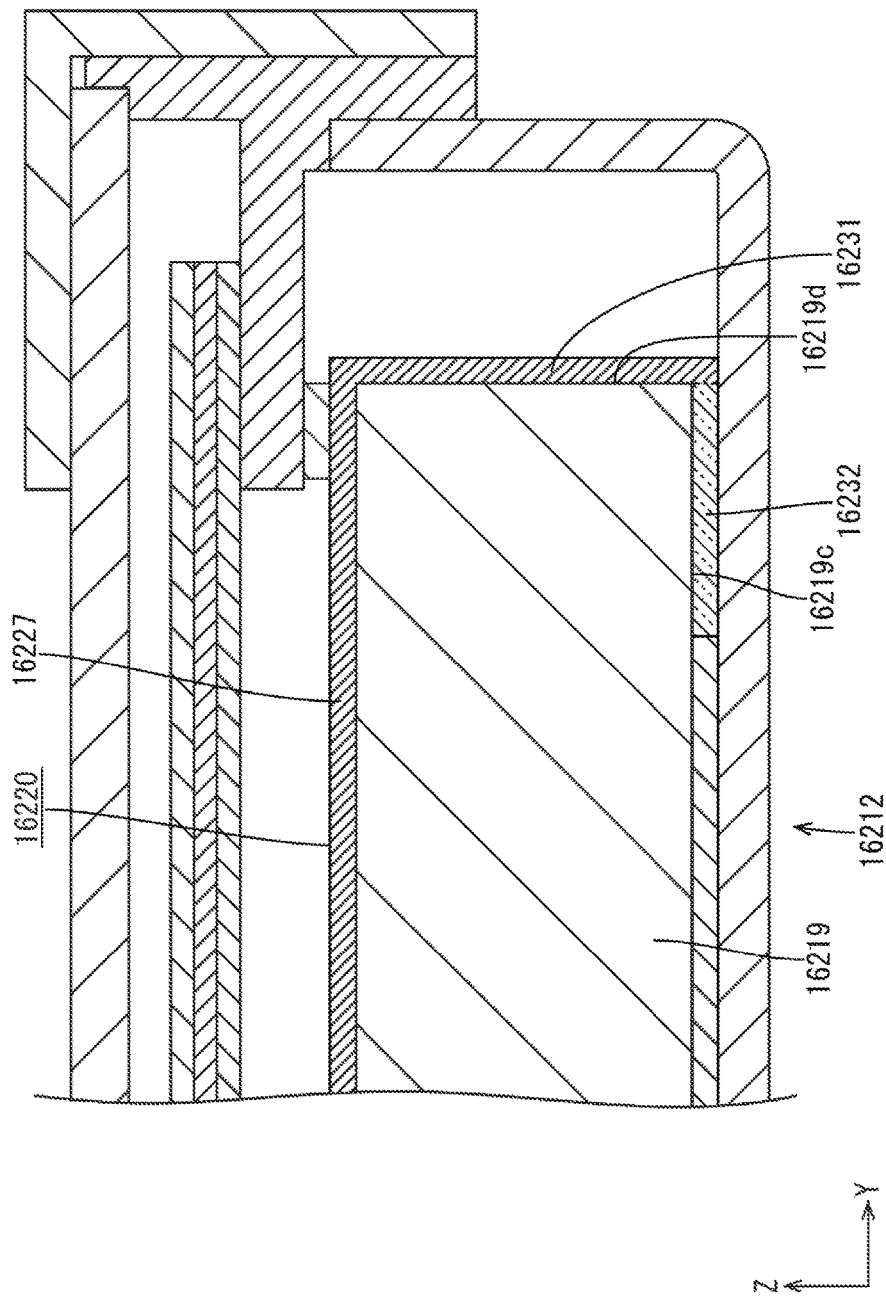
FIG. 32 is a cross sectional view of an end portion of a liquid crystal display device according to a seventeenth embodiment of the present invention.

According to the present embodiment, a wavelength conversion sheet 16220, as illustrated in FIG. 32, has a varying phosphor distribution density between a no-light entry end surface overlapping portion 16231 and an opposite plate surface overlapping portion 16232. Specifically, the opposite plate surface overlapping portion 16232 has a lower phosphor distribution density than the no-light entry end surface overlapping portion 16231. In this configuration, compared with if the phosphor distribution density is the same between the opposite plate surface overlapping portion and the no-light entry end surface overlapping portion, when the light propagating in a light guide plate 16219 reaches the outer edge portion of an opposite plate surface 16219c of the light guide plate 16219, the light is not easily excessively wavelength converted by the opposite plate surface overlapping portion 16232. In this way, the output light from the outer peripheral side of the backlight unit 16212 is prevented from easily excessively wavelength-converted to have a yellow tint. Specifically, in the wavelength conversion sheet 16220, a plate surface-side wavelength conversion portion 16227 and the no-light entry end surface overlapping portion 16231 constitute phosphor located regions in which phosphor is located. On the other hand, the opposite plate surface overlapping portion 16232 constitutes a non-phosphor located region in which no phosphor is located and which has a substantially zero phosphor distribution density. In this configuration, the light propagating in the light guide plate 16219 and reaching the no-light entry end surface 16219d of the light guide plate 16219 is wavelength-converted by the phosphor located in the no-light entry end surface overlapping portion 16231, i.e., a phosphor located region. However, the light reaching the outer edge portion of the opposite plate surface 16219c of the light guide plate 16219 is prevented from being wavelength-converted in the opposite plate surface overlapping portion 16232, which is a non-phosphor located region. In this way, the problem of the output light from the outer peripheral side of the backlight unit 16212 being excessively wavelength-converted to have a yellow tint can be more preferably suppressed. In addition, the phosphor located regions of the plate surface-side wavelength conversion portion 16227 and the no-light entry end surface overlapping portion 16231 have substantially the same phosphor distribution density. In FIG. 32, the cross section of the non-phosphor located region of the opposite plate surface overlapping portion 16232 is indicated by hatching different from the hatching indicating the cross sections of the phosphor located regions of the plate surface-side wavelength conversion portion 16227 and the no-light entry end surface overlapping portion 16231.

Figure 33:
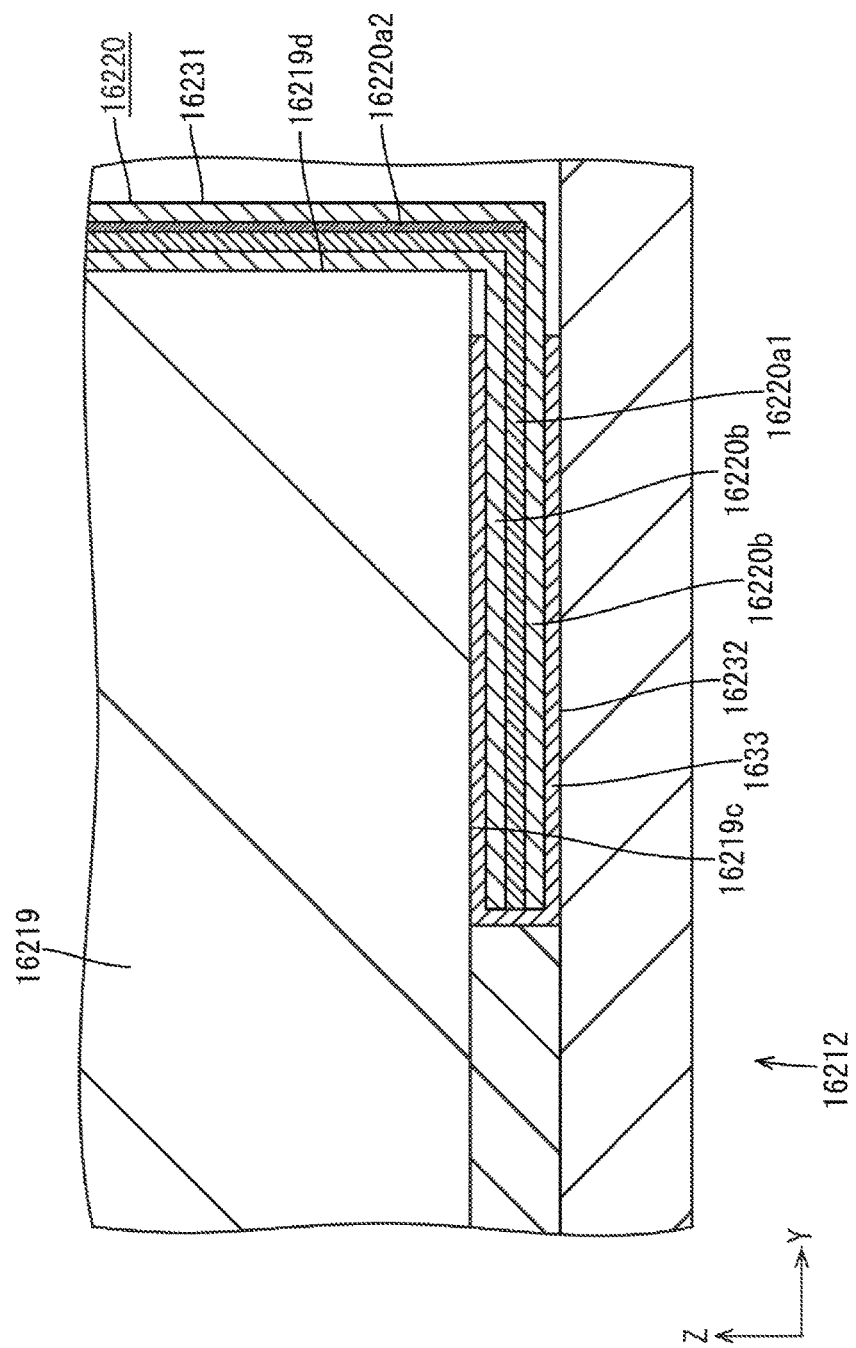
FIG. 33 is an enlarged cross sectional view of the end portion of the liquid crystal display device.

Specifically, the no-light entry end surface overlapping portion 16231, as illustrated in FIG. 33, is configured from a base member 16220a1 coated with a phosphor paint 16220a2 in substantially the entire area thereof. On the other hand, the opposite plate surface overlapping portion 16232 is configured from a base member 16220a1 of which substantially the entire area is not coated with the phosphor paint 16220a2. In addition, the opposite plate surface overlapping portion 16232 is provided with a seal portion 1633 for sealing the phosphor contained in the plate surface-side wavelength conversion portion 16227 and the no-light entry end surface overlapping portion 16231. The seal portion 1633 is disposed so as to sandwich the base member 16220a1 and a pair of protection layers 16220b of the opposite plate surface overlapping portion 16232 collectively while sealing the outer edges thereof. In this configuration, the phosphor is sealed by the seal portion 1633, whereby degradation of the phosphor included in the plate surface-side wavelength conversion portion 16227 and the opposite plate surface overlapping portion 16232 due to moisture absorption and the like is made difficult to occur.

As described above, according to the present embodiment, in the wavelength conversion sheet 16220, the opposite plate surface overlapping portion 16232 has a lower phosphor distribution density than the no-light entry end surface overlapping portion 16231. In this way, compared with if the phosphor distribution density is made the same between the opposite plate surface overlapping portion and the no-light entry end surface overlapping portion, the light propagating in the light guide plate 16219 and reaching the outer edge portion of the opposite plate surface 16219c of the light guide plate 16219 is not easily excessively wavelength converted by the opposite plate surface overlapping portion 16232. In this way, the output light from the outer peripheral side of the backlight unit 16212 is prevented from easily excessively wavelength converted.

In addition, in the wavelength conversion sheet 16220, the no-light entry end surface overlapping portion 16231 is a phosphor located region with phosphor located therein, whereas the opposite plate surface overlapping portion 16232 is a non-phosphor located region having no phosphor located therein. In this way, the light propagating in the light guide plate 16219 and reaching the no-light entry end surface 16219d of the light guide plate 16219 is wavelength-converted by the phosphor located in the phosphor located region of the no-light entry end surface overlapping portion 16231. On the other hand, the light reaching the outer edge portion of the opposite plate surface 16219c of the light guide plate 16219 is prevented from being wavelength-converted in the non-phosphor located region of the opposite plate surface overlapping portion 16232. In this way, the problem of the output light from the outer peripheral side of the backlight unit 16212 being easily excessively wavelength-converted can be more preferably suppressed.

In addition, in the wavelength conversion sheet 16220, the opposite plate surface overlapping portion 16232 is provided with the seal portion 1633 sealing the phosphor. In this way, because the phosphor is sealed by the seal portion 1633, degradation of the phosphor included in the opposite plate surface overlapping portion 16232 due to moisture absorption and the like is made difficult to occur.

Eighteenth Embodiment

An eighteenth embodiment of the present invention will be described with reference to FIG. 34. The eighteenth embodiment describes a modification of the fifteenth embodiment in which the end surface-side wavelength conversion portion is bonded to the no-light entry end surface of the light guide plate. Redundant descriptions of the structures, operations, and effects similar to those of the fifteenth embodiment will be omitted.

Figure 34:
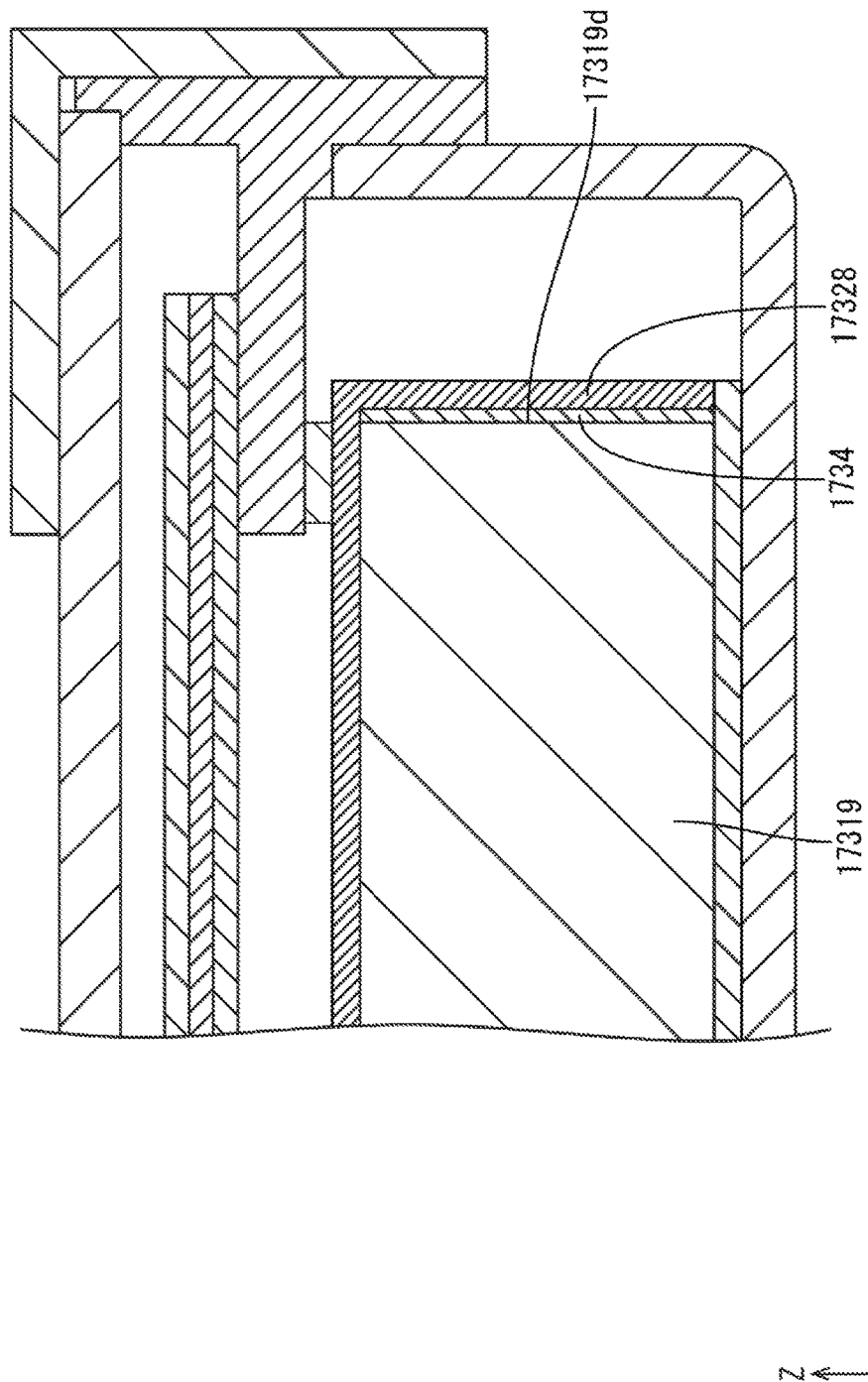
FIG. 34 is a cross sectional view of an end portion of a liquid crystal display device according to an eighteenth embodiment of the present invention.

According to the present embodiment, as illustrated in FIG. 34, an end surface-side wavelength conversion portion 17328 is bonded to a no-light entry end surface 17319d of a light guide plate 17319 via an adhesive layer 1734. The adhesive layer 1734 is made of a transparent optical adhesive film of, e.g., an optical clear adhesive (OCA), and disposed so as to be interposed between the no-light entry end surface 17319d of the light guide plate 17319 and the end surface-side wavelength conversion portion 17328. In this configuration, the adhesive layer 1734 allows the end surface-side wavelength conversion portion 17328 to be maintained in a stable positional relationship with respect to the no-light entry end surface 17319d of the light guide plate 17319. Accordingly, the light that may be emitted from the no-light entry end surface 17319d of the light guide plate 17319 can be wavelength-converted with high efficiency by the end surface-side wavelength conversion portion 17328. In addition, multiple reflection is promoted at the interface between the end surface-side wavelength conversion portion 17328 and the adhesive layer 1734 or the interface between the no-light entry end surface 17319d and the adhesive layer 1734. As a result, the light wavelength conversion efficiency of the end surface-side wavelength conversion portion 17328 is increased.

As described above, according to the present embodiment, the adhesive layer 1734 is disposed so as to be interposed between the end surface-side wavelength conversion portion 17328 and the no-light entry end surface 17319d of the light guide plate 17319. In this way, the adhesive layer 1734 allows the end surface-side wavelength conversion portion 17328 to be maintained in a stable positional relationship with respect to the no-light entry end surface 17319d of the light guide plate 17319. Accordingly, the light that may be emitted from the no-light entry end surface 17319d of the light guide plate 17319 can be wavelength-converted with high efficiency by the end surface-side wavelength conversion portion 17328. In addition, multiple reflection is promoted at the interface between the end surface-side wavelength conversion portion 17328 and the adhesive layer 1734, or the interface between the no-light entry end surface 17319d and the adhesive layer 1734. As a result, the light wavelength conversion efficiency of the end surface-side wavelength conversion portion 17328 is increased.

Nineteenth Embodiment

A nineteenth embodiment of the present invention will be described with reference to FIG. 35. The nineteenth embodiment describes a modification of the fifteenth embodiment in the location of the end surface-side wavelength conversion portion. Redundant descriptions of the structures, operations, and effects similar to those of the fifteenth embodiment will be omitted.

Figure 35:
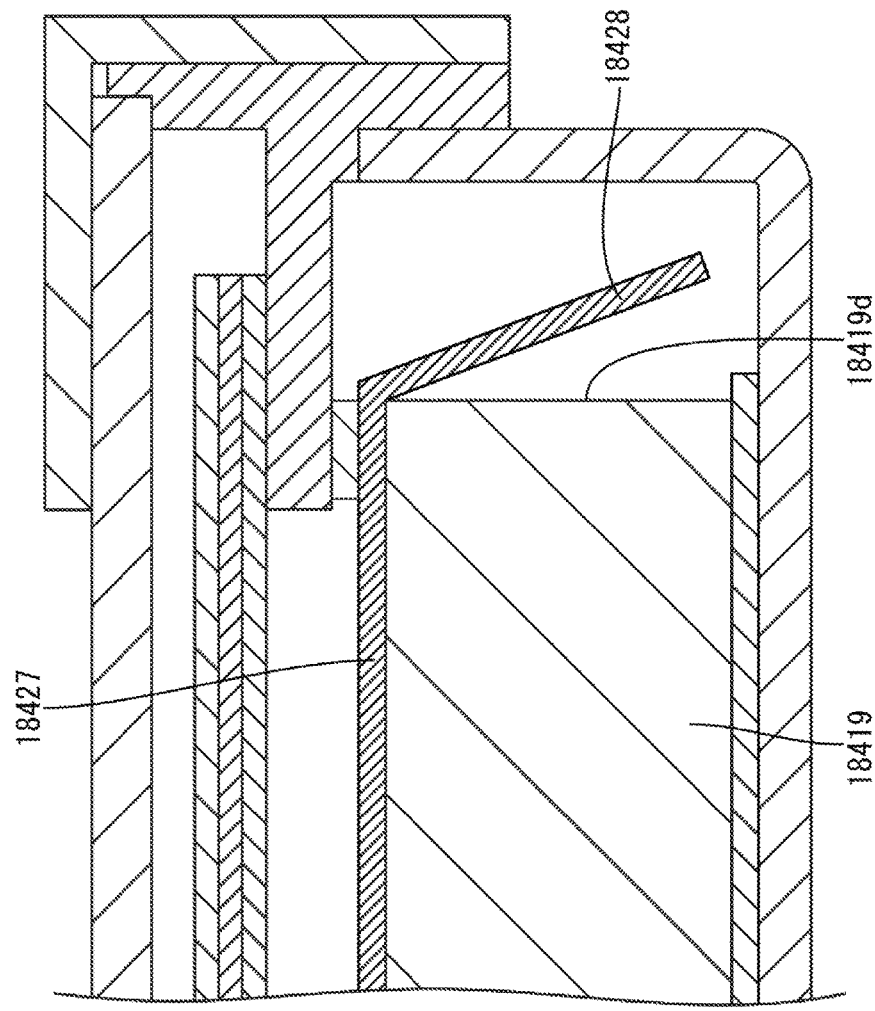
FIG. 35 is a cross sectional view of an end portion of a liquid crystal display device according to a nineteenth embodiment of the present invention.

According to the present embodiment, an end surface-side wavelength conversion portion 18428, as illustrated in FIG. 35, is disposed so as to form an obtuse angle with respect to a plate surface-side wavelength conversion portion 18427. That is, the end surface-side wavelength conversion portion 18428 is bent at a bending angle of 90 degrees or more with respect to the plate surface-side wavelength conversion portion 18427, and is disposed so as to be spaced from a no-light entry end surface 18419d of a light guide plate 18419. The end surface-side wavelength conversion portion 18428 has an inclined cross sectional shape as a whole such that the distance from the no-light entry end surface 18419d of the light guide plate 18419 gradually increases from the proximal end side continuous with the outer edge portion (side portions) of the plate surface-side wavelength conversion portion 18427 toward the end side. In this configuration, too, most of the light emitted from the no-light entry end surface 18419d of the light guide plate 18419 is transmitted through the end surface-side wavelength conversion portion 18428 and wavelength-converted therein.

Twentieth Embodiment

A twentieth embodiment of the present invention will be described with reference to FIG. 36. The twentieth embodiment describes a modification of the nineteenth embodiment in the shape of the end surface-side wavelength conversion portion. Redundant descriptions of the structures, operations, and effects similar to those of the nineteenth embodiment will be omitted.

Figure 36:
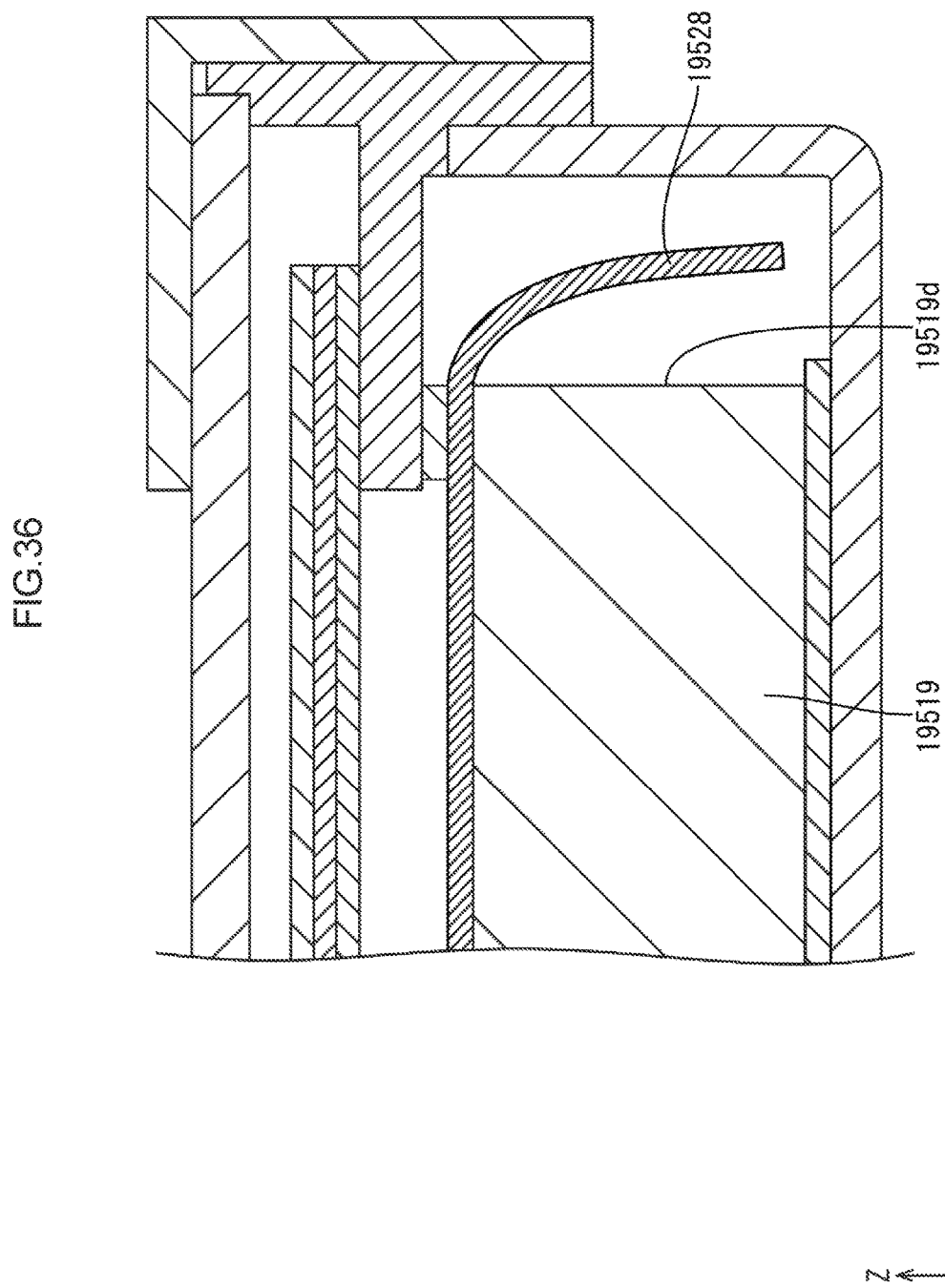
FIG. 36 is a cross sectional view of an end portion of a liquid crystal display device according to a twentieth embodiment of the present invention.

According to the present embodiment, an end surface-side wavelength conversion portion 19528, as illustrated in FIG. 36, has a substantially arcuate (curved) cross sectional shape. In this configuration, too, most of the light emitted from a no-light entry end surface 19519d of a light guide plate 19519 is transmitted through the end surface-side wavelength conversion portion 19528 and wavelength-converted therein.

Twenty-First Embodiment

A twenty-first embodiment of the present invention will be described with reference to FIG. 37. The twenty-first embodiment describes a modification of the fifteenth embodiment in the configuration of the end surface-side wavelength conversion portion. Redundant descriptions of the structures, operations, and effects similar to those of the fifteenth embodiment will be omitted.

According to the present embodiment, an end surface-side wavelength conversion portion 20628, as illustrated in FIG. 37, includes a pair of side end surface-side wavelength conversion portions 20630 respectively continuous with a pair of short-side portions of a plate surface-side wavelength conversion portion 20627. Accordingly, the end surface-side wavelength conversion portion 20628 (opposite end surface-side wavelength conversion portion) is not provided in the long-side portion of the plate surface-side wavelength conversion portion 20627 on the opposite side from the LEDs 20617 side. In this configuration, too, the light that may be emitted from the pair of no-light entry side end surfaces of the light guide plate can be wavelength-converted by the pair of side end surface-side wavelength conversion portions 20630. In FIG. 37, the LEDs 20617 and an LED substrate 20618 are indicated by dashed-and-double-dotted lines.

Twenty-Second Embodiment

A twenty-second embodiment of the present invention will be described with reference to FIG. 38. The twenty-second embodiment describes a modification of the fifteenth embodiment in the configuration of the end surface-side wavelength conversion portion. Redundant descriptions of the structures, operations, and effects similar to those of the fifteenth embodiment will be omitted.

According to the present embodiment, an end surface-side wavelength conversion portion 21728, as illustrated in FIG. 38, includes an opposite end surface-side wavelength conversion portion 21729 continuous with the long-side portion of a plate surface-side wavelength conversion portion 21727 on the opposite side from the LEDs 21717 side. Accordingly, the end surface-side wavelength conversion portion 21728 (side end surface-side wavelength conversion portion) is not provided in the pair of short-side portions of the plate surface-side wavelength conversion portion 21727. In this configuration, too, the light that may be emitted from the no-light entry opposite end surface of the light guide plate can be wavelength-converted by the opposite end surface-side wavelength conversion portion 21729. In FIG. 38, the LEDs 21717 and an LED substrate 21718 are indicated by dashed-and-double-dotted lines.

Other Embodiments

The present invention is not limited to the above embodiments explained in the above description and described with reference to the drawings. The following embodiments may be included in the technical scope of the present invention, for example.

(1) In the first to fourteenth embodiments, the inclined plate surface and the inclined reflection portion are respectively provided so as to extend along the entire length of each of the side portions constituting the outer peripheral side portions of the light guide plate by way of example. However, it is also possible to adopt a configuration in which the inclined plate surface and the inclined reflection portion are respectively provided in a range less than the entire length of each of the side portions constituting the outer peripheral side portions of the light guide plate. That is, a configuration may be adopted in which the inclined plate surface and the inclined reflection portion are partly disposed in the length direction with respect to each of the side portions constituting the outer peripheral side portions of the light guide plate. In this case, it is particularly preferable to adopt a configuration in which the inclined plate surface and the inclined reflection portion are selectively provided with respect to angular portions at the four corners of the outer peripheral side portions of the light guide plate.

(2) Other than those illustrated in the first to fourteenth embodiments, the specific numerical values of the inclination angles of the inclined plate surface and the inclined reflection portion with respect to the light output plate surface may be modified as appropriate. In addition, the specific numerical value of the minimum value (thickness dimension in the vicinity of the outer peripheral end surface) of the thickness dimension of the portion, among the outer peripheral side portions of the light guide plate, in which the inclined plate surface is provided may be modified as appropriate. In addition, the specific numerical value of the width dimension of the inclined plate surface (the distance from the position of boundary with the parallel plate surface to the outer peripheral end surface of the light guide plate as viewed in plan) may be modified as appropriate. The specific numerical values of the other portions constituting the backlight unit and the liquid crystal display device may be modified as appropriate.

(3) In the first to fourteenth embodiments, it is possible to modify and optimize, as appropriate, the design of the light reflecting portion of the light reflection pattern in accordance with the inclination angle, the formed area, the location, and the like of the inclined plate surface and the inclined reflection portion with respect to the light output plate surface.

(4) In the first to fourteenth embodiments (except for the fourth embodiment), the case has been described by way of example in which the adhesive layer is interposed between the inclined plate surface of the light guide plate and the inclined reflection portions of the reflection sheet. However, the inclined reflection portion may be held with respect to the inclined plate surface of the light guide plate without using the adhesive layer by, for example, welding the inclined reflection portion to the inclined plate surface of the light guide plate by thermal welding or ultrasonic welding.

(5) In the second embodiment, the configuration has been described by way of example in which the width dimension of the parallel plate surface-side inclined plate surface and the width dimension of the outer peripheral end surface-side inclined plate surface are substantially the same. However, it is also possible to adopt a configuration in which one of the width dimension of the parallel plate surface-side inclined plate surface and the width dimension of the outer peripheral end surface-side inclined plate surface is greater than the other. Similarly, in the configuration described in the seventh embodiment, the dimensional relationship among the width dimension of the parallel plate surface-side inclined plate surface, the width dimension of the outer peripheral end surface-side inclined plate surface, and the width dimension of the intermediate inclined plate surface may also be modified as appropriate.

(6) In the second and seventh embodiments, the configuration has been described by way of example in which the inclination angles of the inclined plate surface and the inclined reflection portion with respect to the light output plate surface are varied in two or three steps. However, it is also possible to adopt a configuration in which the inclination angles of the inclined plate surface and the inclined reflection portion with respect to the light output plate surface is varied in four or more steps.

(7) In the fourth embodiment, the inclined reflection portion is supported by the support member by way of example. However, the inclined reflection portion may be supported by the support member in addition to using the adhesive layer described in the first embodiment.

(8) In the fourth embodiment, the configuration has been described by way of example in which the entire area of the inclined reflection portion is supported by the support member. However, it is also possible to adopt a configuration in which the inclined reflection portion is partly supported by the support member.

(9) In the fifth and sixth embodiments, the specific numerical value of the curvature radius and the like in the inclined plate surface and the inclined reflection portion may be modified as appropriate.

(10) In the first embodiment, the one-side light entry-type backlight unit has been described by way of example in which the other long-side end surface of the light guide plate constitutes the no-light entry end surface. However, the present invention is also applicable to a one-side light entry-type backlight unit in which one long-side end surface of the light guide plate constitutes the no-light entry end surface.

(11) In the tenth embodiment, the one-side light entry-type backlight unit has been described by way of example in which the other short-side end surface of the light guide plate constitutes the no-light entry end surface. However, the present invention is also applicable to a one-side light entry-type backlight unit in which one short-side end surface of the light guide plate constitutes the no-light entry end surface.

(12) In the thirteenth embodiment, the three-side light entry-type backlight unit has been described by way of example in which the other short-side end surface of the light guide plate constitutes the no-light entry end surface. However, the present invention is also applicable to a three-side light entry-type backlight unit in which either one short-side end surface or one of the pair of long-side end surfaces of the of the light guide plate constitutes the no-light entry end surface.

(13) The configuration described in the second embodiment may be combined with the configurations described in the third to sixth embodiments, and the eighth to the fourteenth embodiments.

(14) The configuration described in the third embodiment may be combined with the configuration described in the fourth to thirteenth embodiments.

(15) The configuration described in the fourth embodiment may be combined with the configuration described in the fifth to fourteenth embodiments.

(16) The configuration described in the fifth and sixth embodiments may be combined with the configuration described in the seventh to fourteenth embodiments.

(17) The configuration described in the seventh embodiment may be combined with the configuration described in the eighth to fourteenth embodiments.

(18) The configuration described in the ninth embodiment may be combined with the configuration described in the tenth embodiment.

(19) In the fifteenth to twenty-second embodiments, the configuration has been indicated in which the opposite end surface-side wavelength conversion portion overlaps the entire area of the no-light entry opposite end surface, and in which the side end surface-side wavelength conversion portion overlaps the entire area of the no-light entry side end surface. However, it is possible to adopt a configuration in which the opposite end surface-side wavelength conversion portion partly overlaps the no-light entry opposite end surface and does not overlap the remaining portion. It is also possible to adopt a configuration in which the side end surface-side wavelength conversion portion partly overlaps the no-light entry side end surface and does not overlap the remaining portions. In this case, a part of the no-light entry opposite end surface with respect to the height direction and/or the length direction may have an overlapping relationship with the opposite end surface-side wavelength conversion portion. Alternatively, a part of the no-light entry side end surface with respect to the height direction and/or the length direction may have an overlapping relationship with the side end surface-side wavelength conversion portion.

(20) In the configurations described in the sixteenth and seventeenth embodiments, the opposite end surface-side wavelength conversion portion overlapping the no-light entry opposite end surface and/or the side end surface-side wavelength conversion portion overlapping the no-light entry side end surface may be provided with the opposite plate surface overlapping portion.

(21) In the seventeenth embodiment, the configuration has been indicated in which the opposite plate surface overlapping portion of the end surface-side wavelength conversion portion is not coated with the phosphor paint. However, it is also possible to adopt a configuration in which the opposite plate surface overlapping portion of the end surface-side wavelength conversion portion is coated with the phosphor paint having a phosphor distribution density lower than a phosphor distribution density of the phosphor paint coated on the plate surface-side wavelength conversion portion and the no-light entry end surface overlapping portion. The phosphor distribution density may be varied by, for example, varying the number of times of application of the phosphor paint so as to cause a difference in phosphor paint film thickness, while using the same phosphor paint between the plate surface-side wavelength conversion portion and the no-light entry end surface overlapping portion and the opposite plate surface overlapping portion. Alternatively, phosphor paints with different phosphor content concentrations may be used between the plate surface-side wavelength conversion portion and no-light entry end surface overlapping portion and the opposite plate surface overlapping portion.

(22) In the seventeenth embodiment, the case has been indicated in which the opposite plate surface overlapping portion of the end surface-side wavelength conversion portion is provided with the seal portion. However, the seal portion may be omitted.

(23) In the configuration described in the eighteenth embodiment, the adhesive layer may be provided between the opposite end surface-side wavelength conversion portion overlapping the no-light entry opposite end surface and the no-light entry opposite end surface of the light guide plate, and/or between the side end surface-side wavelength conversion portion overlapping the no-light entry side end surface and the no-light entry side end surface of the light guide plate.

(24) In the eighteenth embodiment, the case has been described by way of example in which the adhesive layer is interposed between the no-light entry end surface of the light guide plate and the end surface-side wavelength conversion portion. However, the end surface-side wavelength conversion portion may be attached to the no-light entry end surface of the light guide plate without using the adhesive layer by, for example, welding the end surface-side wavelength conversion portion to the no-light entry end surface of the light guide plate by thermal welding or ultrasonic welding.

(25) In the eighteenth embodiment, the case has been described by way of example in which, as the adhesive layer interposed between the no-light entry end surface of the light guide plate and the end surface-side wavelength conversion portion, a transparent optical adhesive film of OCA and the like is used. However, it is also possible to use, as the adhesive layer, a substantially transparent adhesive, a substantially transparent photocurable resin (including a UV curable resin), or a substantially transparent both-sided tape, for example.

(26) In the configuration described in the nineteenth and the twentieth embodiments, the opposite end surface-side wavelength conversion portion overlapping the no-light entry opposite end surface and/or the side end surface-side wavelength conversion portion overlapping the no-light entry side end surface may have an inclined or substantially arcuate cross sectional shape.

(27) In the twenty-first and twenty-second embodiments, the case has been indicated in which the end surface-side wavelength conversion portion is configured from either the opposite end surface-side wavelength conversion portion or the pair of side end surface-side wavelength conversion portions. However, it is also possible to configure the end surface-side wavelength conversion portion from the opposite end surface-side wavelength conversion portion and one of the side end surface-side wavelength conversion portions. Alternatively, the end surface-side wavelength conversion portion may be configured from only one of the side end surface-side wavelength conversion portions.

(28) The configuration described in the sixteenth and seventeenth embodiments may be combined with the configuration described in the eighteenth to twenty-second embodiments.

(29) The configuration described in the eighteenth embodiment may be combined with the configuration described in the nineteenth to twenty-second embodiments.

(30) The configuration described in the nineteenth and twentieth embodiments may be combined with the configuration described in the twenty-first and twenty-second embodiments.

(31) In the foregoing embodiments, the configuration has been described by way of example in which four optical members are provided. However, it is also possible to modify the number of the optical members to three or less or five or more. In addition, the type of the optical members used except for the wavelength conversion sheet may also be modified as appropriate. For example, it is also possible to use a diffusion sheet. In addition, the specific order in which the optical members of the wavelength conversion sheet are stacked may be modified as appropriate.

(32) In the foregoing embodiments, the configuration has been described by way of example in which the wavelength conversion sheet is placed, together with the other optical members, on the front side with respect to the frame. However, it is also possible to adopt a configuration in which the wavelength conversion sheet is directly placed on the front side with respect to the light guide plate. In addition, it is also possible to stack one or a plurality of other optical members (such as a microlens sheet, a prism sheet, or a reflection type polarizing sheet) between the light guide plate and the wavelength conversion sheet.

(33) In the foregoing embodiments, the case has been described in which the LEDs emitting single-color light of blue are used as the light source. However, it is also possible to use as the light source an LED emitting light of a color other than blue. In this case, the color exhibited by the phosphor contained in the wavelength conversion sheet may be modified in accordance with the color of the light of the LED. For example, when an LED emitting magenta light is used, the phosphor contained in the wavelength conversion sheet may include green phosphor exhibiting the complementary color of green to magenta, whereby the illumination light (output light) of the backlight unit can be made white.

(34) Other than the above-described (33), when an LED emitting violet light is used, the phosphor contained in the wavelength conversion sheet may include green phosphor and yellow phosphor to provide the complementary color of yellow green to violet, whereby the illumination light (output light) of the backlight unit can be made white.

(35) Other than the above-described (33) and (34), when an LED emitting cyan light is used, the phosphor contained in the wavelength conversion sheet may include red phosphor exhibiting the complementary color of red to cyan, whereby the illumination light (output light) of the backlight unit can be made white.

(36) In the foregoing embodiments, the case has been described in which the wavelength conversion sheet includes green phosphor and red phosphor. However, it is also possible to adopt a configuration in which the wavelength conversion sheet includes only yellow phosphor, or a configuration in which red phosphor or green phosphor is included in addition to yellow phosphor.

(37) In the foregoing embodiments, the case has been described by way of example in which the quantum dot phosphor used as the phosphor included in the wavelength conversion sheet is of core-shell type including CdSe and ZnS. It is also possible to use a core type quantum dot phosphor having a unitary internal composition. For example, it is possible to use a material in which Zn, Cd, Hg, Pb or the like that becomes a divalent cation and O, S, Se, Te or the like that becomes a divalent anion are combined (CdSe, CdS, ZnS) individually. It is also possible to use a material in which Ga, In or the like that becomes a trivalent cation and P, As, Sb or the like that becomes a trivalent anion are combined (such as InP (indium phosphide) or GaAs (gallium arsenide)), or chalcopyrite type compound (such as $CuInSe_2$) individually. Other than the core-shell type or the core type quantum dot phosphor, it is also possible to use an alloy type quantum dot phosphor. Further, it is also possible to use a quantum dot phosphor that does not contain cadmium.

(38) In the foregoing embodiments, the case has been described by way of example in which the quantum dot phosphor used as the phosphor included in the wavelength conversion sheet is of the core-shell type of CdSe and ZnS. It is also possible to use a core-shell type quantum dot phosphor including a combination of other materials.

(39) In the foregoing embodiments, the configuration has been described by way of example in which the wavelength conversion sheet contains quantum dot phosphor. However, the wavelength conversion sheet may contain other types of phosphor. For example, sulfide phosphor may be used as the phosphor contained in the wavelength conversion sheet. Specifically, it is possible to use $SrGa_2S_4:Eu^{2+}$ as green phosphor and $(Ca, Sr, Ba)S:Eu^{2+}$ as red phosphor.

(40) Other than the above-described (39), the green phosphor contained in the wavelength conversion sheet may include $(Ca, Sr, Ba)_3SiO_4:Eu^{2+}$, $\beta$-SiAlON:$Eu^{2+}$, or $Ca_3Sc_2Si_3O_{12}:Ce^{3+}$, for example. The red phosphor contained in the wavelength conversion sheet may include $(Ca, Sr, Ba)_2SiO_5N_8:Eu^{2+}$ or $CaAlSiN_3:Eu^{2+}$, for example. The yellow phosphor contained in the wavelength conversion sheet may include $(Y, Gd)_3(Al, Ga)_5O_{12}:Ce^{3+}$ (generally known as YAG:$Ce^{3+}$), $\alpha$-SiAlON:$Eu^{2+}$, or $(Ca, Sr, Ba)_3SiO_4:Eu^{2+}$, for example. It is also possible to use, as the phosphor contained in the wavelength conversion sheet, double fluoride phosphor (such as manganese-activated potassium fluorosulfide ($K_2TiF_6$)).

(41) Other than the above-described (39) and (40), as the phosphor contained in the wavelength conversion sheet, organic phosphor may be used. As the organic phosphor, for example, a low molecular weight organic phosphor including triazole or oxadiazole as a basic skeleton may be used.

(42) Other than the above-described (39), (40), and (41), it is also possible to use, as the phosphor contained in the wavelength conversion sheet, a phosphor that performs wavelength conversion by energy transfer via dressed photon (near-field light). Specifically, as this type of phosphor, it is preferable to use a phosphor in which a DCM dye is dispersed and mixed in a zinc oxide quantum dot (ZnO-QD) measuring 3 nm to 5 nm (preferably about 4 nm) in diameter.

(43) The LED emission spectrum (such as the numerical value of peak wavelength, or the numerical value of the half value width of peak) and the emission spectrum of the phosphor included in each phosphor layer (such as the numerical value of peak wavelength, or the numerical value of half value width of peak) may be modified as appropriate from the foregoing embodiments.

(44) In the foregoing embodiments, the case has been described in which InGaN is used as the material of the LED elements constituting the LEDs. It is also possible to use GaN, AlGaN, GaP, ZnSe, ZnO, AlGaInP and the like as the other materials of the LED elements.

(45) In the foregoing embodiments, the case has been described by way of example in which the chassis is made of metal.

(46) In the foregoing embodiments, the configuration has been described by way of example in which the optical members are placed on the front side with respect to the flange portion of the frame, with an interval provided between the optical members and the light guide plate. However, it is also possible to adopt a configuration in which the optical members are directly placed on the front side with respect to the light guide plate. In this case, it may be preferable, but not necessarily, to adopt a configuration in which the flange portion of the frame presses, from the front side, the optical member disposed in the most front side.

(47) In the foregoing embodiments, the LEDs are used as the light source. However, it is also possible to use other light sources, such as organic EL.

(48) In the foregoing embodiments, the case has been described by way of example in which the liquid crystal panel and the chassis are installed in an upright state with the short-side direction aligned with the vertical direction. However, the present invention also includes the liquid crystal panel and the chassis being installed in an upright state with the long-side direction aligned with the vertical direction.

(49) In the foregoing embodiments, TFTs are used as the switching elements of the liquid crystal display device. However, the present invention is also applicable to a liquid crystal display device using switching elements other than TFT (for example, thin-film diode (TFD)). The present invention is also applicable to not just a liquid crystal display device for color display but also a liquid crystal display device for black and white display.

(50) In the foregoing embodiments, a transmissive type liquid crystal display device has been described by way of example. However, the present invention is applicable to other types, such as a reflection type liquid crystal display device or a semi-transmissive type liquid crystal display device.

(51) In the foregoing embodiments, a liquid crystal display device in which a liquid crystal panel is used as a display panel has been described by way of example. However, the present invention is applicable to display devices using other types of display panels.

(52) In the foregoing embodiments, a television device including a tuner has been described by way of example. However, the present invention is also applicable to display devices having no tuners. Specifically, the present invention is applicable to a liquid crystal display device used as an electronic signboard (digital signage) or an electronic blackboard.

(53) In the fifteenth to twenty-second embodiments, the LEDs and the LED substrate are disposed so as to oppose one long-side end surface of the light guide plate. However, the LEDs and the LED substrate may be disposed so as to oppose one short-side end surface of the light guide plate.

(54) In the fifteenth to twenty-second embodiments, the LEDs and the LED substrate are disposed so as to oppose one end surface of the light guide plate. However, the LEDs and the LED substrate may be disposed so as to oppose the pair of long-side end surfaces or the pair of short-side end surfaces of the light guide plate. In addition, it is also possible to dispose the LEDs and the LED substrate so as to oppose arbitrary three end surfaces of the light guide plate.

EXPLANATION OF SYMBOLS

10: Liquid crystal display device (Display device)
11: Liquid crystal panel (Display panel)
12, 212, 912, 1012, 1112, 1212, 1312: Backlight unit (Illumination device)
17, 217, 917, 1017, 1117, 1217, 1317, 1417: LEDs (Light source)
19, 119, 219, 319, 419, 519, 619, 719, 819, 919, 1019, 1119, 1219, 1319, 1419: Light guide plate
19a, 119a, 419a, 619a, 1419a: Light output plate surface
19b, 219b, 919b, 1019b, 1119b, 1219b, 1319b, 1419b: Light entry end surface
19c, 119c, 219c, 319c, 619c, 719c, 819c, 919c, 1019c, 1119c, 1219c, 1319c, 1419c: Opposite plate surface
19d, 219d, 919d, 1019d, 1119d, 1219d, 1419d: No-light entry end surface
19d1, 219d1, 719d1, 819d1, 919d1, 1219d1, 1419d1: No-light entry opposite end surface
19d2, 219d2, 719d2, 819d2, 919d2, 1019d2, 1119d2, 1219d2, 1419d2: No-light entry side end surface
20, 220, 1420: Wavelength conversion sheet (Wavelength conversion member)
25, 125, 225, 325, 425, 525, 625, 1425: Reflection sheet (reflection member)
27, 127, 227, 627: Parallel plate surface
28, 128, 228, 328, 428, 528, 628, 728, 828, 928, 1028, 1128, 1228, 1328: Inclined plate surface
29, 129, 229, 629: Parallel reflection portion
30, 130, 230, 330, 430, 530, 630: Inclined reflection portion
31: Adhesive layer
32, 632: Parallel plate surface-side inclined plate surface
33, 633: Outer peripheral end surface-side inclined plate surface
36: Support member
1414a, 15114a: Bottom portion
1427: Plate surface-side wavelength conversion portion
1428: End surface-side wavelength conversion portion
1431: No-light entry end surface overlapping portion (Phosphor located region)
1432: Opposite plate surface overlapping portion (Non-phosphor located region)
1433: Seal portion
1434: Adhesive layer

The invention claimed is:

1. A lighting device comprising:
   a light source;
   a light guide plate including:
      a light entry end surface on at least a portion of an outer peripheral end surface, wherein light from the light source enters through the light entry end surface;
      a no-light entry end surface on a portion of the outer peripheral end surface except for the light entry end surface, wherein the light from the light source does not directly enter through the no-light entry end surface; and
      a light output plate surface through which the light exits; and
   a wavelength conversion sheet including:
      a phosphor film that is in a wavelength converting layer including a phosphor and wavelength converts the light from the light source;
      protection films that sandwich the phosphor film;
      at least a plate surface-side wavelength conversion portion disposed to overlap the light output plate surface of the light guide plate; and
      an end surface-side wavelength conversion portion that is continuous from the plate surface-side wavelength conversion portion and disposed to overlap at least a portion of the no-light entry end surface of the light guide plate, wherein
   the plate surface-side wavelength conversion portion and the end surface-side wavelength conversion portion are consecutive portions of the wavelength conversion sheet,
   the end surface-side wavelength conversion portion is angled relative to the plate surface-side wavelength conversion portion, and
   the end surface-side wavelength conversion portion is spaced apart from the no-light entry end surface of the light guide plate with a gap there between.

2. The lighting device according to claim 1, wherein the no-light entry end surface of the light guide plate is opposite to the light entry end surface of the light guide.

3. The lighting device according to claim 1, wherein the no-light entry end surface of the light guide plate is on an end surface of the outer peripheral end surface that is adjacent to the light entry end surface of the light guide plate.

4. The lighting device according to claim 1, wherein the end surface-side wavelength conversion portion of the wavelength conversion sheet overlaps an entire area of the no-light entry end surface of the light guide plate.

5. The lighting device according to claim 1, further comprising a chassis including a bottom portion supporting the light guide plate from an opposite side from a light output plate surface side, wherein
   the end surface-side wavelength conversion portion of the wavelength conversion sheet includes a no-light entry end surface overlapping portion overlapping the no-light entry end surface of the light guide plate, and an opposite plate surface overlapping portion overlapping an outer edge portion of the light guide plate on an opposite plate surface that is opposite from the light output plate surface, and
   the opposite plate surface overlapping portion is sandwiched between the outer edge portion of the light guide plate and the bottom portion of the chassis.

6. The lighting device according to claim 5, wherein the opposite plate surface overlapping portion of the wavelength conversion sheet has a phosphor distribution density lower than a phosphor distribution density of the no-light entry end surface overlapping portion.

7. The lighting device according to claim 6, wherein, the no-light entry end surface overlapping portion of the wavelength conversion sheet is a phosphor located region where the phosphor is included therein, whereas the opposite plate surface overlapping portion is a non-phosphor located region where no phosphor is included therein.

8. The lighting device according to claim 6, wherein the opposite plate surface overlapping portion of the wavelength conversion sheet includes a seal portion sealing the phosphor.

9. The lighting device according to claim 1, further comprising an adhesive layer disposed so as to be interposed between the end surface-side wavelength conversion portion and the no-light entry end surface of the light guide plate.

10. The lighting device according to claim 1, further comprising a reflection sheet disposed so as to face an opposite plate surface on an opposite side from the light output plate surface of the light guide plate, and reflecting light.

11. The lighting device according to claim 1, wherein
   the light source emits blue light, and
   the wavelength conversion sheet contains, as the phosphor, a green phosphor which wavelength-converts the blue light into green light and a red phosphor which wavelength-converts the blue light into red light, or a yellow phosphor which wavelength-converts the blue light into yellow light.

12. The lighting device according to claim 1 wherein the wavelength conversion sheet contains a quantum dot phosphor as the phosphor.

13. A display device comprising:
   the lighting device according to claim 1; and
   a display panel displaying an image using light emitted from the lighting device.

14. A television device comprising the display device according to claim 13.

* * * * *